(12) United States Patent
Braiman et al.

(10) Patent No.: US 10,516,089 B2
(45) Date of Patent: Dec. 24, 2019

(54) MEMORY CELL COMPRISING COUPLED JOSEPHSON JUNCTIONS

(71) Applicants: UT-Battelle, LLC, Oak Ridge, TN (US); University of Tennessee Research Foundation, Knoxville, TN (US)

(72) Inventors: Yehuda Braiman, Oak Ridge, TN (US); Neena Imam, Knoxville, TN (US); Brendan Neschke, Tucson, AZ (US)

(73) Assignees: UT-Battelle, LLC, Oak Ridge, TN (US); University of Tennessee Research Foundation, Knoxville, TN (US)

( * ) Notice: Subject to any disclaimer, the term of this patent is extended or adjusted under 35 U.S.C. 154(b) by 0 days.

(21) Appl. No.: 15/726,173

(22) Filed: Oct. 5, 2017

(65) Prior Publication Data
US 2018/0102166 A1 Apr. 12, 2018

Related U.S. Application Data

(60) Provisional application No. 62/405,272, filed on Oct. 7, 2016.

(51) Int. Cl.
*H01L 39/22* (2006.01)
*G11C 11/44* (2006.01)
*G01R 33/035* (2006.01)

(52) U.S. Cl.
CPC ........ *H01L 39/223* (2013.01); *G01R 33/0354* (2013.01); *G11C 11/44* (2013.01)

(58) Field of Classification Search
CPC . G11C 11/44; G11C 11/1675; G11C 11/1673; G01R 33/0354; H01L 39/223;
(Continued)

(56) References Cited

U.S. PATENT DOCUMENTS

| 4,501,975 A | 2/1985 | Josephs et al. |
| 8,138,784 B2 | 3/2012 | Przybysz et al. |

(Continued)

OTHER PUBLICATIONS

Anacker, "Josephson Computer Technology: An IBM Research Project," IBM J. Res. Develop., vol. 24, No. 2, Mar. 1980, pp. 107-112.

(Continued)

*Primary Examiner* — David Lam
(74) *Attorney, Agent, or Firm* — Klarquist Sparkman, LLP

(57) ABSTRACT

Methods and apparatus are disclosed for operating a memory cell formed from the plurality of coupled Josephson junctions. The memory cell is configured such that applying an electrical signal to the junctions can cause at least one, but not all, of the junctions to change their respective phase states. Subsequent writes to the memory cell using substantially the same electrical pulse do not change the phase state of the plurality of junctions. The memory cell can be ready by providing another electrical pulse to one of the junctions and receiving an output electrical pulse generated in response by a different Josephson junction of the memory cell. A set of phase states are selected to represent the logic values that are stable across anticipated operating conditions for the memory cell. Methods of selecting electrical parameters and manufacturing memory cells are further disclosed.

20 Claims, 38 Drawing Sheets

(58) Field of Classification Search
CPC . H01L 39/025; H01L 39/2493; Y10S 505/832
See application file for complete search history.

(56) References Cited

U.S. PATENT DOCUMENTS

| | | | |
|---|---|---|---|
| 9,455,707 B2* | 9/2016 | Herr | H03K 3/38 |
| 2012/0184445 A1* | 7/2012 | Mukhanov | G11C 11/44 |
| | | | 505/171 |
| 2015/0043273 A1 | 2/2015 | Naaman et al. | |
| 2016/0028403 A1 | 1/2016 | McCaughan et al. | |
| 2016/0164505 A1* | 6/2016 | Naaman | H03K 3/38 |
| | | | 327/528 |

OTHER PUBLICATIONS

Baechtold, "A Flip-Flop and Logic Gate with Josephson Junctions," ISSCC 75, Feb. 1975, pp. 1-3.
Bolkhovsky et al., "Fabrication Process and Properties of Fully-Planarized Deep-Submicron Nb/Al—AlO$_x$/Nb Josephson Junctions for VLSI Circuits," IEEE Transactions on Applied Superconductivity, Aug. 2014, pp. 1-14.
Bolkhovsky et al., "Single Flux Quantum (SFQ) Circuit Fabrication and Design: Status and Outlook," ORNL Beyond CMOS Workshop, Apr. 2016, pp. 1-34.
Braiman et al., Discrete voltage states in one-dimensional parallel array of Josephson Junctions, Appl. Phys. Let. 68 (1996) pp. 3180-3182.
Braiman et al., "Memory cell operation based on small Josephson junctions arrays," Superconductor Science and Technology, 29 (2016), pp. 1-14.
Braiman et al., "Memory states in small arrays of Josephson junctions," American Physical Society, E94, 052223 (2016), pp. 1-13.
Cho et al., "The effects of annealing a 2-dimensional array of ion-irradiated Josephson junctions," 2016 Supercond. Sci. Technol. 29, pp. 1-12.
Corana et al., "Minimizing Multimodal Functions of Continuous Variables with the 'Simulated Annealing' Algorithm," ACM Transactions on Mathematical Software, vol. 13, No. 3, Sep. 1987, pp. 262-280.
Cybart et al., "Do multiple Josephson junctions make better devices?," Superconductor. Science and Technology, 30 (2017), pp. 1-5.
Cybart et al., "Nano Josephson Superconducting Tunnel Junctions in Y—Ba—Cu—O Direct-Patterned with a Focused Helium Ion Beam," Cornell University Library arXiv:1409.4876 [cond-mat.supr-con], Sep. 2014, pp. 1-14.
Drung et al., Comment on 'Flux-coherent series SQUID array magnetometers operating above 77K with superior white flux noise than single-SQUIDs at 4.2K,' IEEE/CSC & ESAS Superconductivity News Forum (global edition), Jan. 2016, pp. 1-3.
Gross, Walther-Meiner-Institute, "Lecture Notes," document not dated, downloaded on Mar. 6, 2018, from http://www.wmi.badw.de/teaching/Lecturenotes/index.html, 3 pages.
Hasuo, "Josephson Microprocessors," The New Superconducting Electronics, 1993, pp. 363-399.
Herr et al., "Reproducible Operating Margins on a 72,800-Device Digital Superconducting Chip," Cornell University Library, arXiv:1510.01220 [cond-mat.supr-con], Oct. 5, 2015, pp. 1-6.
Herr et al., "Towards a 16 kilobit, subnanosecond Josephson RAM," Supercond. Sci. Technol. 12 (1999), pp. 929-932.
Holmes et al., "Energy-Efficient Superconducting Computing Power Budgets and Requirements," IEEE Transactions on Applied Superconductivity, vol. 23, No. 3, Jun. 2013, pp. 1-10.
iarpa.gov, "Cryogenic Computing Complexity (C3)," document not dated, downloaded from https://www.iarpa.gov/index.php/research-programs/c3 on Mar. 6, 2018, 2 pages.
Imam et al., "Quantum-Well Infrared Photodetector Structure Synthesis: Methodology and Experimental Verification," IEEE Journal of Quantum Electronics, vol. 39, No. 3, Mar. 2003, pp. 468-477.

International Search Report and Written Opinion for PCT/US2017/055398, dated Feb. 2, 2018, pp. 1-13.
Kirichenko et al., "A Single Flux Quantum Cryogenic Random Access Memory," Extended Abstracts of 7$^{th}$ International Superconductor Electronics Conference, Jun. 1999, pp. 124-127.
Kirkpatrick et al., "Optimization by Simulated Annealing," Science, New Series, vol. 220, No. 4598, May 1983, pp. 671-680.
Kito et al., "Timing-aware description methods and gate-level simulation of single flux quantum logic circuits," SASIMI 2012 Proceedings, pp. 1-6.
Likharev, "Superconductor digital electronics," SciVerse ScienceDirect, Physica C 482 (2012) pp. 6-18.
Likharev et al., "RSFQ logic/memory family: a new Josephson-junction technology for sub-terahertz-clock-frequency digital systems, IEEE Transactions on Applied Superconductivity," vol. 1, No. 1, Mar. 1991 (pp. 3-28).
Liu et al., "Latency and Power Measurements on a 64-kb Hybrid Josephson-CMOS Memory," IEEE Transactions on Applied Superconductivity, vol. 17, No. 2, Jun. 2007, pp. 526-529.
Mitchell et al., 2D SQIF arrays using 20000 YBCO high $R_n$ Josephson junctions, Supercond. Sci Technol. 29 (2016), pp. 1-9.
Mukhanov et al., "Hybrid Semiconductor-Superconductor Fast-Readout Memory for Digital RF Receivers," IEEE/CSC & ESAS European Superconductivity News Forum, No. 15, Jan. 2011, pp. 1-4.
Nagasawa et al., "Design of all-dc-powered high-speed single flux quantum random access memory based on a pipeline structure for memory cell arrays," Supercond. Sci. Technol. 19 (2006), pp. S325-S330.
Polonsky et al., "Single Flux, Quantum B Flip-Flop and Its Possible Applications," IEEE/CSC & ESAS European Superconductivity News Forum, No. 15, Jan. 2011, pp. 1-10.
Rezac et al., "Parameter optimization for transitions between memory states in small arrays of Josephson junctions," Physica A474 (2017) 267-281.
Ryazanov et al., "Magnetic Josephson junction technology for digital and memory applications," SciVerse ScienceDirect, Physics Procedia 36 (2012) pp. 35-41.
Semenov et al., "AC-Biased Shift Registers as Fabrication Process Benchmark Circuits and Flux Trapping Diagnostic Tool," IEEE Transactions on Applied Superconductivity, vol. 27, No. 4, Jun. 2017, pp. 1-8.
Sharafiev et al., "Josephson oscillation linewidth of ion-irradiated YBa$_2$Cu$_3$O$_7$ junctions," Cornell University Library, arXiv:1603.08466v1 [cond-mat.supr-con], Mar. 28, 2016, pp. 1-8.
"Superconducting Technology Assessment," National Security Agency, Office of Corporate Assessments, Aug. 2005, pp. 1-257.
Suzuki et al., "A Capacitively Coupled SFQ Josephson Memory Cell," IEEE Transactions on Electron Devices, vol. 35, No. 7, Jul. 1988, pp. 1137-1143.
Tahara et al., "4Kbit Josephson Nondestructive Ready-Out RAM Operated at 580 psec and 6.7 mW," IEEE Tranactions on Magnetics, vol. 27, No. 2, Mar. 1991, pp. 2626-2633.
Takeuchi et al., "Energy efficiency of adiabatic superconductor logic," Supercond. Sci. Technol. 28 (2015), pp. 1-5.
Tolpygo et al., "Fabrication Process and Properties of Fully-Planarized Deep-Submicron Nb/Al—AlO$_x$/Nb Josephson Junctions for VLSI Circuits," IEEE Transactions on Applied Superconductivity, vol. 25, No. 3, Jun. 2015, pp. 1-12.
Tolpygo, Superconductor digital electronics: Scalability and energy efficiency issues (Review Article), Low Temperature Physics 42, 361 (2016).
Van Duzer et al., "64-kb Hybrid Josephson-CMOS 4 Kelvin RAM With 400 ps Access Time and 12 mW Read Power," IEEE Transactions on Applied Superconductivity, vol. 23, No. 3, Jun. 2013, pp. 1-4.
Van Duzer, "Fundamentals of Superconductor Digital Circuits," Applications of Superconductivity, Special Issue of Proc. IEEE, Oct. 2004, pp. 1-47.
Xu et al., "Delayed pulses from high-transparency Josephson junctions," Applied Physics Letters, vol. 78, No. 20, May 2001, pp. 3100-3102.

(56) References Cited

OTHER PUBLICATIONS

Zhang, "Modeling of a Long Josephson Junction Coupled to SFQ Elements," IEEE Transactions on Applied Superconductivity, vol. 9, No. 2, Jun. 1999, pp. 4053-4056.
Braiman et al., "Nonlinear friction in the periodic stick-slip motion of coupled oscillators," Physical Review B, vol. 55, No. 8, pp. 5491-5504, Feb. 1997.
Mukhanov et al., "Energy-Efficient Single Flux Quantum Technology," IEEE Transactions on Applied Superconductivity, vol. 21, No. 3, pp. 760-769, Jun. 2011.
Ryazanov et al., "Magnetic Josephson junction technology for digital and memory applications," Physica Procedia, vol. 36, pp. 35-41, Dec. 2012.

\* cited by examiner

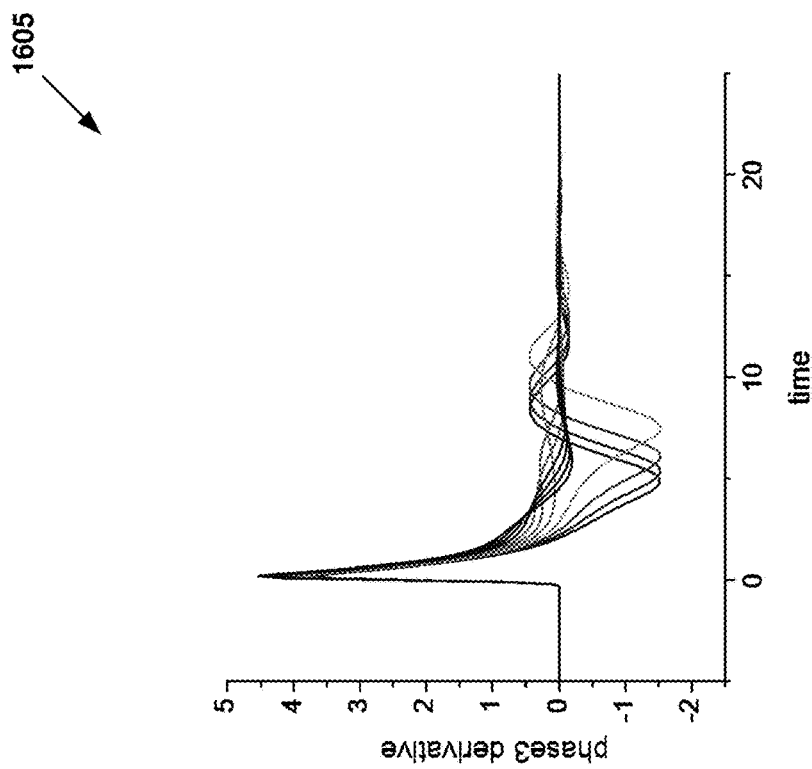
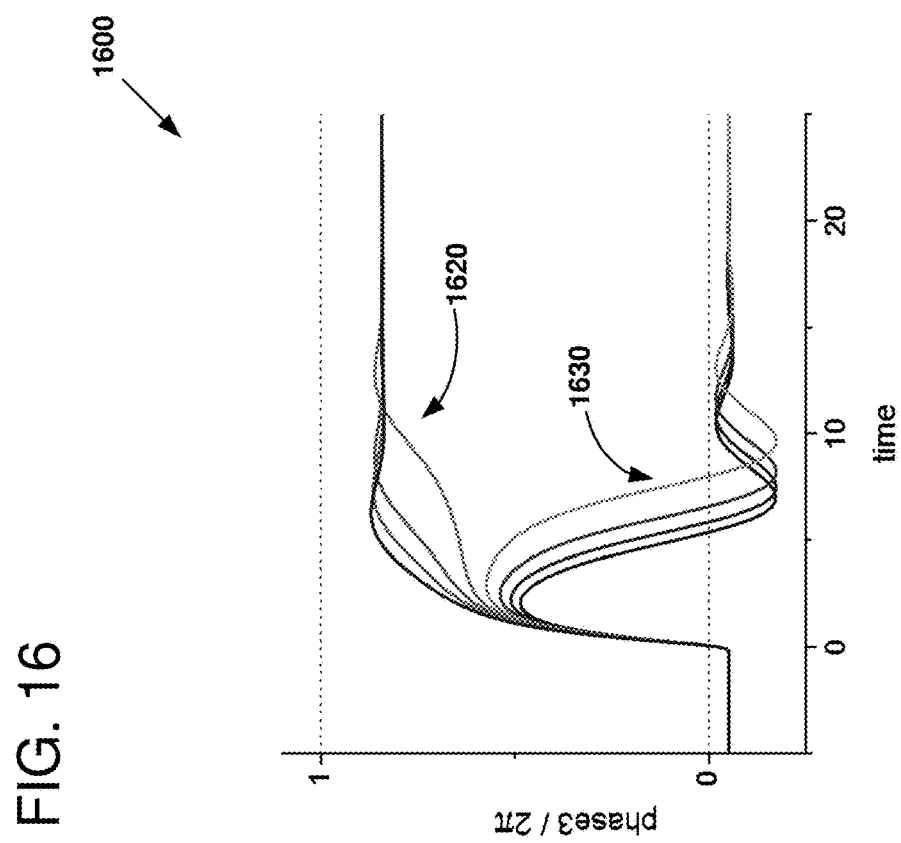
FIG. 16

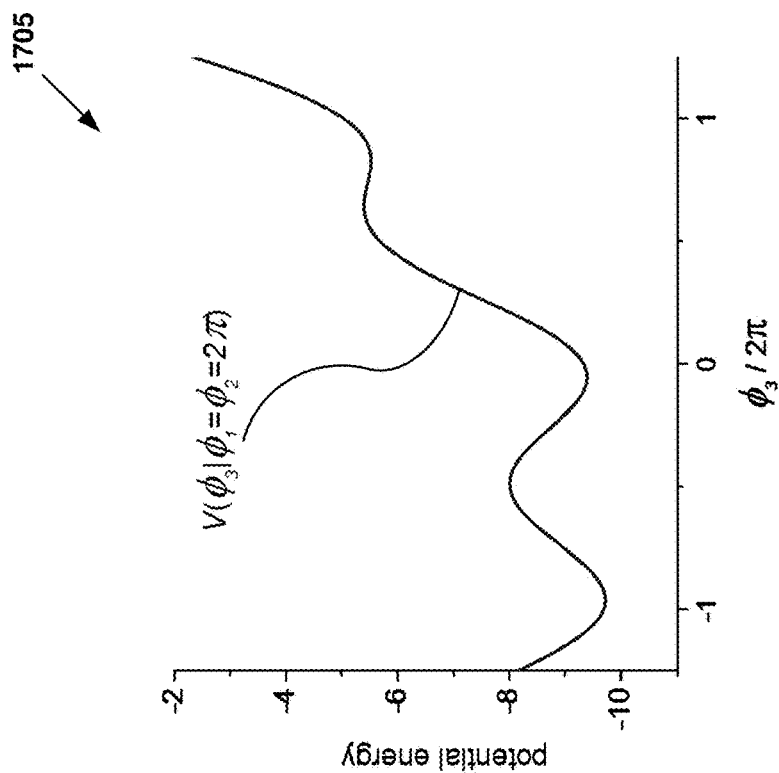
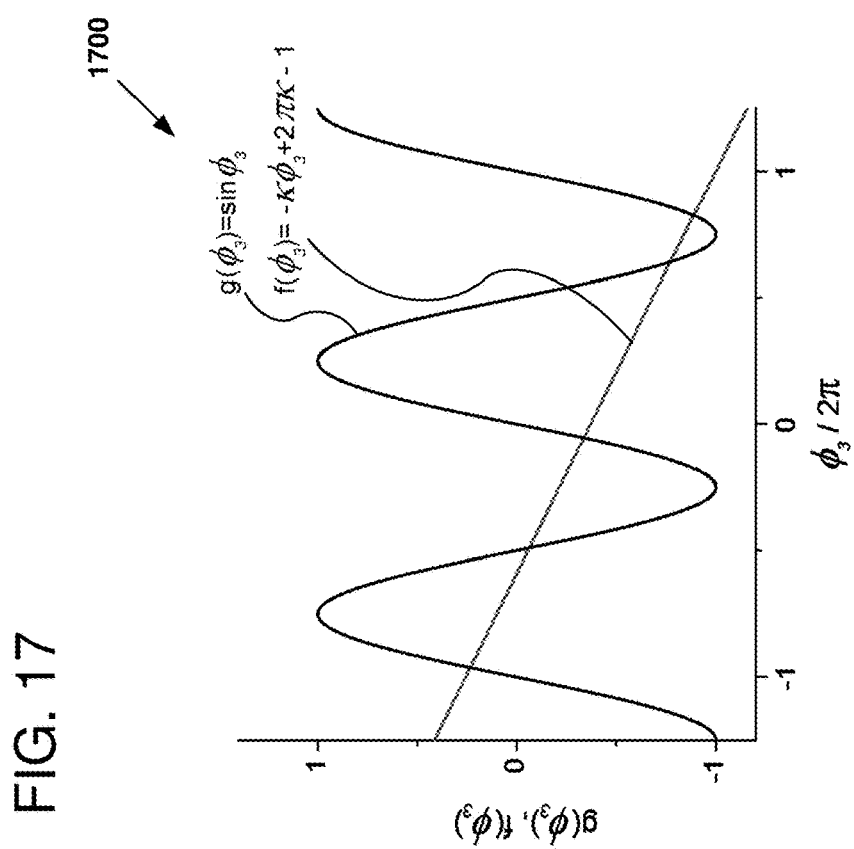
FIG. 17

FIG. 36
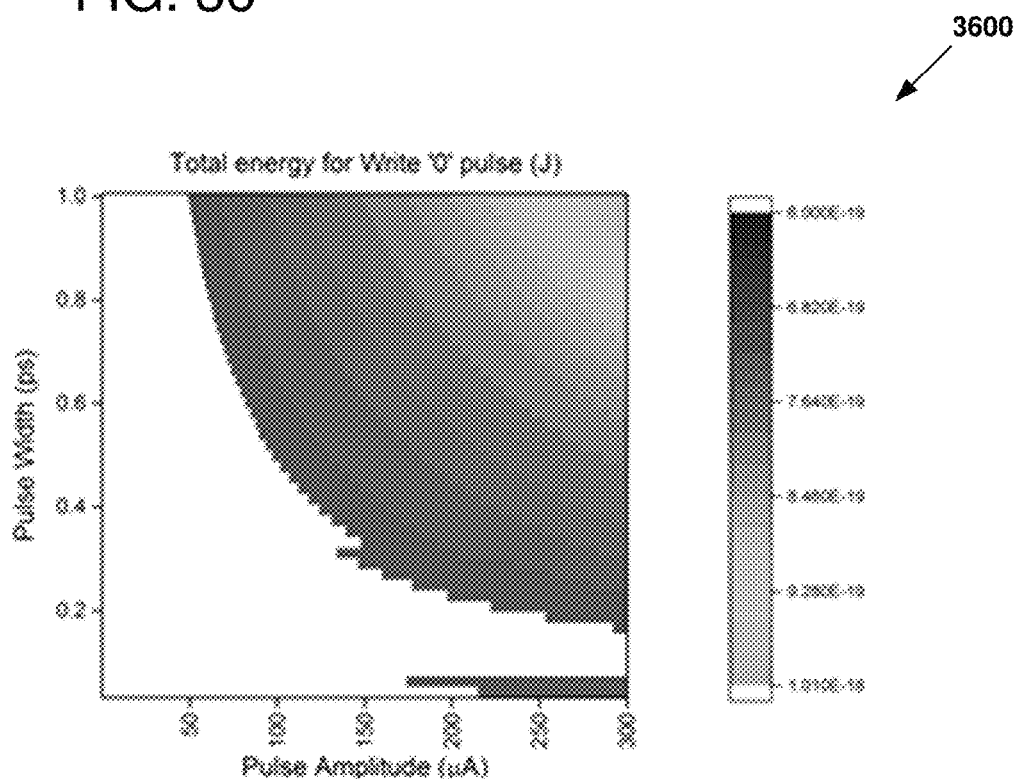
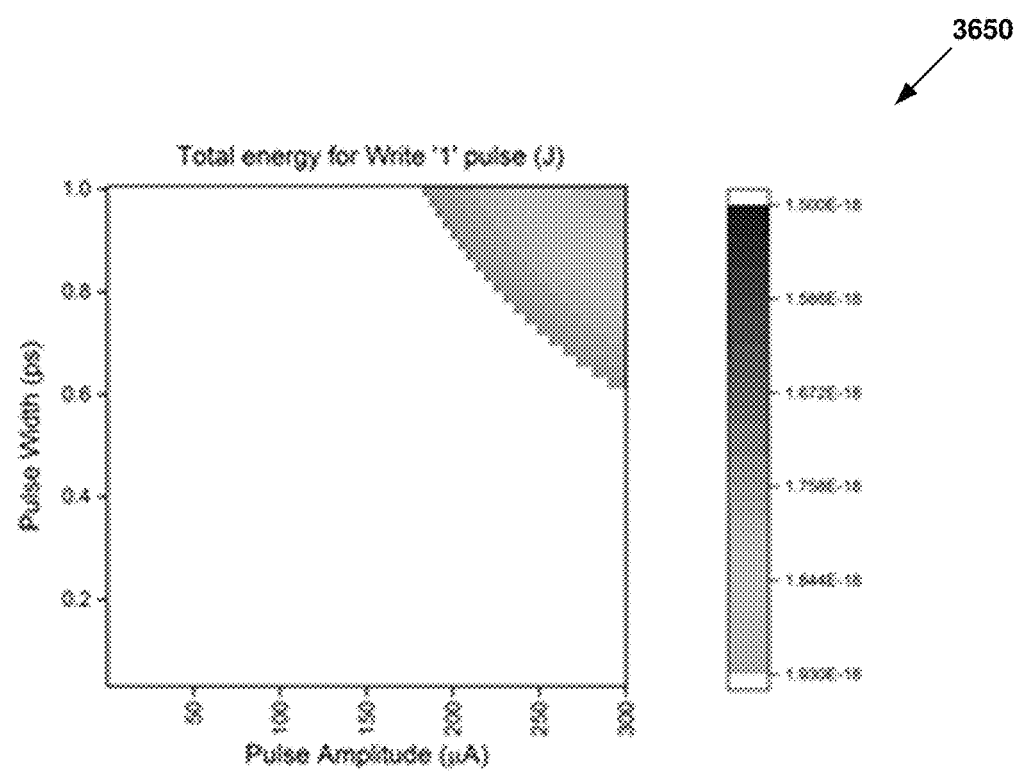

MEMORY CELL COMPRISING COUPLED JOSEPHSON JUNCTIONS

CROSS-REFERENCE TO RELATED APPLICATIONS

This application claims the benefit of and priority to U.S. Provisional Patent App. No. 62/405,272, entitled "Computer Memory Cell Design Based on Coupled Josephson junction Arrays," which application was filed on Oct. 7, 2016. The entire disclosure of the prior application(s) is incorporated herein by reference.

ACKNOWLEDGMENT OF GOVERNMENT SUPPORT

This invention was made with government support under Contract No. DE-AC05-00OR22725 awarded by the U.S. Department of Energy. The government has certain rights in the invention.

BACKGROUND

A variety of possible cryogenic memory designs for superconductor-based computing have been proposed including memories based on single flux quantum (SFQ) digital logic, hybrid superconducting CMOS (complementary metal oxide semiconductor) designs, and magnetic RAM (random access memory).

Superconducting SFQ digital logic circuits show promise to significantly advance performance in variety of applications including computer processors (e.g., CPUs), memories, digital radio frequency receivers, and other applications. While SFQ technology provides seemingly satisfactory solutions for cryogenic processors, only 4,096 bits of memory have been demonstrated so far. Moreover, when projected to a 1 Petabyte memory, the power dissipation nears 85 Megawatts.

Hybrid memory designs have been proposed to improve upon the low capacity and high dissipation of SFQ-based superconducting RAMs. Such designs include complicated and expensive interfaces between SFQ circuitry and RAM technology such as cryogenic CMOS DRAM or room-temperature memories. Thus, there is ample opportunity in the development of cryogenic memories.

SUMMARY

Cryogenic memory circuits and methods of designing and operating cryogenic memory circuits are disclosed. In some examples of the disclosed technology, write and read operations can be implemented with the same circuit, which can conserve area and decrease latency. Pulse energies required for implementation of memory operation can be very low (in some examples, in the range of $\sim 10^{-19}$ J) and delay times between the application of the pulse and circuit response may be lower than 100 ps. Example simulation results show that such transitions can occur, with access times on the order of 10-100 ps and access energies on the order of $1 \times 10^{-19}$ to $5 \times 10^{-18}$ J. Other examples of the disclosed technology can have different access times and energy outside these ranges, depending on process technology and components used to implement a memory cell.

Cryogenic memory cell circuits are disclosed based on a small coupled array of two or more Josephson junctions. For example, memory operation driven by single flux quantum, Gaussian, or square pulses are demonstrated using an inductively coupled array of three Josephson junctions. Optimization procedures based on stochastic operations are also disclosed.

Methods, computer readable media, and apparatus are disclosed for operating memory cells including a plurality of electrically or magnetically coupled Josephson junctions. In some examples of the disclosed technology, a method includes writing to a memory cell including the plurality of coupled Josephson junctions by providing a first electrical pulse to a first junction of the plurality of Josephson junctions. The electrical pulse causes at least one, but not all of the Josephson junctions to change their respective phase states. The two different sets of phase states can be used to represent a logic one or a logic zero. In some examples, more than two states can be represented, depending on the number of stable state available for the plurality of Josephson junctions. In some examples, two Josephson junctions are included in the plurality, while in others, three, four, or more junctions are included. The memory cell can be read by providing a second electrical pulse to one of the Josephson junctions and in response, an output electrical pulse is received from one of the Josephson junctions of the memory cell. In some examples, the output is read from a second, different junction than the junction which received the first electrical pulse for writing to the memory cell. Subsequent writes to the memory cell, using the first electrical pulse applied to the first junction, will not change the set of phase states for the plurality of junctions, but the memory rather will remain in the same phase state. The memory cell can be written to again by providing a third electrical pulse to a different Josephson junction of the plurality. In some examples, the third electrical pulse is applied to the second electrical pulse used to read from the memory cell. In other examples, the third electrical pulse is applied to a different, third junction of the plurality.

The memory cell is configured such that characteristics of the Josephson junctions and components coupling the junctions are configured so that one or more, but not all of the junctions will change phase state when the corresponding electrical pulses are applied. In some examples, the characteristics of the applied electrical impulses themselves are adjusted to achieve the desired switching of phase states. These pulse characteristics can including one or more of the following attributes: voltage, time duration, slope, or shape. In some examples, the second electrical pulse and the third electrical pulse are applied to the same junction. In some examples, the second electrical pulse and the third electrical pulse are applied to the second Josephson junction. In some examples, terminals of each of the junctions are coupled to one or more of the other Josephson junctions with an inductor. In some examples, the other terminal of the Josephson junction is coupled to a bias voltage or bias current. The bias voltage or bias current can be selected such that a desired set of phase states can be reached and maintained in a stable fashion. In some examples, each of the plurality of junctions is situated in a cryogenic environment. The cryogenic environment allows the Josephson junctions to operate exhibiting the Josephson effect which includes the transfer of Cooper pairs across the thin insulated layer of the junction.

In some examples of the disclosed technology, an apparatus includes a plurality of Josephson junctions. The apparatus includes a memory cell including a first junction of the plurality, an electrical or magnetic communication with a second, different Josephson junction of the plurality. A write circuit is coupled in electrical or magnetic communication with the first Josephson junction of the memory cell. The write circuit includes a pulse trigger circuit configured to transmit a pulse to the first junction of the memory cell to cause the plurality of Josephson junctions to be in a first set of phase states. The write circuit can further be coupled to an electrical or magnetic communication with another Josephson junction memory cell including a pulse trigger circuit that is configured to transmit a pulse to cause the plurality of junctions to be in a second set of phase states. Subsequent applications of the write circuit with the same pulse will not cause the set of states to change, but the phase states will be maintained the same as when the respective electrical pulse is first applied to the memory cell. The apparatus further includes a read circuit in an electrical or magnetic communication with the second Josephson junction of the memory cell. The read circuit is configured to receive an output pulse from the Josephson junction responsive to the read pulse being applied to the memory cell. The output pulse indicates a state a phase states currently occupied by the Josephson junctions. In some examples, the read operation is destructive and the set of phase states may change after the read pulse is applied. In other examples, the memory cell can be read multiples times after applying subsequent read pulses to the second Josephson junction. In some examples, the apparatus further includes a third Josephson junction and electrical or magnetic communication with the first Josephson junction, the second junction, or the first and the second junction. In some examples, the apparatus is coupled to a cryogenic processor, and the cryogenic processor uses the memory cell to store data generated during operation of the processor. In some examples, the apparatus is contained in a cryogenic chamber including the memory cell.

In some examples of the disclosed technology, a method of configuring a memory circuit including plural Josephson junctions includes forming an objective function representing electrical parameters of the memory cell. Stochastic optimization is performed to improve the objective function. For example, simulated annealing can be used to select values that improve the overall score as represented by the objective function. After performing stochastic optimization, at least one electrical parameter of the memory circuit can be selected based on the improved objective function. For example, parameters of the Josephson junctions such as width, length, material thickness, or passive components coupled to terminal of the Josephson junctions, such as impedance values of inductors, resistance values of resisters, capacitance values of capacitors, can be adjusted in order to improve operation of the memory cell represented by the objective function. In some examples, the method further includes initializing a set of variables representing electrical parameters of the memory cell, performing a simulation of the memory cell based on the initialized set of variables, and form the objective function based on the simulation. In some examples the method further includes configuring and/or manufacturing a memory cell according to a selected at least one electric parameter. In some examples, the method further includes selecting a parameter of a write pulse applied to, or a read pulse generated by, the memory circuit. In some examples, one or more computer-readable storage media store computer-readable instructions that, when executed by a processor, cause a computer to perform any of one or more of the disclosed method of optimizing or configuring a memory circuit.

The foregoing and other objects, features, and advantages of the disclosed subject matter will become more apparent from the following detailed description, which proceeds with reference to the accompanying figures.

BRIEF DESCRIPTION OF THE DRAWINGS

FIG. 16 includes two charts illustrating stability of phases using different circuit parameters, as can be observed in certain examples of the disclosed technology.

FIG. 17 includes two charts illustrating potential energy of a system, as can be observed in certain examples of the disclosed technology.

FIGS. 35, 36, and 37 are heat maps of simulated parameters for write pulses simulated for a memory circuit comprising coupled Josephson junctions, as can be used in certain examples of the disclosed technology.

DETAILED DESCRIPTION

I. General Considerations

Figure 1:
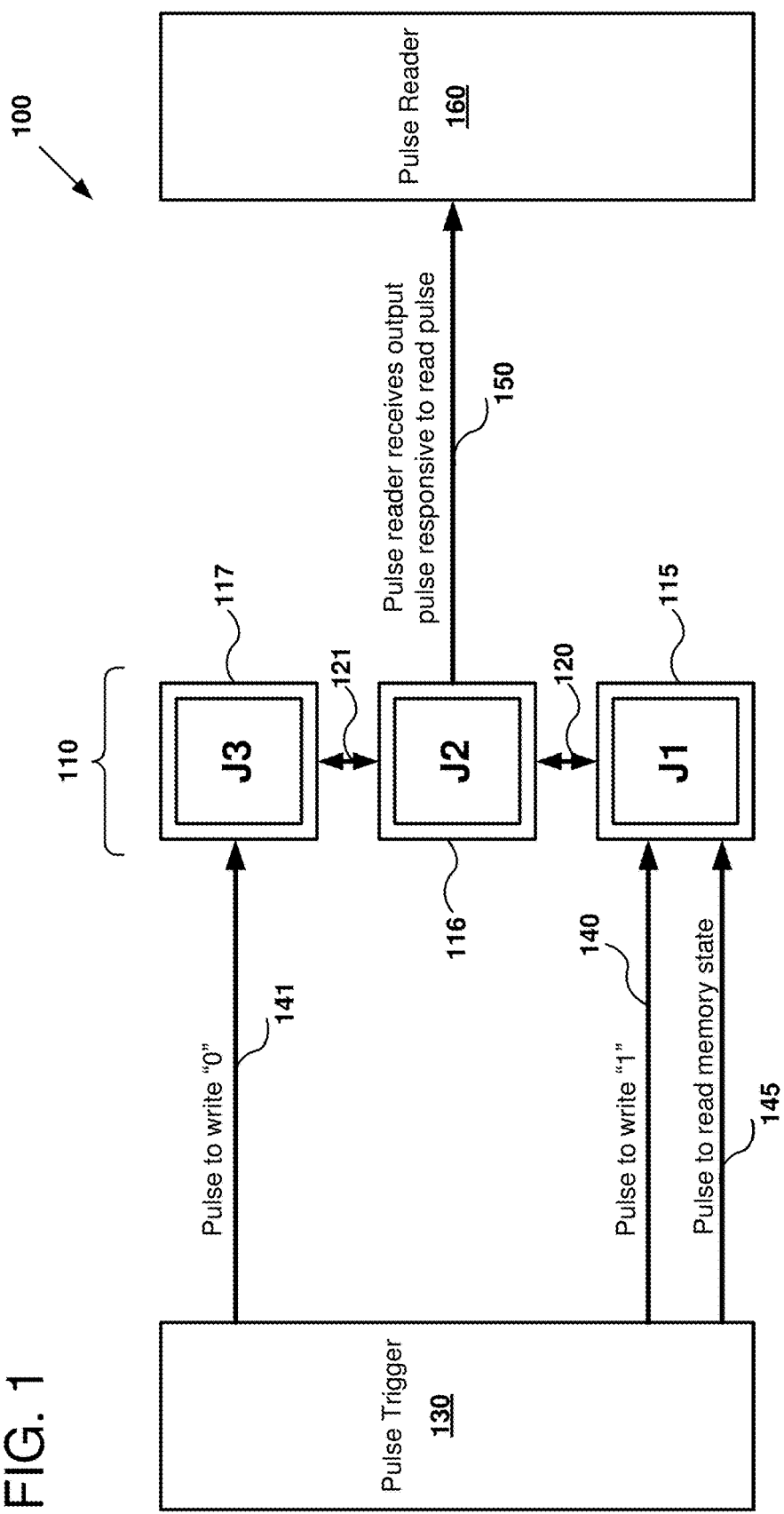
FIG. 1 is a diagram depicting an example configuration for using a plurality of Josephson junctions as a memory cell, as can be used in certain examples of the disclosed technology.

The disclosed methods, apparatus, and systems should not be construed as being limiting in any way. Instead, the present disclosure is directed toward all novel and nonobvious features and aspects of the various disclosed examples, alone and in various combinations and subcombinations with one another. The disclosed methods, apparatus, and systems are not limited to any specific aspect or feature or combination thereof, nor do the disclosed examples require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other things and methods. Additionally, the description sometimes uses terms like "produce," "generate," "select," "receive," "write," "read," and "provide" to describe the disclosed methods. These terms are high-level descriptions of the actual operations that are performed. The actual operations that correspond to these terms may vary depending on the particular implementation and are readily discernible by one of ordinary skill in the art having the benefit of the present disclosure.

As used in this application and in the claims, the singular forms "a," "an," and "the" include the plural forms unless the context clearly dictates otherwise. Additionally, the term "includes" means "comprises." Moreover, unless the context dictates otherwise, the term "coupled" means mechanically, electrically, or electromagnetically connected or linked and includes both direct connections or direct links and indirect connections or indirect links through one or more intermediate elements not affecting the intended operation of the described system. The terms "substantially" and "about" used throughout this application are used to describe and account for small fluctuations.

Additionally, certain terms may be used such as "up," "down," "upper," "lower," and the like. These terms are used, where applicable, to provide some clarity of description when dealing with relative relationships. But, these terms are not intended to imply absolute relationships, positions, and/or orientations.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed computer-implemented methods can be implemented using computer-executable instructions stored on one or more computer-readable media (e.g., computer-readable media, such as one or more optical media discs, volatile memory components (such as DRAM or SRAM), or nonvolatile memory components (such as flash memory or hard drives)) and executed on a computer (e.g., any commercially available computer, including smart phones or other mobile devices that include computing hardware). Any of the computer-executable instructions for implementing the disclosed techniques, as well as any data created and used during implementation of the disclosed examples, can be stored on one or more computer-readable media (e.g., computer-readable storage media).

The term "computer-readable storage media" does not include signals, carrier waves, or transitory media. The computer-executable instructions can be part of, for example, a dedicated software application, or a software application that is accessed or downloaded via a web browser or other software application (such as a remote computing application). Such software can be executed, for example, on a single local computer (e.g., with general-purpose and/or specialized processors executing on any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that computer-related aspects of the disclosed technology are not limited to any specific computer language or program. For instance, the disclosed technology can be implemented by software written in C, C++, Java, or any other suitable programming language. Likewise, the disclosed technology is not limited to any particular computer or type of hardware. Certain details of suitable computers and hardware are well-known and need not be set forth in detail in this disclosure.

Furthermore, any of the software-based examples (comprising, for example, computer-executable instructions for causing a computer to assist the performance of any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

II. Introduction to the Disclosed Technology

Memory cell designs are introduced that are based on the dynamics of small coupled arrays of Josephson junctions. In certain examples of such designs, write, read, and reset operations can be performed using the same circuit comprising the coupled array of Josephson junction. A variety of small junction array circuits can be considered and a specific choice of the circuit and/or circuit operations selected depending on parameters of the employed Josephson junction and parameters for electrical and/or magnetic coupling between the junctions, for example: junction feature size, coupling structure, and/or electrical or magnetic coupling strength). Examples of the disclosed memory cell designs use two or more of a plurality of sets of stable states of a coupled Josephson junction array. The array can include two, three, four, or more coupled Josephson junctions. Multiple sets of states in certain example Josephson junction array can be stable, and transitions between these states can be achieved by incrementally varying (or applying a pulse to) at least to one accessible parameter of the array. Write, read, and reset operations can be performed with the same or different junctions, depending on a particular selected operation. When a memory operation is not being performed, the voltage across each junction is zero, and thus energy dissipation is minimal. Consequently, energy in such coupled arrays will dissipate mainly at the time of memory access operations. Both memory access times and access energies can be minimal if the circuit operation mode and parameter set is properly chosen. The number of coupled junctions and coupling components in a design may vary, however in some applications it may be desirable to operate a small array (e.g., three or four Josephson junctions) to reduce the size of the memory array.

Coupled arrays of Josephson junctions possess multiple stable zero voltage states. The zero voltage state means that the phase derivative state of the Josephson junction is zero. When the Josephson junction phase (also referred to as phase difference between the two superconductors forming the Josephson junction) of the junction's wave function is constant, then voltage across the junction is zero. Unless explicitly stated or otherwise clear from the usage context, the use of the term "phase" herein refers to the Josephson junction phase of a Josephson junction. The current through the junction is proportional to the sine of the phase difference across the junction. Thus, when the phase difference across a junction is constant, then the current through the junction is constant. The voltage across a junction is proportional to the derivative of the phase difference across the junction. Applying a constant voltage across the junction results in a high-frequency, oscillating current through the junction. Values of phase differences across each of the Josephson junctions can be collectively referred to as a set of phase states. Such phase states can store information and consequently can be utilized for cryogenic memory applications. Memory operations can be implemented by sending an electrical or magnetic pulse to one of the junctions and studying transitions between the states. In order to be suitable for memory operations, such transitions between the states are desirably fast and energy efficient. Simulation results show that such transitions can occur with access times on the order of 10-100 ps and access energies on the order of $1\times10^{-19}$ to $5\times10^{-18}$ J in apparatus configured according to certain examples of the disclosed technology.

Disclosed memory cells operate according to a paradigm based on the existence of multiple stable states present in a large variety of nonlinear systems. While many of the disclosed examples are cryogenic memories based on small coupled arrays of Josephson junctions, the proposed paradigm may be applied to other suitable systems besides cryogenic memory. Because the disclosed arrays of junctions are coupled through inductors, the stored energy in the circuit cannot be perfectly quantized. The equations of motion describing the dynamics of Josephson junctions in the framework of the resistively shunted junction (RSJ) model resemble in some ways mathematical representations of physical pendulums with sinusoidal nonlinearity terms. When memory operations are not being performed, the average voltage across each junction is zero, thus energy will dissipate only at the time of memory access operations. Both memory access times and energies can be minimal based on the choice of memory array parameters.

It should be noted that while certain example circuits for memories comprising an array of Josephson junction are disclosed, that a variety of other circuits can be designed using similar memory cell logic. Thus, as will be readily understood to one of ordinary skill in the art having the benefit of the present disclosure, different memory cell operation logics can be employed using the same or very similar circuit designs.

A variety of pulse shapes and forms can be used to operate memory cells implemented according to the disclosed technology. These pulses can be initiated by a processor sending a request to peripheral circuits that will generate a pulse. Such pulses applied to different junctions will be employed for reading, writing, and resetting memory states of the cell. In certain examples, SFQ pulses, Gaussian pulses, and/or square wave pulses are used to read, write, or reset memory states of a memory cell.

A Josephson junction can be formed by providing a thin insulator between two superconductor materials. The provided insulator is thin enough to allow for electrical current to pass from one portion of superconductor material to the other portion of superconductor material via quantum tunneling of Cooper pairs through the insulator. For example, the superconductor material can comprise Niobium (Nb) and the insulator provided by a thin (e.g., ~10 Å) layer of aluminum oxide ($Al_2O_3$) sandwiched between the superconductor materials. A terminal can be formed to each of the two portions of superconductor material. When the temperature of the Josephson junction is below the critical temperature, the current $I_j$ through the junction is described by the following relations:

$$I_j = I_c \sin \phi$$

where $I_c$ is the critical current of the junction and $\phi$ is the phase difference, or Josephson phase of the superconducting wave functions of the two terminals of the junction. In some examples, one of the terminals of the Josephson junction is electrically floating and the other terminal is electrically coupled to a pulse reader or pulse writing circuit. In other examples, both terminals of the Josephson junction are coupled to peripheral circuitry.

In certain examples of the disclosed technology, a memory cell comprising a plurality of Josephson junctions is configured so that that array's response to pulse excitation will be non-uniform for different junctions in the array. In other words, not all the junctions in array will change their state as a result of an externally applied pulse. In some examples, one or more additional, repeated pulse applications will not change the state of any junction in the array. We will define a set of memory phase states of the junction array as {n1, n2, n3}, where the phase $\phi_k$ of junction k is given by $\phi_k = 2\pi n_k + \theta_k$ and $\theta_k$ is the junction k phase relative to its potential well. For a given set of parameters, multiple states may be achievable and stable. However, for ease of explanation, the discussion below focuses on transitions between two phase states for two-bit memory operation.

III. Example Memory Device

FIG. 1 is a block diagram 100 illustrating the use of a memory cell including a plurality 110 of electrically or magnetically coupled Josephson junctions, as can be employed in certain examples of the disclosed technology. In the illustrated example there are three coupled Josephson junctions, but in other examples there would be as few as two Josephson junctions, or four or more Josephson junctions, configured to make a single memory cell. A first Josephson junction J1 115 is electrically coupled to a second Joseph Junction J2 116. In some examples, the two Josephson junctions are electrically coupled via an inductor. In other examples, the two Joseph Junctions may be magnetically coupled based on the orientation and proximity of the junctions to each other. A third Josephson junction J3 117 is electrically coupled to the second Josephson junction J2 116. Similar techniques such as coupling via an inductor can be used to electrically or magnetically couple these two junctions. In some examples, each of the junctions may be coupled to another junction by an electrical connection or coupling of a first terminal of the junction, while a second junction terminal is left floating. In other examples, the second terminal of the junction may be connected or coupled to a power or ground supply, to a bias voltage or bias current supply, or to a time-varying signal produced by other cryogenic components in the device. The electrical or magnetic couplings between junctions are represented in the diagram by the arrows 120 and 121.

Also shown in FIG. 1 is a pulse trigger circuit 130. The pulse trigger circuit 130 is used to write to the memory cell comprising the plurality 110 of coupled Josephson junctions by providing electrical pulses to a selected one of the Josephson junctions. In the example of FIG. 1, a logic one value is written by transmitting 140 a pulse from the pulse trigger 130 to the terminal of the first Josephson junction J1 115. The pulse causes the plurality of Josephson junctions to enter a first set of phase states. If subsequent write pulses are supplied to the first junction, the phase states will not change, but will remain in the designated logic one set of phase states. Similarly, a logic zero can be written to the memory cell including a plurality of coupled Josephson junctions by applying 141 a write pulse to the third Josephson junction J3 117. Sending the write pulse to the third Josephson junctions will cause the set of phase sets for the memory cell to change to a set of phase states designated as representing a logic zero. If any subsequent write pulses are sent to the third Josephson junction, the second phase states for the memory cell will not change.

The pulse trigger 130 is further configured to send 145 a pulse to the first Josephson junction J1 115 in order to read the memory state. Responsive to the pulse being sent to the first Josephson junction, an output pulse 150 is generated by the second Josephson junction J2 116. The output pulse 150 is received at a pulse reader circuit 160 and based on the shape of the received output pulse, the logic value stored in the memory cell can be determined.

The memory cell comprising the plurality 110 of Josephson junctions is configured such that applying an electrical pulse to the plurality can cause one or more, but not all, of the Josephson junctions to change their perspective phase states. A characteristic of the electrical pulses applied to read and write to the memory cell can be based on a number of different attributes, for example voltage, time durations, slope, or shape of the pulse wave form. Further, two different pulses having different characteristics can be transmitted to the same Josephson junction in order to perform different operations. For example, a write pulse transmitted to the first Josephson junction J1 115 can have different characteristics than a read pulse 145 applied to the same junction, and which results in different behaviors by the coupled plurality 110 of Josephson junctions.

The plurality 110 of Josephson junctions, the pulse trigger 130 and the pulse reader 160 are operated in a cryogenic environment. The temperature of the components in the block diagram 100 is to be kept below the critical superconducting temperature for the underlying components.

Figure 2:
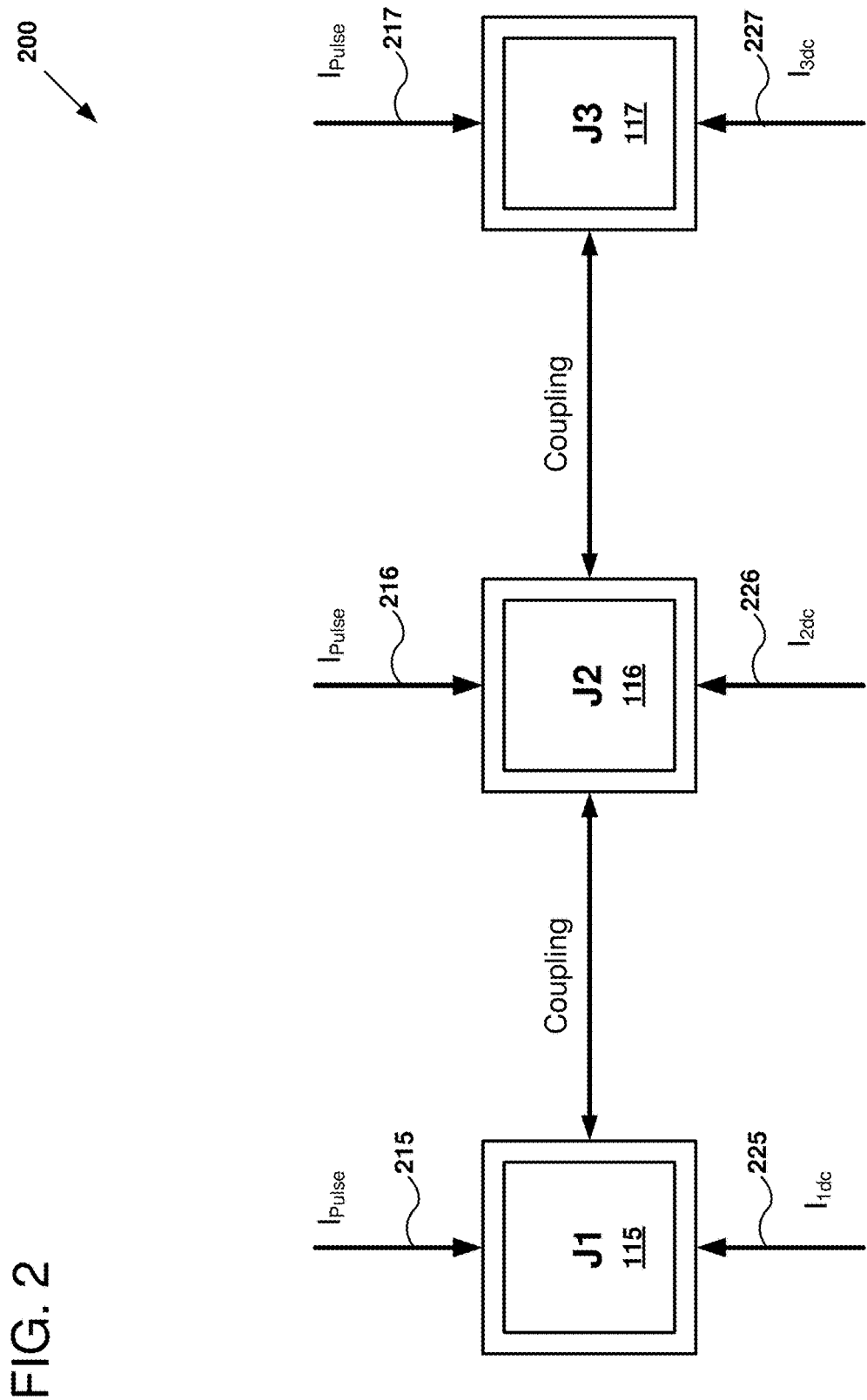
FIG. 2 is a diagram further detailing use of a plurality of junctions as a memory cell, as can be used in certain examples of the disclosed technology.

FIG. 2 is a diagram 200 further detailing the arrangement of a plurality of Josephson junctions as can be used to implement a memory cell in certain examples of the disclosed technology. As shown, the first Josephson junction J1 115 is electrically or magnetically coupled to the second Josephson junction J2 116 and the second Josephson junction J2 116, in turn, is electrically or magnetically coupled to the third Josephson junction J3 117. Current for the incoming pulse to each of the junctions is represented by the top arrows 215, 216, and 217, respectively. The pulses are applied to a first terminal for a respective one of the Josephson junctions. In some examples, the Josephson junctions can be coupled to another Josephson junction by an inductor coupled to the same terminal as the incoming or outgoing pulse. In other examples, the junctions may be coupled by a logic component such as an inductor coupled to the opposite terminal of the respective Josephson junction. As shown in FIG. 2, other currents 225, 226, and 227 may be applied to the second terminal of each respective Josephson junction. For example, a different bias current may be applied to each of the respective second terminals of the plurality of Josephson junction in order to provide a set of stable phase states that the junctions can transition between, thereby providing memory storage. In other examples, the second terminals are left floating.

Figure 3:
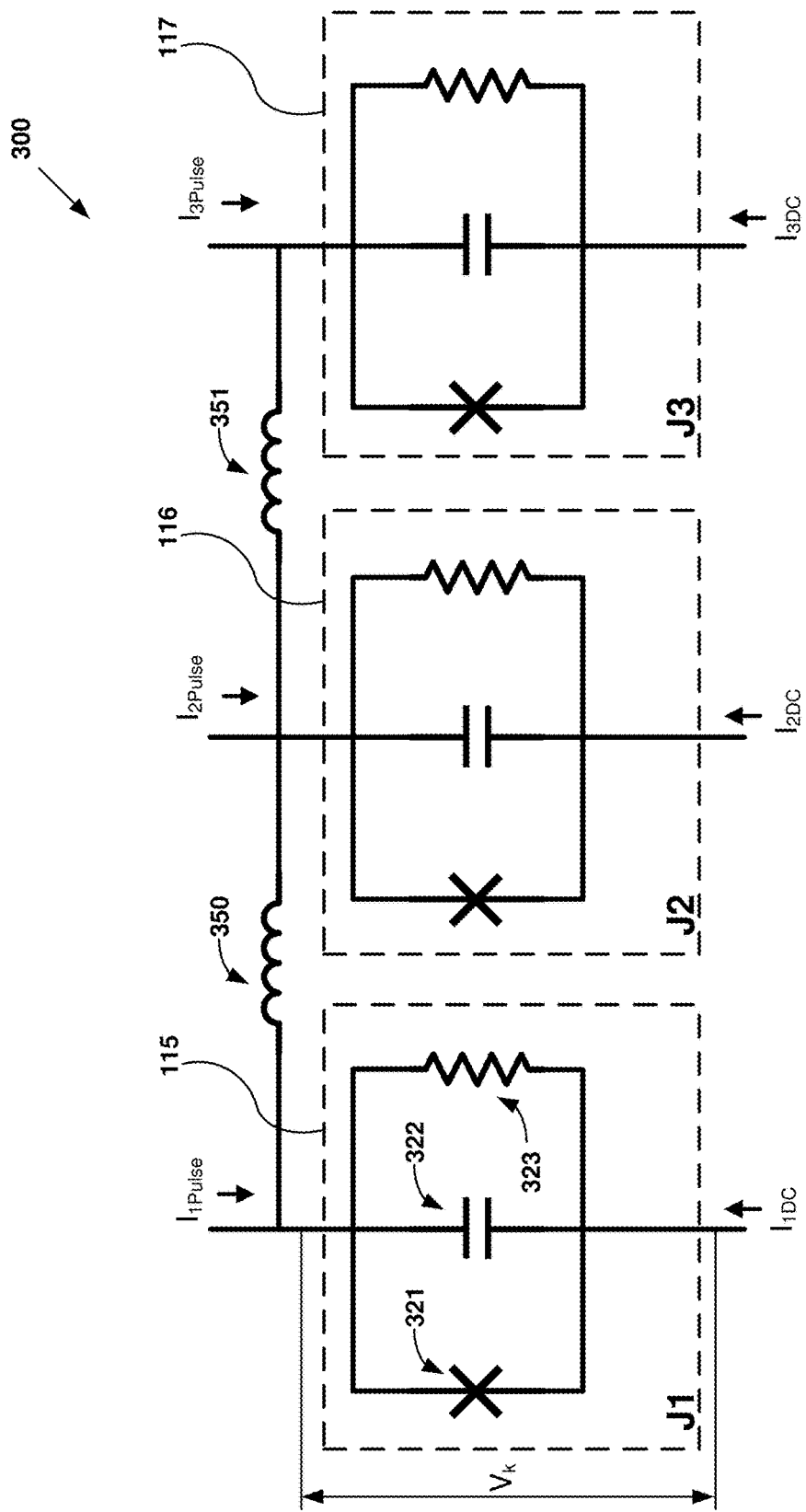
FIG. 3 is a schematic illustrating a circuit model for a plurality of Josephson junctions implementing a memory cell, as can be used in certain examples of the disclosed technology.

FIG. 3 is a schematic representation 300 of a plurality of three coupled Josephson junctions forming a memory cell, as can be implemented in certain examples of the disclosed technology. As shown, each of the Josephson junctions 115, 116, and 117, are modeled using three circuit components. For example, the first Josephson junction 115 is modeled using a non-linear Josephson junction component 321, a capacitor 322, and a resistor 323. This model allows a circuit simulator to model operation of the Josephson junction across AC and DC modes of operation both above and below the critical semiconducting current for the respective Josephson junction.

The three Josephson junctions 115, 116, and 117 are inductively coupled through two inductors 350 and 351. The circuit can be operated at cryogenic temperatures (near 4 K) and is desirably compact, fast, and energy-efficient. Write, read, and reset operations are applied to the same circuit, thereby conserving area and decreasing read/write latency. Pulse energies required for implementation of the memory operations can be very low (in the range of $10^{-19}$ Joules (J) (0.1 aJ)) and delay times, measured from the application of the pulse to the circuit response, may be lower than 100 ps.

In the generalized example of FIG. 3, pulse currents $I_{1Pulse}$, $I_{2Pulse}$, and/or $I_{3Pulse}$ may be applied to a respective first terminal of any one of the respective junctions 115, 116, and/or 117 for performing read and write operations for a memory cell comprising the three junctions. In some examples, a constant bias current $I_{1DC}$, $I_{2DC}$, and/or $I_{3DC}$ may be applied to a respective second terminal of any one of the respective junctions 115, 116, and/or 117. At least one, and in some configuration all, of the bias currents applied to the junctions may have different magnitude than other applied bias currents.

Figure 4:
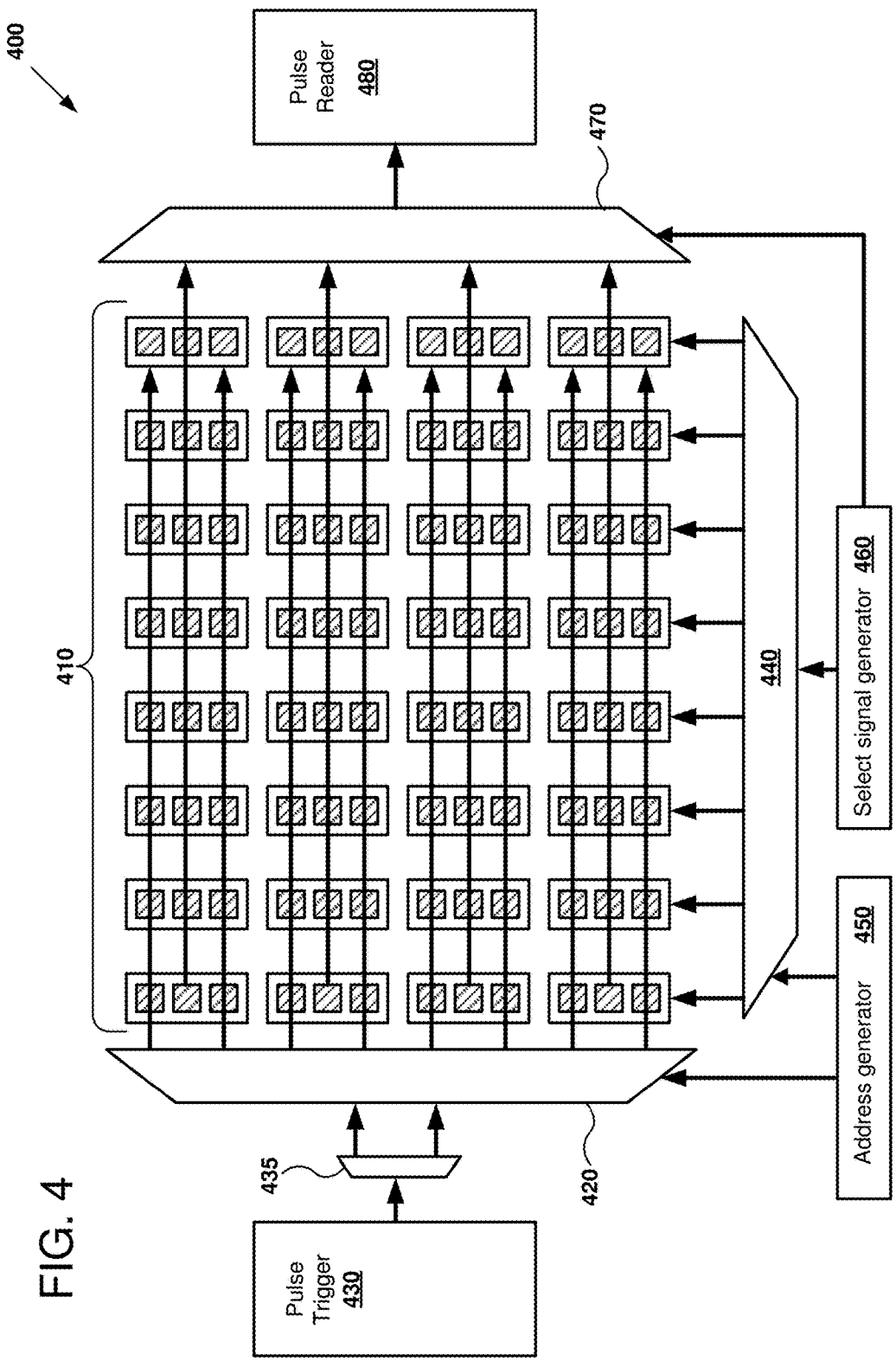
FIG. 4 illustrates an array of memory cells comprising Josephson junctions, as can be implemented in certain examples of the disclosed technology.

FIG. 4 is a block diagram 400 depicting an array of memory cells constructed from coupled Josephson junctions, as can be implemented in certain examples of the disclosed technology. As shown in FIG. 4, an array 410 of Josephson junction memory cells has eight columns and four rows. Each of the rows has three lines coupled to the memory cells. An address decoder 420 receives pulses from a pulse trigger 430. The output of the pulse trigger can be selected to go to a first junction of a selected memory cell or second junction of a memory cell with use of a selection decoder 435 that is coupled to the input of address decoder 420. In such examples, one pulse trigger 430 can be used to apply a signal to different junctions of a memory cell at different points in time. A column decoder 440 is also included that selects a column to read from a particular memory cell in the array 410. An address generator 450 receives a number of address bits and in turn selects the appropriate output of the row decoder 420 and the column decoder 440 respectively. A select signal generator circuit 460 is coupled to the column decoder and generates appropriate electrical signals such as DC signals or pulses that can be used to select a particular memory cell of the array. A read multiplexer 470 in turn is used to select an output from an appropriate memory cell which is then transmitted to the pulse reader 480. Thus, a single pulse trigger circuit 430 and a single pulse reader circuit 480 can be coupled to one of an array of memory cells, thereby reducing overhead for the pulse trigger and pulse reader circuits. In other examples, other configurations of pulse triggers and pulse readers may be employed. For example, there may be a pulse trigger provided for each row of an array of memory cells, and similarly a pulse reader may be provided for each row of the memory array.

It should be noted that the circuitry implementing the selection circuits for the array 410 are analogous to certain digital component, but do not operate on digital values. Rather, these circuits are configured to pass continuous voltage levels from/to the pulse trigger 430 and pulse reader 480, respectively. For example, analog voltage levels received at the address decoder, selection decoder 435, and read multiplexer 470 will be passed along substantially the same analog voltages as received from the pulse trigger 430.

Figure 5:
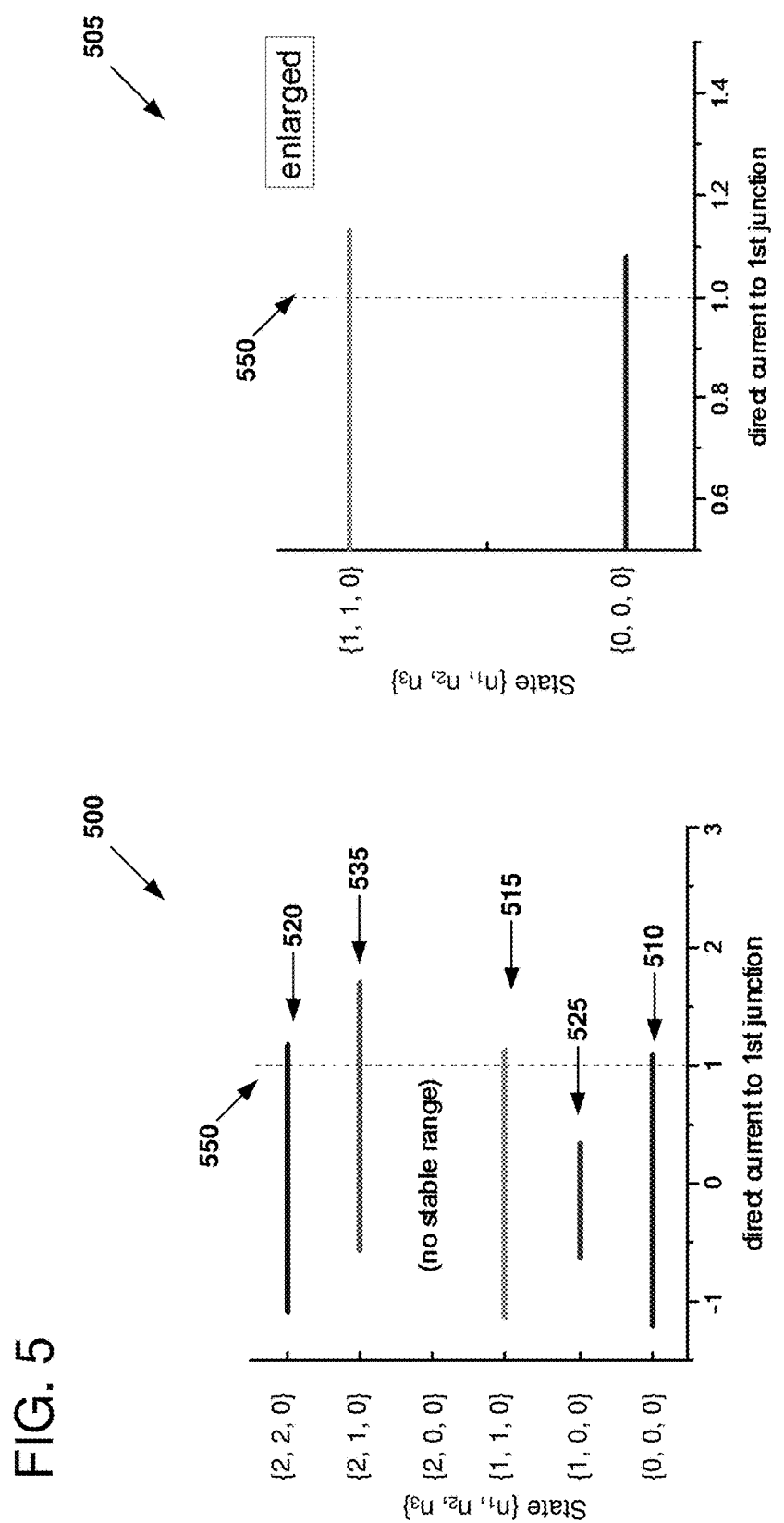
FIGS. 5, 6, and 7 illustrate stable sets of phase states for three different junctions in a plurality of Josephson junctions forming a memory cell, as can be used in certain examples of the disclosed technology.

An example of multiple phase states of an inductively coupled three junction array is illustrated in the FIG. 5, which shows state $\{n_1, n_2, n_3\}$ existence intervals as a function of the values of the first junction DC current values $i_{1DC}$ while keeping the values of the other junction currents fixed. FIG. 5 is a pair of charts 500 and 505 illustrating a number of sets of phase states for a plurality of three coupled Josephson junctions, as can be used in certain examples of the disclosed technology. As shown in the first chart 500, the phase state values are plotted along the Y-axis, and the corresponding DC current to a first junction of the plurality of junctions is plotted along the X-axis. A dashed line 550 indicates a DC current value applied in determining the phase values calculated in Table 2, below.

There are a number of stable states, including $\{0, 0, 0\}$ 510 and $\{1, 1, 0\}$ 515. In the illustrated example, only two sets of phase states are being used, thus other stable states such as state set $\{2, 2, 0\}$ 520, state set $\{1, 0, 0\}$ 525, and state set $\{2, 1, 0\}$ 535 are not used. Further, it should be noted that some sets of phase states, for example $\{2, 0, 0\}$ 530 are not stable for particular characteristics used in the plurality of Josephson junctions, and thus those states cannot be used to represent stored data. The second chart 505 is an enlarged version of the first chart 500 and illustrates the two states 510 and 515 that will be used in the examples described below. It should be noted that for the set of phase state notation used herein, that a value of zero represents a base phase, a value of one represents a phase that is $2\pi$ radiance from the zero phase, and the state value two represents a phase state that is $4\pi$ from the base phase state zero.

Figure 6:
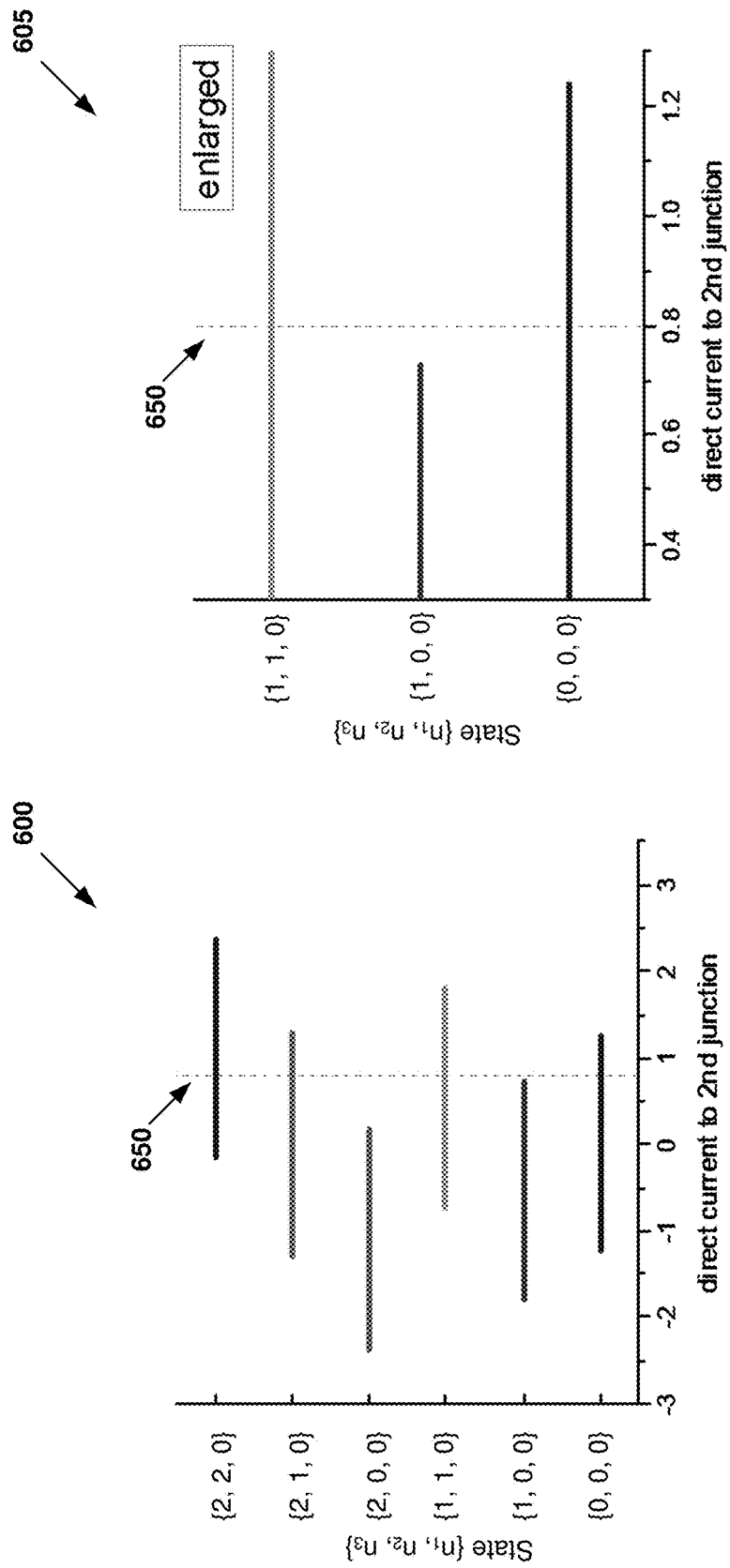
Figure 7:
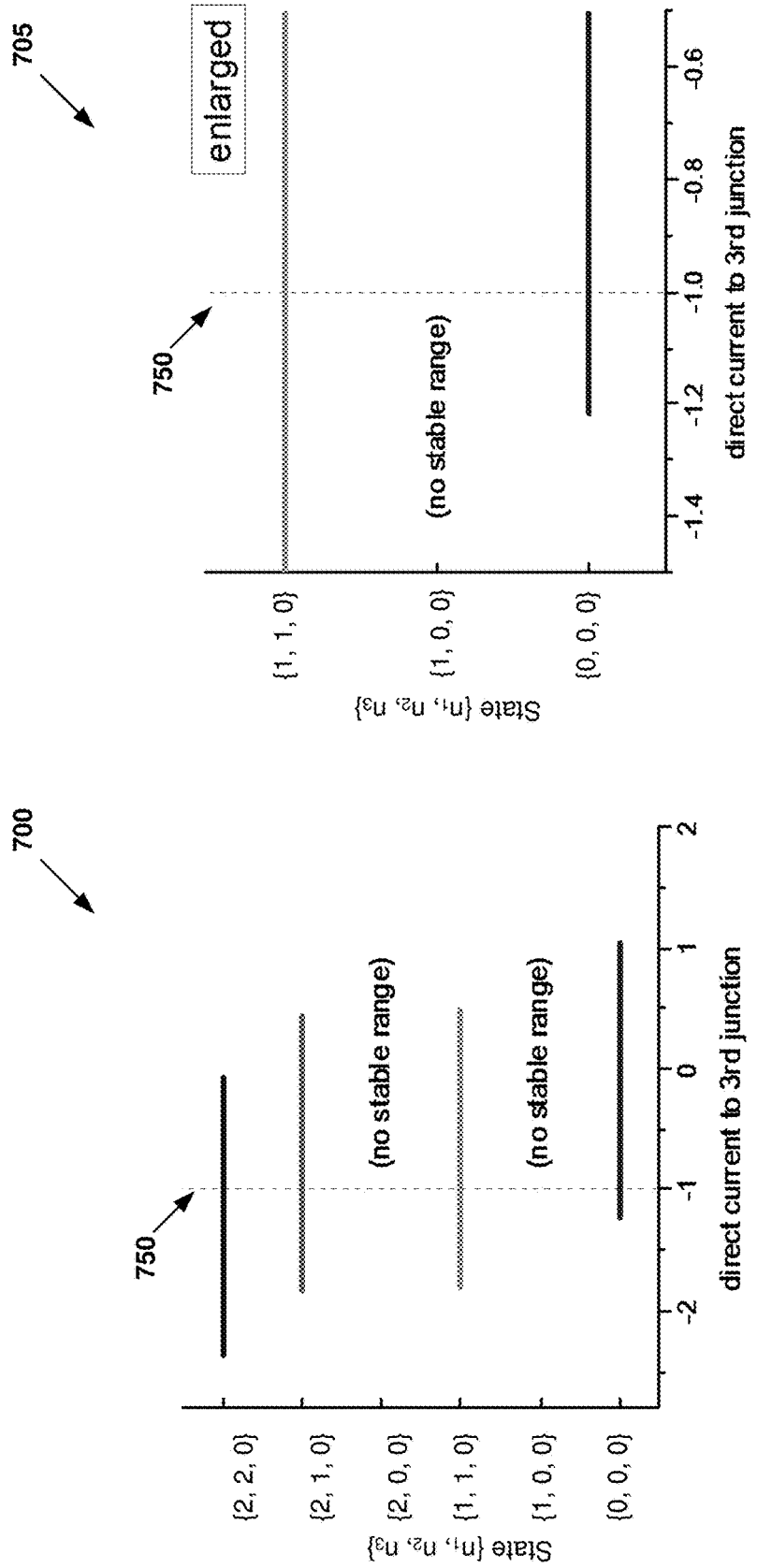

FIGS. 6 and 7 show state existence intervals as functions of the DC current applied to the second and the third junction, respectively. FIG. 6 is a pair of charts 600 and 605 that illustrate state existence intervals as a function of the DC current applied to the second junction 116 of the plurality discussed above regarding FIGS. 1-3. The first chart 600 shows all possible sets of states for the second junction, while the second chart 605 is an enlarged portion of the first chart 600. The charts 605 shows enlarged intervals of state existence curves in particular for parameters that used for example memory operations discussed in this example. The parameters used are identified by the vertical dashed line 650 (at 0.8 V).

FIG. 7 is a pair of charts 700 and 705 showing phase states as a function of direct current applied to the second terminal of the third Josephson junction 117. The dotted line 750 indicates the set of states that is stable for $I_{3DC}$ of a value of minus 1.0 volts. The second chart 705 is an enlarged version of the first chart 700 showing the range of stability of states $\{0, 0, 0\}$ and $\{1, 1, 0\}$. The charts 705 shows enlarged intervals of state existence curves in particular for parameters that used for example memory operations discussed in this example. The parameters used are identified by the vertical dashed line 750 (at −1.0 (this is current and units are dimensionless.)).

These stability diagrams may be used to select the values of DC bias current applied for memory operations. Junction currents where phase states overlap may be chosen as a possible candidate for memory operation. Operating the circuit with the current values that are at the edges of the state overlap may show the highest robustness to the applied write and read pulses. One set of memory operations performed by applying a pulse to a particular junction of a plurality of junctions configured as in FIGS. 3 and 4 are described in Table 1, below.

TABLE 1

|  | Write "0" | Write "1" | Read |
|---|---|---|---|
| Original state "0" | Applied junction: $J_3$ End state: "0" | Applied junction: $J_1$ End state: "1" | Applied junction: $J_1$ End state: "1" Read junction: $J_2$ |
| Original state "1" | Applied junction: $J_3$ End State: "0" | Applied junction: $J_1$ End state: "1" | Applied junction: $J_3$ End state: "1" Read junction: $J_2$ |

In Table 1, the applied junction is the junction to which a pulse (e.g., a Gaussian pulse) is applied and read junction is the junction from which voltage is read to confirm operation has taken place. The original state is the initial state which the junction is in before the application of a pulse, and the end state is the final state of the junction is after the application of a pulse.

Figure 8:
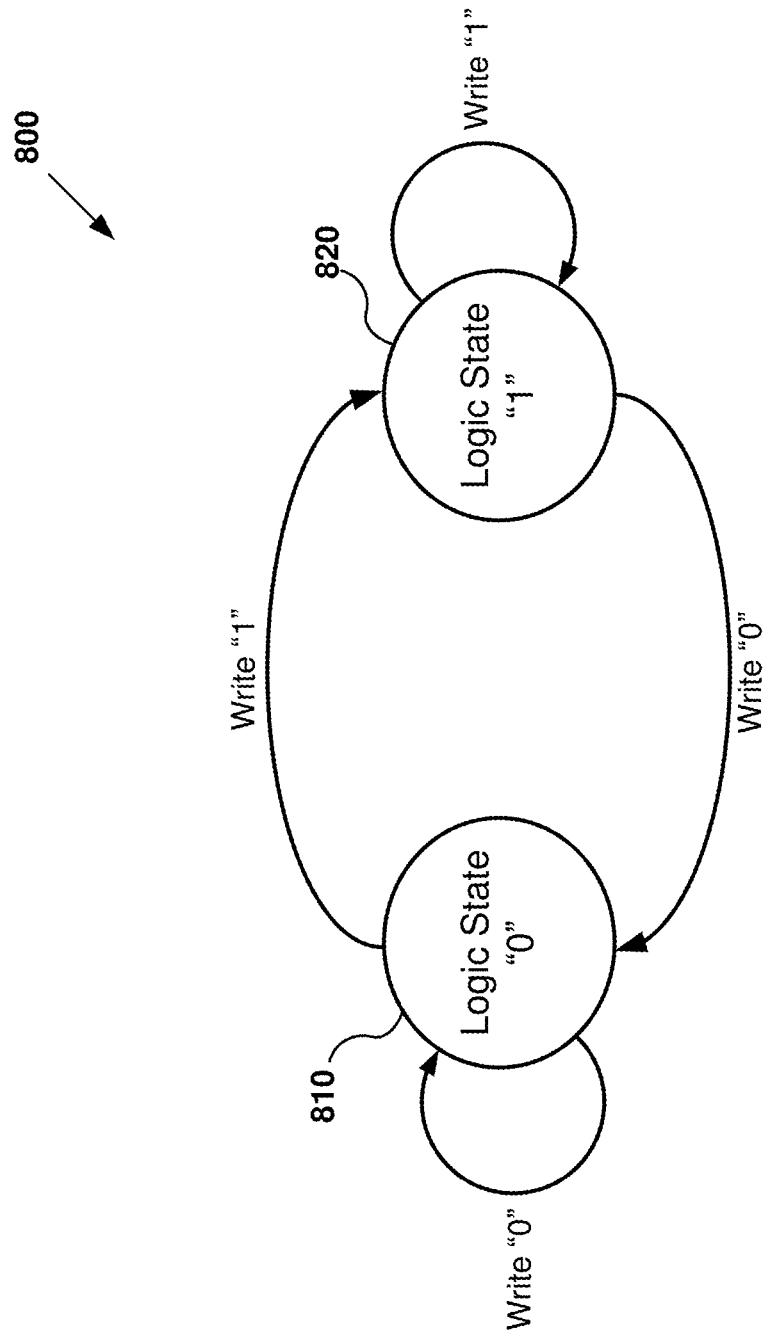
FIG. 8 is a state diagram illustrating logic states for an example memory cell implemented according to the disclosed technology.

FIG. 8 is a state diagram 800 showing the different states of a memory cell and how transitions will change state as a result of applying write one and write zero pulses to a plurality of Josephson junctions as described above regarding FIGS. 1-3. As shown, the memory cell is configured to have two stable states: state "0" 810 which represents a logic number zero and state "1" 820 which represents a logic value of one. As discussed above, various phase states of a plurality of Josephson junctions can be assigned to represent the respective logic zero and one states. For example, the set of phase states {0, 0, 0} can be designated as representing logic value zero which a second set of phase states {1, 1, 0} can be designated as representing logic value one (or, the opposite). When the collection of Josephson junctions is in the logic zero state 810 and a write zero pulse is applied to the third Josephson junction J3 117, the memory cell will remain in the logic zero state. If a write pulse is applied to Josephson junction J1 115, the memory cell will transition to the logic one state 820. Conversely, writing a logic one to the first Josephson junction J1 115 will leave the memory cell in the logic one state, while writing a zero by applying a write pulse to the third Josephson junction J3 117 will result in a system transitioning to the logic zero state.

The disclosed circuits can operate as a memory cell if a set of operators can transition the system to clearly defined states and can output a signal that discriminates memory states. When all three junction phases are in the same sinusoidal potential well, the system will be considered in the "0" state, $\{n_1, n_2, n_3\}=\{0, 0, 0\}$. When the phases of the first and second junctions are shifted to the next potential well (about $2\pi$ greater), the cell will be in the logic "1" state, where the set of phase states $\{n_1, n_2, n_3\}=\{1, 1, 0\}$. For two-state memory design, a pulse of a certain range in amplitude applied to the first junction will result in transition of the three-junction array from the set of phase states {0, 0, 0} to the set {1, 1, 0}. Once in the set of phase states {1, 1, 0}, an array will stay at the same state if additional pulses of the same amplitude range will be applied to the first junction. Consequently, such an operation may correspond to a variety of memory operations such as write and read.

Figure 9:
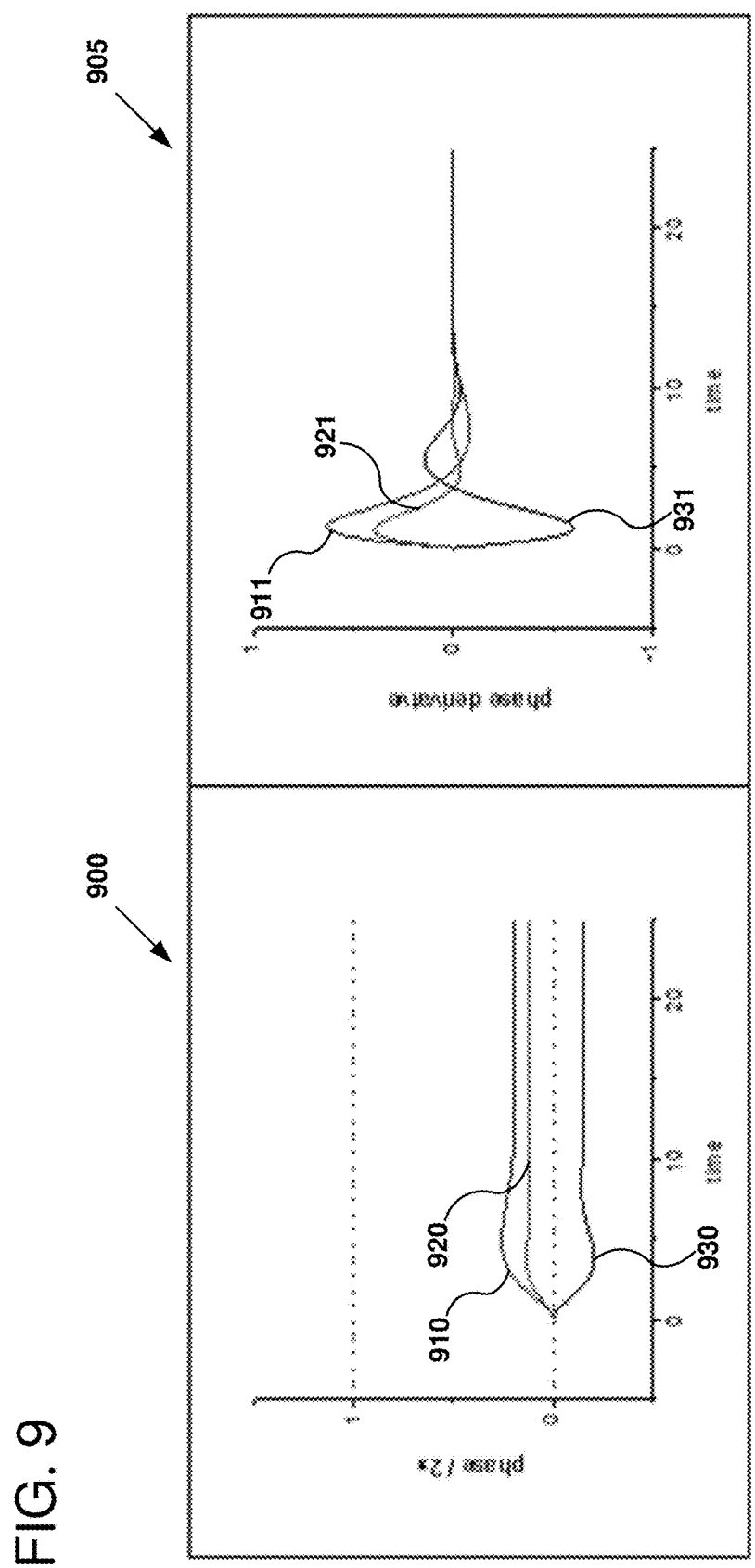
FIG. 9 includes two charts depicting changes in junction phase over time for an example memory cell implemented according to the disclosed technology.

FIG. 9 is a pair of charts 900 and 905 illustrating the phases of a set of Josephson junctions coupled as in FIGS. 1-3 when the memory cell starts from zero initial conditions. The first chart 900 shows the phase values (910, 920, and 930) over time (corresponding to the first junction 115, second junction 116, and third junction 117, respectively), while the second chart 905 illustrates the derivative of the phase values (911, 921, and 931) over the same time period (corresponding to the first junction 115, second junction 116, and third junction 117, respectively). As shown, each of the phases of the junctions will approach a stable state "0" where the set of all phase of the junctions are close to the same multiple. The parameter values plotted in the charts of FIGS. 9-26 are the same as those used in Table 2 unless stated otherwise.

A variety of circuits that support multiple states can implement various disclosed memory cells. One example of the proposed memory circuit incorporates an inductively coupled array of three Josephson junctions with free-end boundary, conditions, as shown in FIG. 3. In other words, the two end junctions 115 and 117 at the beginning and end of the array are coupled only to one other junction (junction 116), while internal junctions (e.g., junction 116) is coupled to both junctions adjacent to it. Larger arrays of junctions comprising four junctions would have two junctions with two couplings and two junctions with one coupling, five junctions would have three junctions with two coupled junctions and two junctions with one coupling, etc. The following relations in Equation (1) define the Josephon relations. The equation modeling an uncoupled resistively shunted junction plus capacitance (RSJ+C) circuit is provided by Equation (2), below. These equations assume operation in a cryogenic environment. Additional terms may be applied at higher temperature.

$$I_J = I_c \sin\phi, \quad V = \frac{\hbar}{2e}\frac{d\phi}{dt} \tag{1}$$

$$C\frac{dV}{dt} + \frac{1}{R}V + I_J = I_{ext} \tag{2}$$

Here $I_j$ is the Josephson (superconducting) current on the junction, V is the voltage on the junction, C is junction capacitance, R is junction resistivity, and $I_c$ is junction critical current, $I_{ext}$ is the external driving current, e is electric charge, and $\hbar$ is Planck's constant. Phase difference between the two parts of superconductors forming the junction is denoted by $\phi$. By combining Equations (1) and (2) we obtain the equation for the phase $\phi$:

$$\frac{\hbar C}{2e}\frac{d^2\phi}{dt^2} + \frac{\hbar}{2eR}\frac{d\phi}{dt} + I_c\sin\phi = I_{ext} \tag{3}$$

In order to describe the dynamics of the memory cell array, a resistively shunted junction (RSJ) model can be used corresponding to the following set of equations:

$$\frac{d^2\phi_1}{d\tau^2} + \gamma_1\frac{d\phi_1}{d\tau} + \sin\phi_1 = i_1 + \kappa_1 F_1(\phi_1, \phi_2, \phi_3) + G_1(\dot{\phi}_1, \phi_1) \tag{4}$$

-continued $$\frac{d^2\phi_2}{d\tau^2} + \gamma_2 \frac{d\phi_2}{d\tau} + \sin\phi_2 = i_2 + \kappa_2 F_2(\phi_1, \phi_2, \phi_3) + G_2(\dot{\phi}_2, \phi_2)$$

$$\frac{d^2\phi_3}{d\tau^2} + \gamma_3 \frac{d\phi_3}{d\tau} + \sin\phi_3 = i_3 + \kappa_3 F_3(\phi_1, \phi_2, \phi_3) + G_3(\dot{\phi}_3, \phi_3)$$

Here, the functions F and G correspond to junction coupling and junction circuit parameters. The coupling between the junctions can be, for example, nearest neighbor coupling, where two or more proximate junctions are inductively coupled to one another.

Here $$\kappa = \frac{\Phi_0}{2\pi L I_c}, \Phi_0 = \frac{h}{2e}$$

is the magnetic flux quantum, and L is the inductance of the inductor that couples Josephson junctions. The applied current to the junctions includes a DC component and a pulse applied at a certain time for certain duration, $$i_k(\tau) = i_{DC,k} + \frac{i_{pulse,k}}{\sqrt{2\pi\sigma_k^2}} e^{\frac{-(\tau-\tau_k)^2}{2\sigma_k^2}} \quad (5)$$

The equations are written in dimensionless units. The dimensionless equation for a single junction in RSJ model (left-hand side of equation (4), can be written in the following way:

$$\frac{d^2\phi}{d\tau^2} + \gamma \frac{d\phi}{d\tau} + \sin\phi = i$$

and the transition to dimensionless units is given below as:

$$\omega_J^2 = \frac{2e}{\hbar} \frac{I_c}{C}, \tau = \omega_J t, \frac{I_{ext}}{I_c} = i, \text{ and} \quad (6)$$

$$\gamma = \sqrt{\frac{\hbar C}{2e I_c}} \frac{1}{RC} = (\omega_J RC)^{-1}$$

The dimensionless equation for a single junction is $$\frac{d^2\phi}{d\tau^2} + \gamma \frac{d\phi}{d\tau} + \sin\phi = i \quad (7)$$

and is realized using the parameters defined in Equation (6). For a single junction in the illustrated example, values of $\gamma=O(1)$ were used that correspond to an approximately 670-770 nm feature size junction having a critical current density of $J_c \approx 50$ kA/cm$^2$.

For a memory cell including a plurality of weak-to-moderately coupled Josephson junctions and subject to certain parameter range, applying a pulse to a single junction induces separable dynamics where the phase of only one junction moves significantly at a given time while the other junctions remain close to their steady state positions. For the calculations herein, the contribution of the second derivative is ignored since its contribution to the behavior of the memory cell is rather small relative to the first derivative. Due to separable motion of each junction (only one junction moves at a given time), Equations (1) above can be decoupled and rewritten in the following form. In the set of Equations (8), the two equations for the boundary junctions have a single term using κ, while the middle equation for the internal junction has two κ terms.

$$\gamma_1 \frac{d\phi_1}{d\tau} = i_1 + \kappa(\phi_{2eq} - \phi_1) - \sin\phi_1 \quad (8)$$

$$\gamma_2 \frac{d\phi_2}{d\tau} = i_2 + \kappa(\phi_{1eq} + 2\pi - \phi_2) - \kappa(\phi_2 - \phi_{3eq}) - \sin\phi_2$$

$$\gamma_3 \frac{d\phi_3}{d\tau} = i_3 + \kappa(\phi_{2eq} + 2\pi - \phi_3) - \sin\phi_3$$

Here $\phi_{1eq}$, $\phi_{2eq}$, $\phi_{3eq}$ are the equilibrium phases of the junctions. The pulse shape can be approximate for excitation as rectangular wave. Taking into consideration all the approximations presented above, these equations can be expressed as:

$$\gamma \frac{d\phi}{dt} = F(\phi) \text{ and } dt = \gamma \frac{d\phi}{F(\phi)}.$$

Subsequently, $$T = \gamma \int \frac{d\phi}{F(\phi)} = \gamma \int d\phi \exp(-\ln(F(\phi))).$$

We can now expand ln $$F(\phi) \approx \ln(F(\phi_c)) + \frac{F'}{F}(\phi - \phi_c) + \frac{FF'' - F'^2}{2F^2}(\phi - \phi_c)^2 + \ldots$$

and since $F'(\phi_c)=0$, we get ln $$F(\phi) \approx \ln(F(\phi_c)) + \frac{F''(\phi_c)}{2F(\phi_c)}(\phi - \phi_c)^2 + \ldots.$$

Using saddle-point integration method, we obtain $$T \approx \gamma F^{-1}(\phi_c) \int_{-\infty}^{\infty} \exp\left(-\left(\frac{F''(\phi_c)}{2F(\phi_c)}(\phi - \phi_c)^2\right)\right) d\phi \text{ or}$$

$$T \approx \gamma F^{-1}(\phi_c) \sqrt{\frac{2\pi F(\phi_c)}{F''(\phi_c)}} = \gamma \sqrt{\frac{2\pi}{F(\phi_c) F''(\phi_c)}}.$$

For a three-junction array, we get $$T_1 \approx \gamma \sqrt{\frac{2\pi}{i_1 + \kappa(\phi_{2eq} - \pi/2) - 1}}, \quad (9)$$

$$T_2 \approx \gamma \sqrt{\frac{2\pi}{i_2 + \kappa(\phi_{1eq} + 2\pi - \pi/2) - \kappa(\pi/2 - \phi_{3eq}) - 1}},$$

$$\text{and } T_3 \approx \gamma \sqrt{\frac{2\pi}{i_3 + \kappa(\phi_{2eq} + 2\pi - \pi/2) - 1}}$$

Since the values of the DC current and pulses are in the range of 1.0-5.0 in dimensionless units, pulse energies will be in the range of $1-5 \times 10^{-19}$ J. The duration of time (period T) to complete the transition from one state to another can thus be estimated (which period is, in principle, the time delay between the between the applications of the pulse to the circuit response). For the example memory circuit, these times are in the range of 20-100 ps.

IV. Memory Operation by Gaussian Pulses

The memory circuit discussed above at FIGS. 1-3 can be employed in variety of ways to implement a functional memory device. In the illustrated example, the memory is operated so that there are two logic states, "0" and "1." The circuit can operate as a memory cell if a set of operators can transition the system to clearly defined states and can output a signal that discriminates memory states. When all three junction phases are in the same sinusoidal potential well, the system will be considered in the logic "0" state, $\{n_1, n_2, n_3\}=\{0, 0, 0\}$. When the phases of the first and second junctions are shifted to the next potential well (about $2\pi$ greater), the cell will be in the logic "1" state, $\{n_1, n_2, n_3\}=\{1, 1, 0\}$. These two states correspond to the first and third rows of Table 2, which is discussed in further detail below.

In the following sections we will demonstrate how basic memory operations can be implemented to navigate between the states as shown in the state diagram discussed above of FIG. 8.

The set of states $\{n_1, n_2, n_3\}$ listed in Table 1 shows equilibrium phases for the specific set of driving currents $i_{1DC}=1.0$, $i_{2DC}=0.8$, $i_{3DC}=-1.0$, the dissipating terms are $\gamma_1=\gamma_3=0.7$, $\gamma_2=1.1$, and the coupling parameters are $\kappa_1=\kappa_2=0.1$. If any of these currents were to change slightly, the equilibrium phases would adjust accordingly, but still reside in the same potential wells described by $n_k$. When the values of the currents change significantly, some of these steady states may not exist or become unstable. Table 2 includes all of the possible sets of steady state offsets where $n_1 \geq n_2 \geq n_3$ and $n_1 - n_3 \leq 2$. Without loss of generality, $n_3$ is defined to be 0 since the locations of local minima are symmetric to shifting all phases by $2\pi$. For simplicity, we only present in Table 2 the states for $n_1 < 3$. The estimated offsets $\theta_k^*$ are rather close (within $\sim 17°$) of the numerical solutions $\theta_k$ found from minimization via the Nelder-Mead simplex (direct search) method on the potential function. The final column shows the values of the potential function at the local minima last column provides the potential value V at the local minima. For the set of DC currents and coupling parameters, no steady state set exists when the first junction phase is about $2\pi$ greater than both of the other two junction phases (see rows where $\{n_1, n_2, n_3\}=\{1, 0, 0\}$ and $\{2, 0, 0\}$).

A. Gaussian Pulses Write "1" Operation

If applying a Gaussian pulse applied to the system yields a transition to the logic "1" state, then the operation can be considered as a memory write "1" operation. The equilibrium configuration of the phases in the logic "1" state is a stable state where the phases of the first and second junction are shifted into the next potential well (approximately $2\pi$ greater than the phase of the third junction). For this particular example, in order for the transition from the "0" state to the "1" state to be successful, the energy injected into the system by a pulse must change the phase states of the first and second junctions. In the example of FIG. 1, a pulse is applied to the first junction. Due to the electrical and/or magnetic coupling between the first and second junctions, this pulse will cause to the phase shift of the second junction as well. The potential energy of state "1" is less than the potential energy of state "0." The phase of the third junction will not change as a DC current drives it in the opposite direction.

Figure 10:
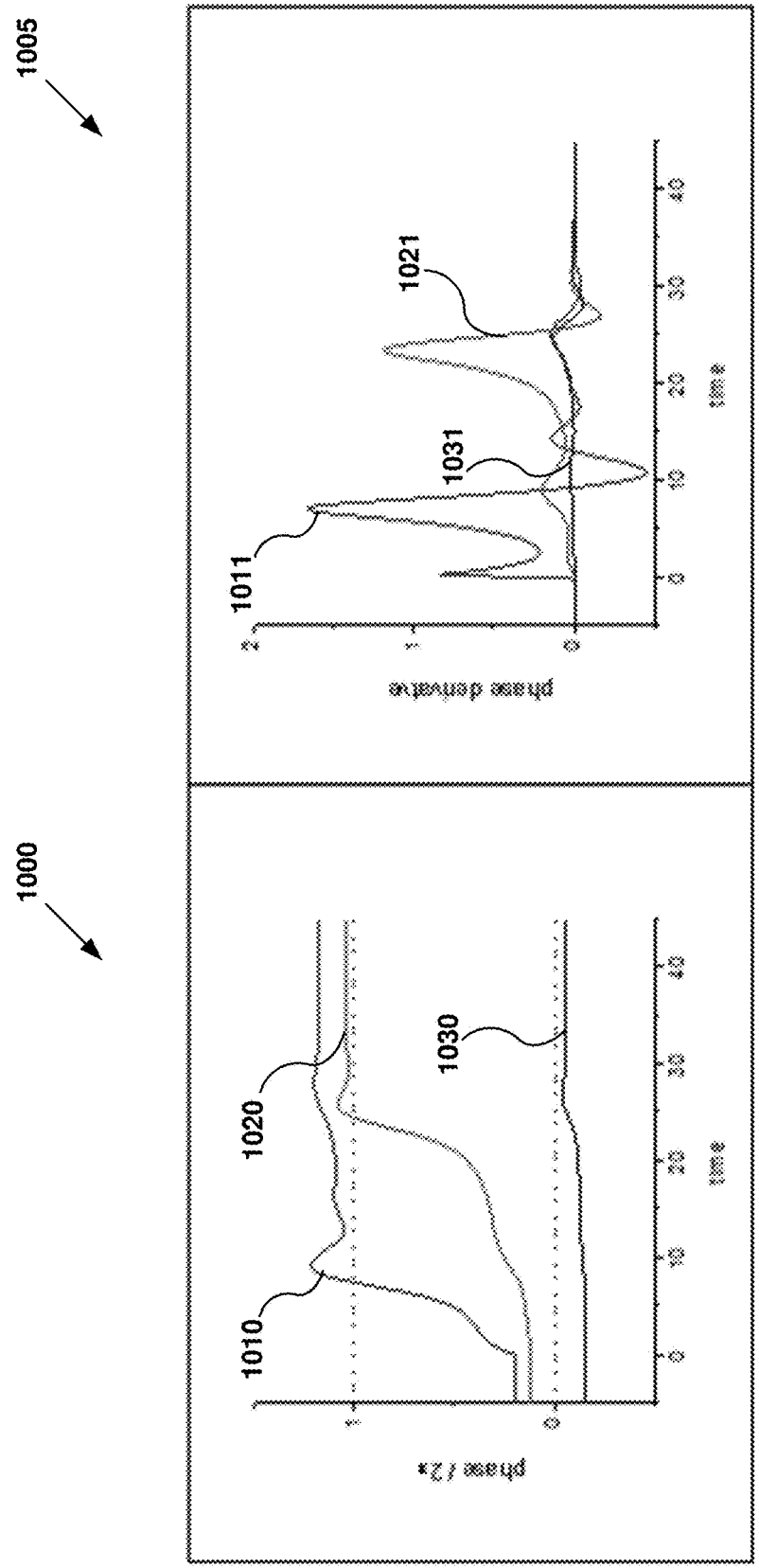
FIG. 10 includes a set of charts illustrating changes in phase for a set of junctions during a write operation, as can be observed in certain examples of the disclosed technology.

The curves plotted in the charts 1000 and 1005 of FIG. 10 show the response to the Gaussian pulse of size $i_{pulse,1}=1.0$ being applied to the first junction after the system has settled into its "0" state. The first chart 1000 shows the response (1010, 1020, and 1030) for the three junctions (115, 116, and 117, respectively) as a function of time, while the second chart 1005 shows the derivative (1011, 1021, and 1031) of the phase response for the same period of time. All of the pulses described in this section have a pulse width of 0.1 and a pulse center at zero time. The phase dynamics plotted in FIG. 10 show the phase response 1010 of the first junction rising quickly to the next local minimum, followed by the phase response 1020 of the second junction. The phase response 1030 of the third junction slightly shifts its equilibrium position but stays in the same potential well. The phase of the third junction slightly shifts its equilibrium position but stays in the same potential well. The period of the full transition from states "0" to "1" is of the order of 25 units of time, which is the equivalent of 100 ps in this example. The slower time scale is due to the system undergoing two transitions. The energy per pulse is of the order of $5 \times 10^{-19}$ J. This energy is very typical for other memory command pulses according to this particular example. As illustrated in FIG. 10, after the excitation junction phases

TABLE 2

| $n_1$ | $n_2$ | $n_3$ | $\theta_1^*/2\pi$ | $\theta_2^*/2\pi$ | $\theta_3^*/2\pi$ | $\theta_1/2\pi$ | $\theta_2/2\pi$ | $\theta_3/2\pi$ | V |
|---|---|---|---|---|---|---|---|---|---|
| 0 | 0 | 0 | 0.1545 | 0.1077 | −0.1349 | 0.1992 | 0.1187 | −0.1552 | −1.272 |
| 1 | 0 | 0 | 0.0706 | 0.1847 | −0.1279 | no stable minimum | | | — |
| 1 | 1 | 0 | 0.1475 | 0.0308 | −0.0510 | 0.1810 | 0.0338 | −0.0515 | −9.918 |
| 2 | 0 | 0 | −0.0134 | 0.2616 | −0.1209 | no stable minimum | | | — |
| 2 | 1 | 0 | 0.0636 | 0.1077 | −0.0440 | 0.0661 | 0.1164 | −0.0437 | −14.05 |
| 2 | 2 | 0 | 0.1405 | −0.0461 | 0.0329 | 0.1670 | −0.0443 | 0.0333 | −15.29 |

Each row of Table 2 shows the approximated offset phases, $\theta_k^*$, and the true offset phases of the local minima, $\theta_k$, for a given set of the multiples of $2\pi$ phase differences, $n_k$. All of the offset phases (in radians) are scaled by $2\pi$. The rate of change begins to slow down near the state $\{n_1, n_2, n_3\}=\{1, 0, 0\}$, but since no local minimum exists there, the phase states then start a second transition to state "1" at $\{n_1, n_2, n_3\}=\{1, 1, 0\}$.

Figure 11:
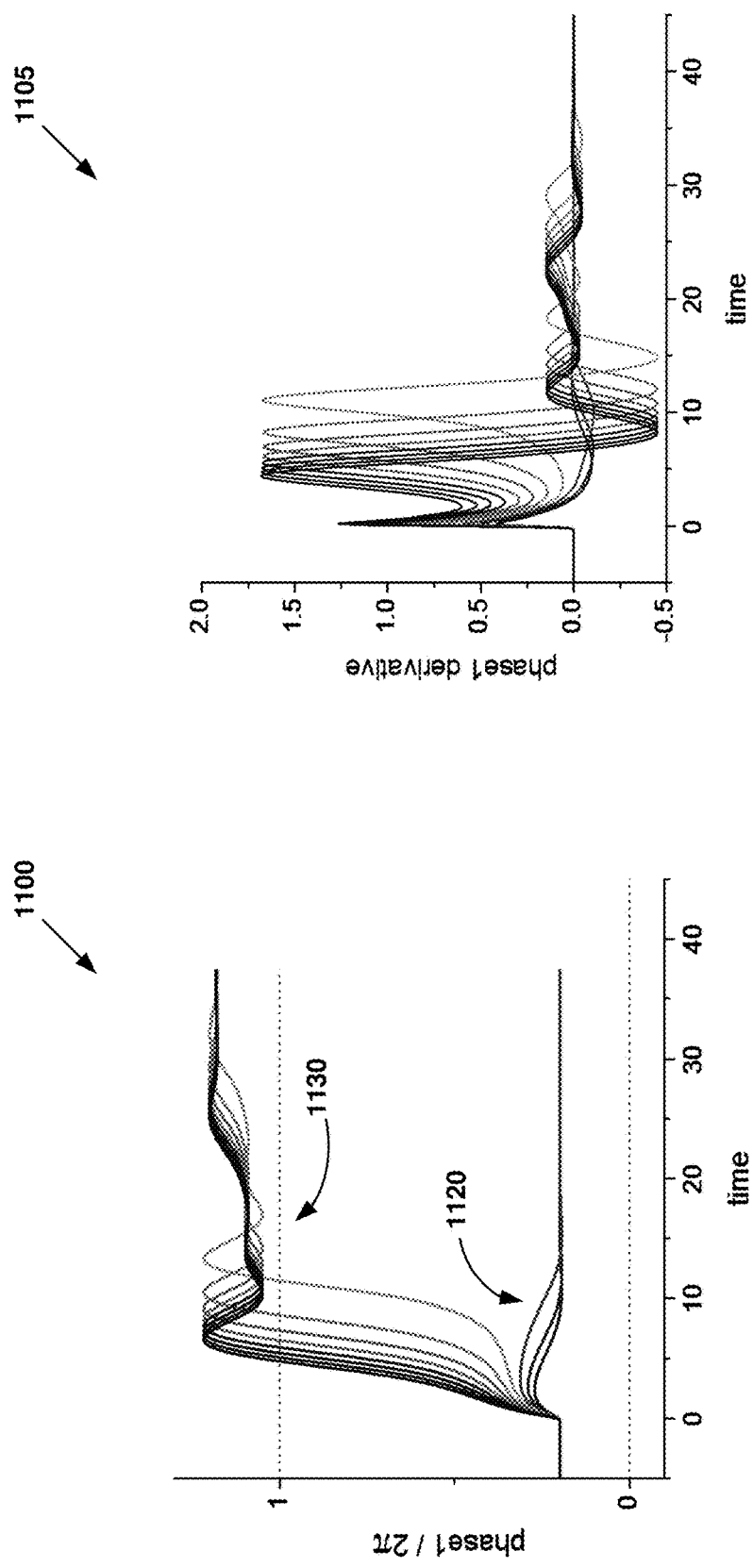
FIG. 11 is a set of charts illustrating the stability of a set of phase states with different bias voltages applied to the junctions, as can be observed in certain examples of the disclosed technology.

FIG. 11 includes two charts 1100 and 1105 showing the responses of first junction phase as a function of time for a variety of pulse amplitudes. The first chart 1100 shows the response for the first junction as a function of time, while the second chart 1105 shows the derivative of the phase response for the same period of time. The pulse widths σ are all fixed at 0.1, but the pulse amplitudes range from 0.5 to 1.5, which indicates that a broad range of pulse parameters can be used for a Write "1" operation. The three pulses having the lower amplitudes 1120 (pulse amplitudes of 0.7, 0.6, and 0.5) fail to pass beyond the potential threshold and consequently do not transition to the next state. For the higher amplitudes 1130 (values ranging from 0.8 to 1.5), the junctions transition to the next state.

The pulses add energy into the system. If this energy is sufficient to overcome the barrier energy then the system transitions into the steady state corresponding to logic state "1." The maximum value of the derivative of the phase is as high as 1.6, which is the equivalent of 0.8 mV. The large derivative magnitude is caused by the 2π phase slip. The derivative of the phase stays around 1.6 independent of the size of the pulse that triggered it.

Figure 12:
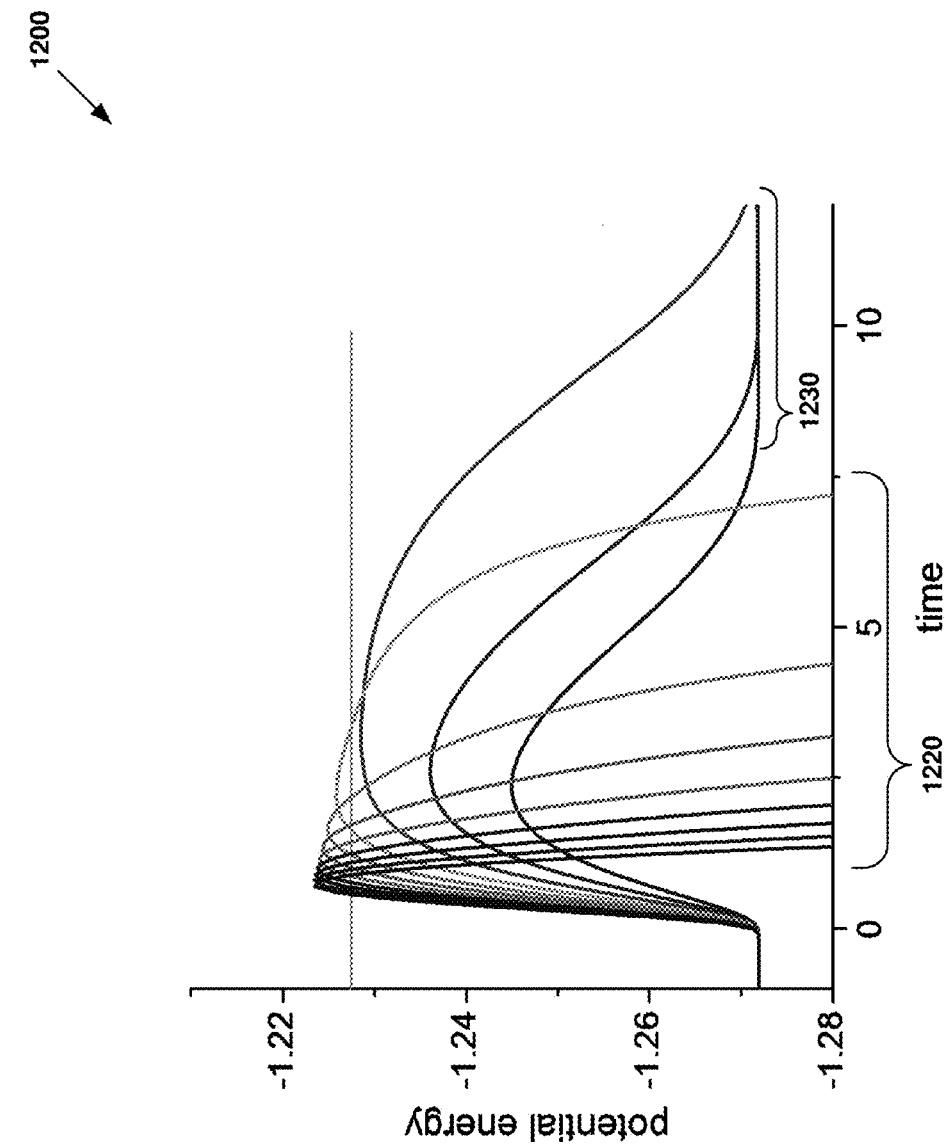
FIG. 12 is a chart illustrating potential energy in a memory cell over time for varying parameters of an example memory cell implemented according to the disclosed technology.

The barrier energy is illustrated in the chart 1200 of FIG. 12. The chart 1200 shows the potential energy of the system over time for the responses plotted in FIG. 9. As shown, most of the curves 1220 show potential energy increase and then rapidly decrease after passing the energy barrier. The three curves 1230 where pulse values $i_{pulse,1}$ are less than 0.8 fail to pass beyond the potential threshold and consequently do not transition to the next state. The barrier energy illustrated in FIGS. 11-12 is about 0.045, which is the equivalent of $10^{-19}$ J or 0.1 aJ.

Figure 13:
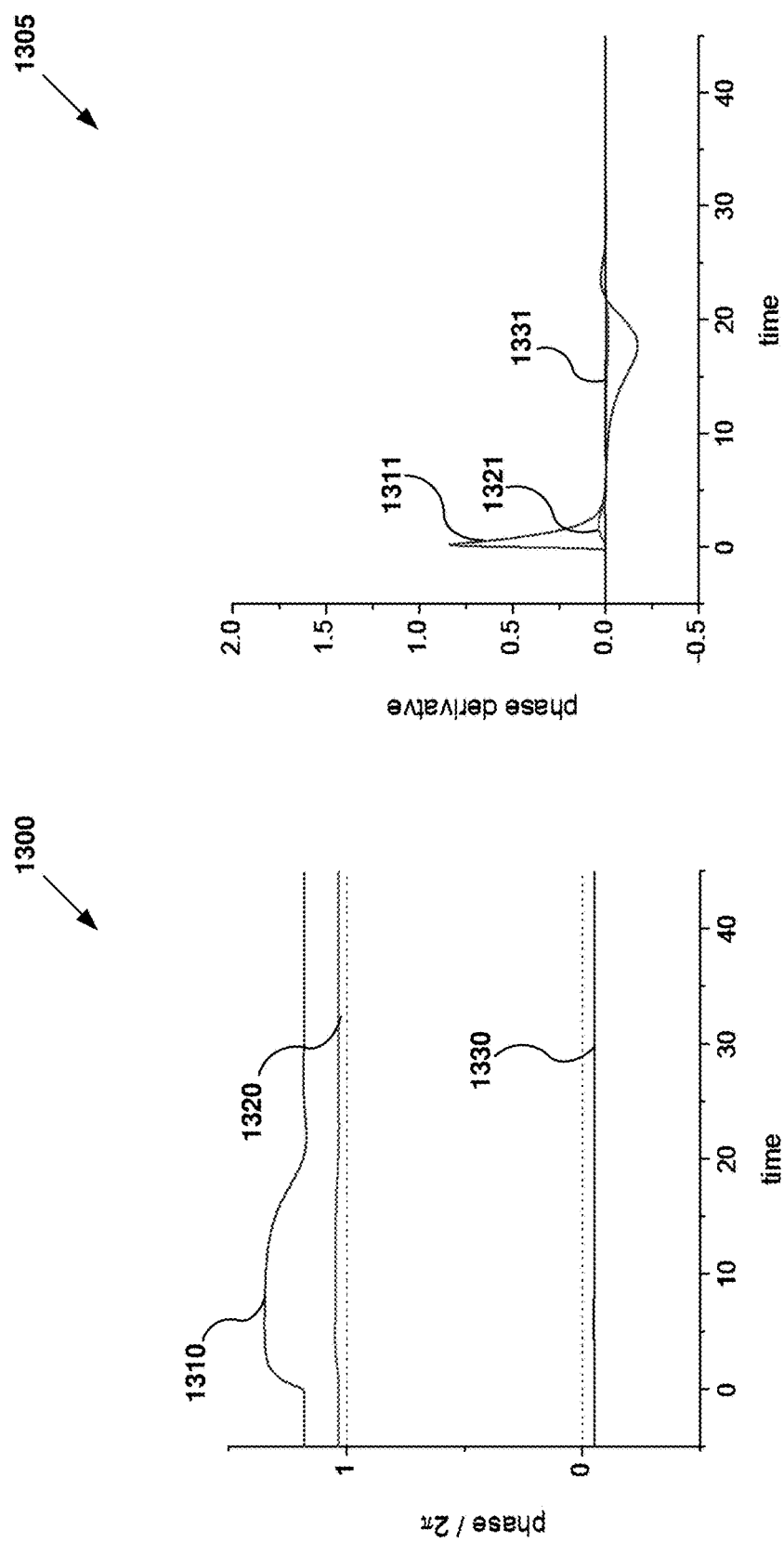
FIG. 13 illustrates a set of phase states for a memory cell when writing the same logic value to an example memory cell implemented according to the disclosed technology.

If the same pulse (as in FIG. 8) is applied to the first junction when the system is already in state "1", no change to the relative phase differences occurs (after the transient dynamics dissipate), as illustrated in FIG. 13. The first chart 1300 shows the corresponding response (1310, 1320, and 1330) for the three junctions (115, 116, and 117, respectively) as a function of time, while the second chart 1305 shows the derivative (1311, 1321, and 1331) of the phase response for the same period of time. As shown, the system remains in logic state "1." Therefore this pulse can be interpreted as a write "1" operator since the final state will always be "1" after it is applied to either initial steady state.

Figure 14:
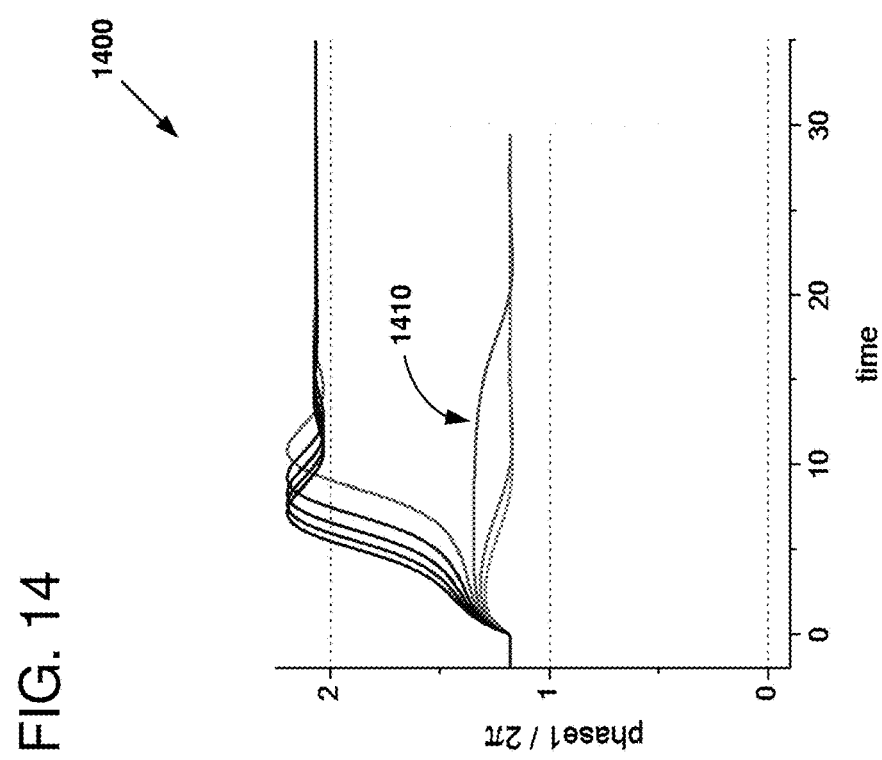
FIG. 14 is a chart illustrating stability of a set of phase states for different electrical parameters of an example memory cell implemented according to the disclosed technology.

Another criterion for the pulse amplitude must be noted: it should be strong enough to drive the system out of logic state "1." FIG. 14 includes two charts 1400 and 1405 demonstrating the time dependent responses of the first junction phase to a set of pulses with variable strengths. If the pulse is strong enough, it will transition the circuit from state "0" to "1," as shown by the three curves 1410 where the amplitude is 0.8, 0.9, and 1.0, respectively. Strong enough pulses that exceed the energy barrier will drive the circuit from the state $\{n_1, n_2, n_3\}=\{1, 1, 0\}$ to the state $\{n_1, n_2, n_3\}=\{2, 1, 0\}$. These pulses are unacceptably strong.

B. Gaussian Pulses Write "0" Operation

The memory's Write "0" or Reset operation can be implemented by sending a pulse to the third junction. The transition from state "1" back to "0" is demonstrated in FIG. 15 where the pulse applied to the third junction has an amplitude of $i_{pulse,3}$=5.0. The first chart 1500 shows the corresponding response (1510, 1520, and 1530) for the three junctions (115, 116, and 117, respectively) as a function of time, while the second chart 1305 shows the derivative (1511, 1521, and 1531) of the phase response for the same period of time. After the third junction phase moves one potential well, all the phases are within the same potential well (i.e. have the same multiple of 2π). The new steady state phases are exactly 2π larger than the phases in the {0, 0, 0} state. The new state is $\{n_1, n_2, n_3\}=\{1, 1, 1\}$, which by definition is equivalent to state {0, 0, 0}. The transformation occurs over a similar time period that was calculated according to the approximation calculated for the write "1" operation discussed above.

For this pulse to successfully reset the state from "1" to "0", the pulse needs to be strong enough to counter the driving current in the opposing direction. This is why this pulse's amplitude is greater than that of the Write "1" pulse. FIG. 16 shows the responses of the system in state "1" to a collection of pulses applied to the third junction whose amplitudes $i_{pulse,3}$ range from 4.5 to 5.2. As illustrated in the first chart 1620, only the pulse amplitudes equal to 4.9 and larger (1620) are sufficient to let the system exceed the potential threshold. The small pulse amplitudes (1630) do not allow the system to exceed the potential threshold. The derivatives are plotted in the second chart 1605. The derivative of the third phase increases up to a value of 4.5, which is the equivalent of 2.25 mV.

Figure 15:
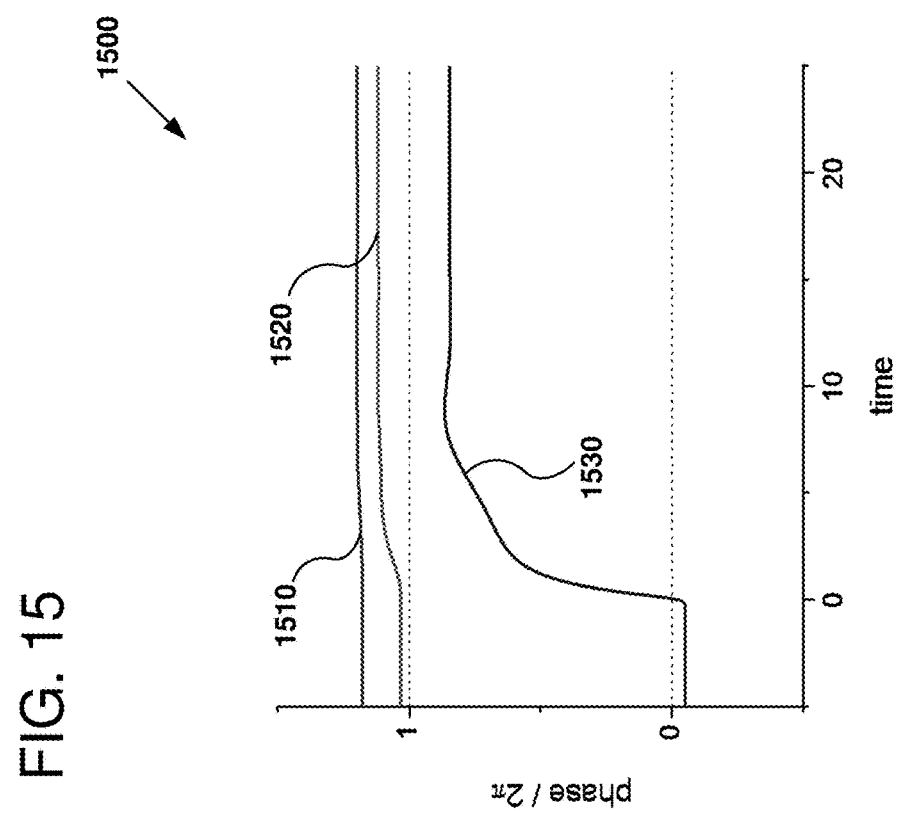
FIG. 15 includes two charts illustrating changes in phase state over time for writing a logic zero, as can be performed in certain examples of the disclosed technology.

We have numerically simulated the response of the circuit to the same pulse as in FIG. 15 when the junction array state is "0." No change in the state was observed after the transient behavior dissipates. This suggests that the pulse applied to the third junction can be used as a Write "0" operation. If a pulse is too strong, it would provide too much kinetic energy to the third junction and the system would transition over the potential barrier in the opposite direction. This third junction phase would settle into a steady state that is different from the other junction phases by approximately a multiple of 2π.

To analytically estimate the barrier energy of this transition, a simplified description of the dynamics is used. The response is assumed to be the transition of the third junction phase while the phases of other junctions remain in their positions. The potential function would then become Equation (10).

$$V(\phi_3 \mid \phi_1 = \phi_2 = 2\pi) = \qquad (10)$$
$$\frac{\kappa_2}{2}(\phi_3 - 2\pi)^2 - i_{DC,3} \cdot \phi_3 - \cos\phi_3 - 2\pi(i_{DC,1} + i_{DC,2}) + 1$$

The local minimum and maximum would occur when $\phi_3$ satisfies Equation 11, which equates a linear function with a sine function. These two functions are plotted in FIG. 17 as a first chart 1700 for the set of parameters as defined above. The corresponding potential as a function of the third junction phase, Equation 10, is plotted in FIG. 17 as a second chart 1705. The intersections of the first chart 1700 correspond to local extrema on the second chart 1705. The difference in potential between the minimum near 0 and the maximum before 2π is 4.00, the estimated barrier energy using the simplified description of the dynamics. The $\phi_3$ value of local extrema of V, when $\phi_1=\phi_2=2\pi$, is $$-\kappa_2\phi_3 + 2\pi\kappa_2 + i_{dc,3} = \sin\phi_3. \qquad (11)$$

Figure 18:
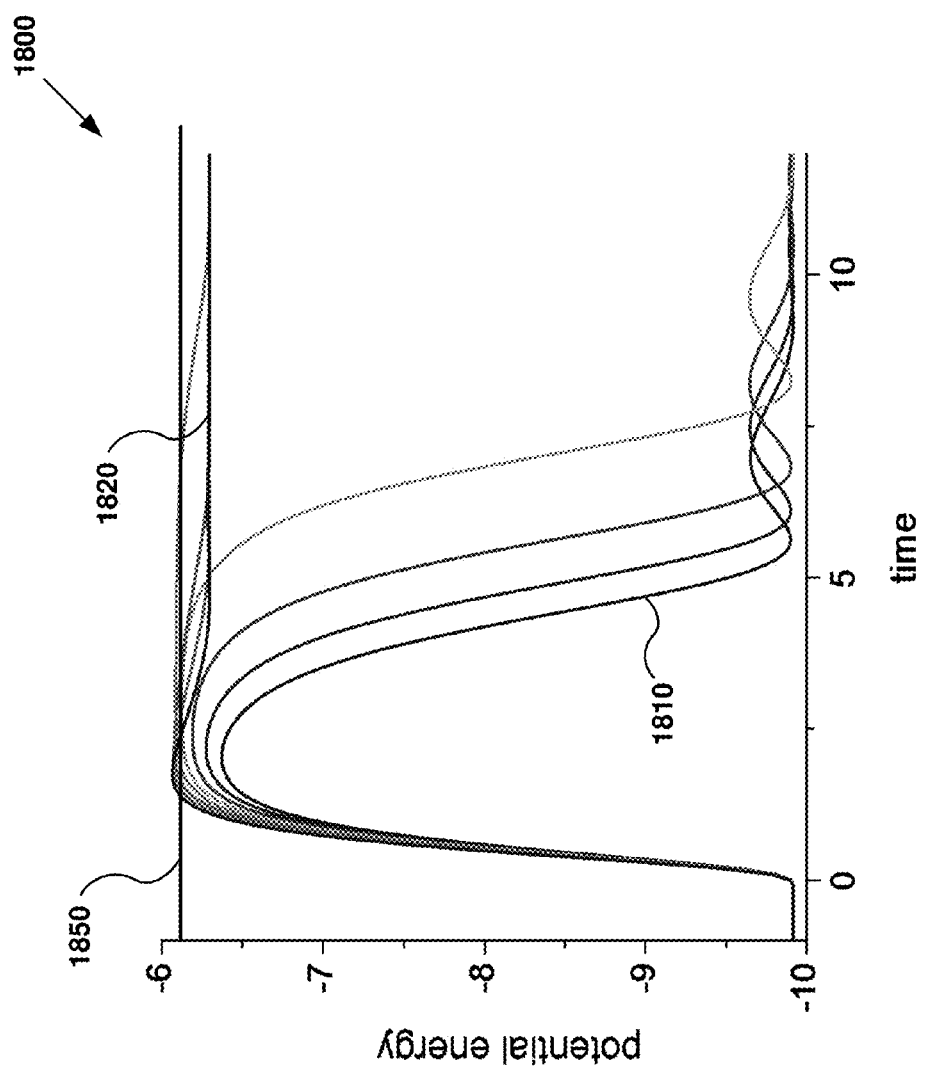
FIG. 18 is a plot showing potential energy of a memory cell as function times for pulses of different amplitudes, as can be observed in certain examples of the disclosed technology.

FIG. 18 is a chart 1800 showing potential energies of the system as functions of time for responses to pulses of different amplitudes. The set of responses that result in a new steady state for the system indicate that the array received enough energy from the pulse to make a transition. The Gaussian pulse amplitudes vary from 4.5 (plot 1810) to 5.2 (plot 1820). The horizontal line 1850 in FIG. 18 defines a threshold for this transition, indicating that in order to transition to the next state the gain in potential energy of the circuit due to the external pulse must be at least 3.81 (in dimensionless units). The reduced-order model presented above predicted a barrier energy of 4.00, which is reasonably close to the numerical estimation.

Figure 19:
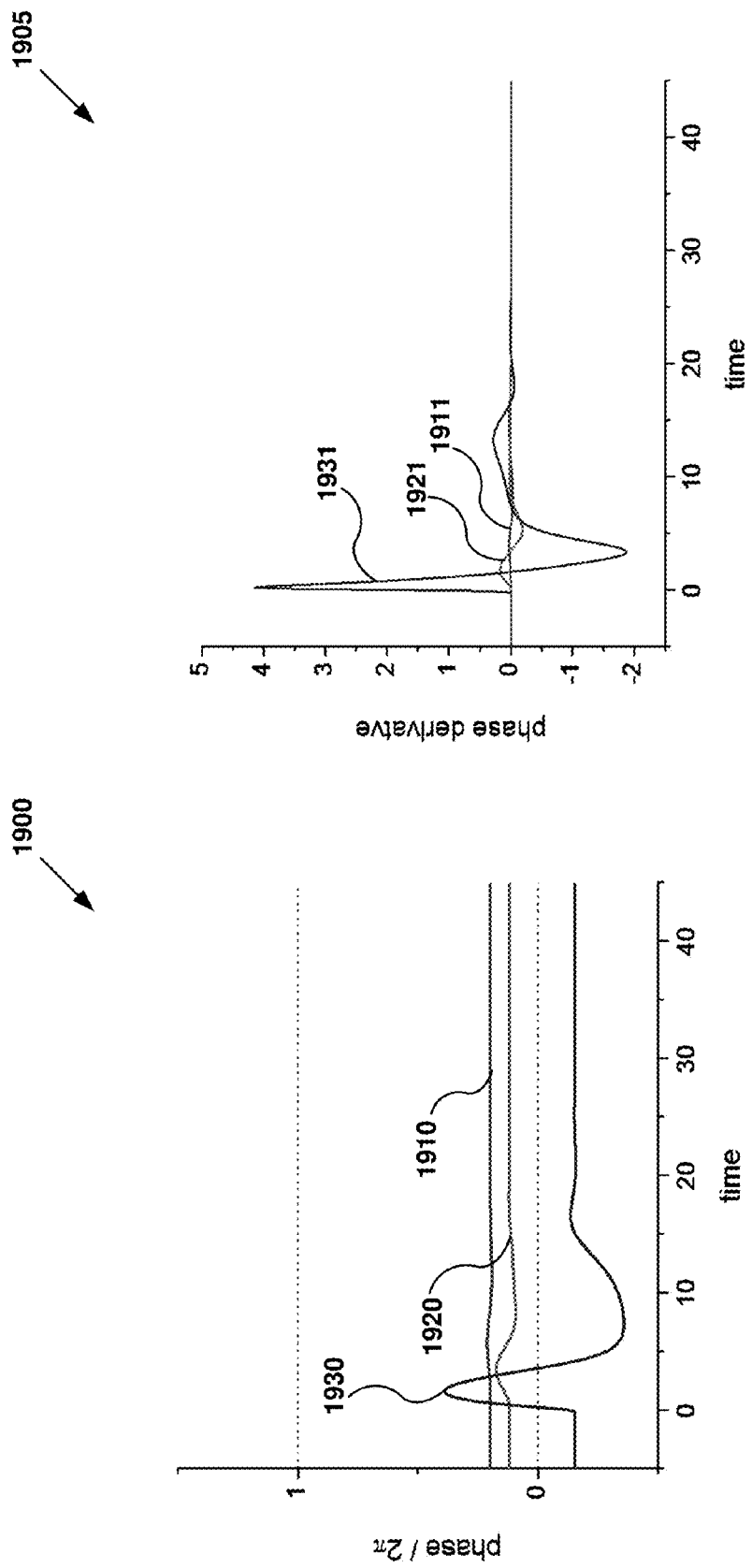
FIG. 19 is a plot showing phase states for a memory cell when a logic zero write operation is performed when the memory cell is aware of the logic zero state, as can be observed in certain examples of the disclosed technology.

FIG. 19 includes a first chart 1900 that shows the response (1910, 1920, and 1930) when the same pulse as in FIG. 15 is applied to the circuit when the junction array is in logic state "0." A second chart 1905 plots the derivatives (1911, 1921, and 1931) for the responses. No change in the state is observed after the transient behavior dissipates. This pulse will send the system in this example into state "0" from either state. This suggests that the pulse applied to the third junction can be used as a write "0" operation.

Figure 20:
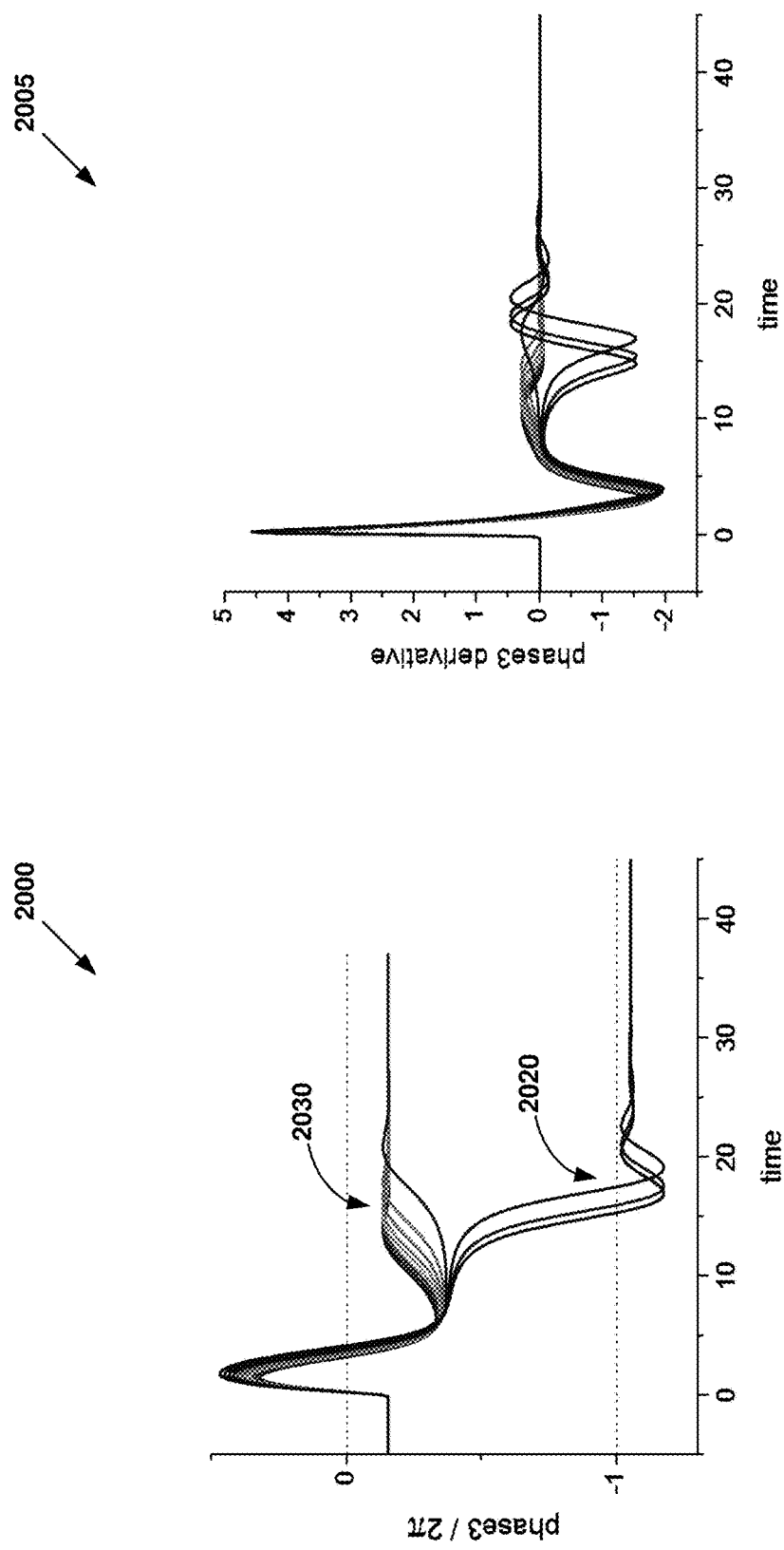
FIG. 20 includes two charts illustrating stability of a memory circuit in the logic zero state having different electrical parameters, as can be observed in certain examples of the disclosed technology.
Figure 21:
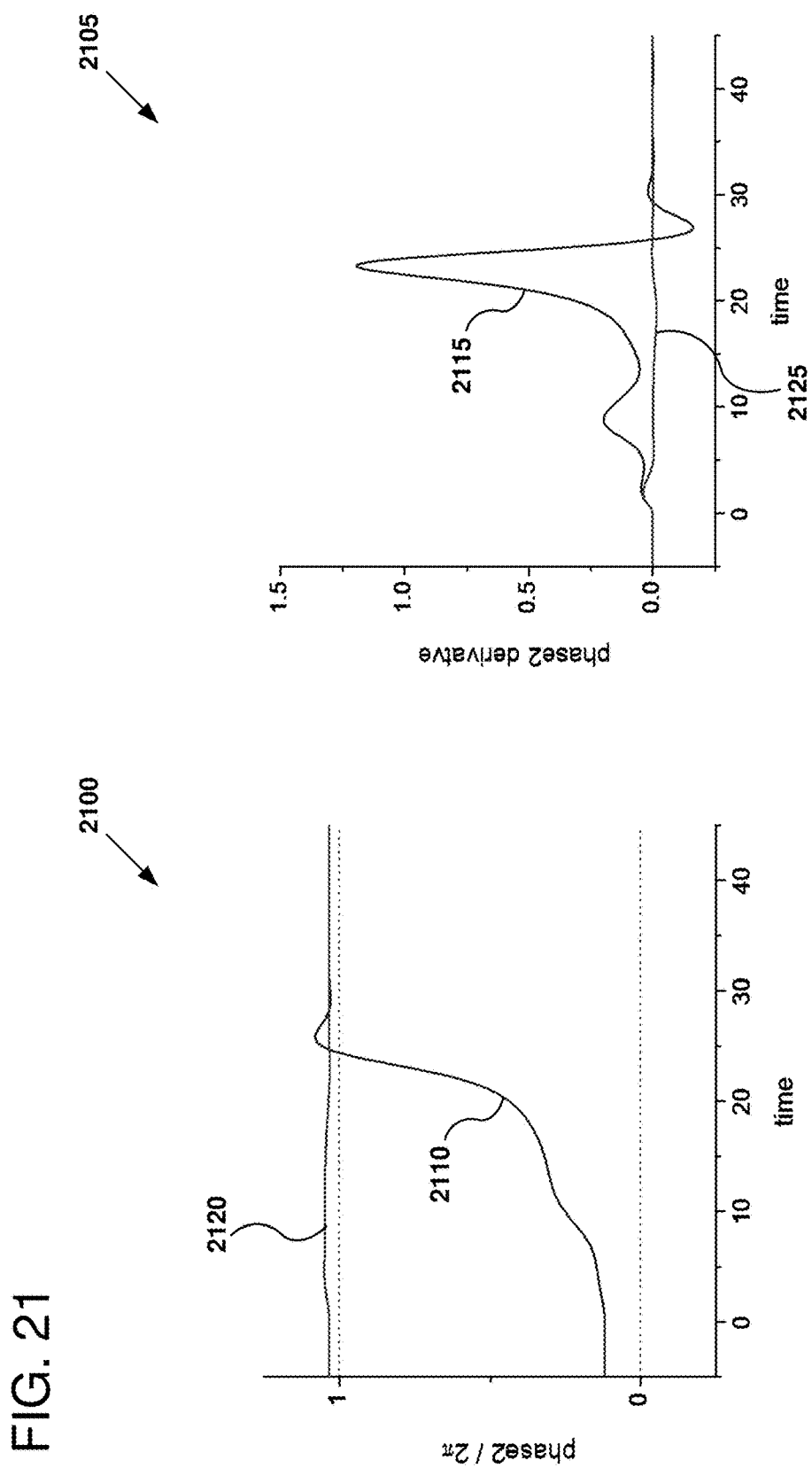
FIG. 21 includes a pair of charts illustrating stability of a memory circuit responding to different electrical pulses, as can be observed in certain examples of the disclosed technology.

Since the third junction's forcing term is in the opposite direction to the first junction's forcing term, the potential energy profile as a function of only the third junction has a different sign of its slope. FIG. 20 show the responses of the system in state "0" to a set of pulses applied to the third junction whose amplitudes $i_{pulse,3}$ range from 4.5 to 5.5. As illustrated by FIG. 20, if a pulse is too strong, it would provide too much kinetic energy to the third junction and the system would transition over the potential barrier in the opposite direction (e.g., responses 2020). The other pulses show the response resulting in the logic state $\{n_1, n_2, n_3\}=\{0, 0, 0\}$. This third junction phase would settle into a steady state that is different from the other junction phases by approximately a multiple of $2\pi$. This corresponds to the logic state $\{n_1, n_2, n_3\}=\{0, 0, -1\}=\{1, 1, 0\}$.

C. Gaussian Pulse Read Operation

In order to read the memory state, one can use a pulse that can be applied to one of the junctions. A condition of a successful Read operation is that application of a Read pulse results in different outputs for the circuit dependent on whether the circuit initially was at the "0" or "1" memory state. In some examples, same pulse that is used for the Write "1" operation, applied to the first junction 115, can serve as a Read command. The Read data will be taken from an output pulse generated in response to write "1" operation produced by the second junction 116. When the initial state of the circuit is "1," there will be almost no response of the second junction phase to the applied pulse. Conversely, when the initial state of the memory circuit is "0," the pulse causes a $2\pi$ shift of the second junction phase. Consequently, the second junction will output a corresponding voltage spike. Thus, the second junction response depends on the initial state of the circuit. However, after the Read command is performed the circuit state will always be in state "1." FIG. 21 includes a first chart 2100 of the responses of the second junction to the pulse sent to the first junction (which are substantially the same as a Write "1" operation, discussed above and plotted in FIGS. 10 and 11). Both the response 2110 from logic state 0 and the response 2120 from logic state 1 are plotted. A second chart 2105 plots the derivatives (2115, 2125) of these responses, respectively.

A read operation can also be implemented by sending a pulse to the third junction 117 and subsequently reading the response from that same junction. Sending a pulse to the third junction will also always set the circuit to the "0" logic state as in the previous example for write "0" operations.

Thus, in the illustrated example, performing a read operation by applying a pulse destroys the state information in the junction. In other examples, the memory cell can be configured to provide non-destructive read operation. In other examples, a memory cell may be destructively read, but act as a non-destructive read by applying a subsequent write of the value read back into the memory cell.

D. Memory Operation by Square Pulses

Memory operation can also be implemented by applying square pulses. In this section memory operation are disclosed with pulses of much smaller amplitude but much longer duration than those used in the previous section. Indeed, decreasing pulse amplitude and conserving the energy of the pulse is possible in certain examples by increasing the duration of the pulse. By applying sufficient current that exceeds the critical current, the system will no longer be stable and will transition to another state. The Write and Read commands will be applied to the same junctions as described above regarding FIGS. 1-3. The applied pulses are of different shape and strength. Instead of using currents as described in Equation (5), the currents applied to the junctions will be described by Equation (12). The initial time of application, $t_k$, in the described example will be at time zero.

$$i_k(\tau) = i_{DC,k} + i_{pulse,k} \cdot \begin{Bmatrix} 1 & \text{when } t_k < \tau < \sigma_k \\ 0 & \text{otherwise} \end{Bmatrix} \quad (12)$$

E. Square Pulse Write "1" Operation

Figure 22:
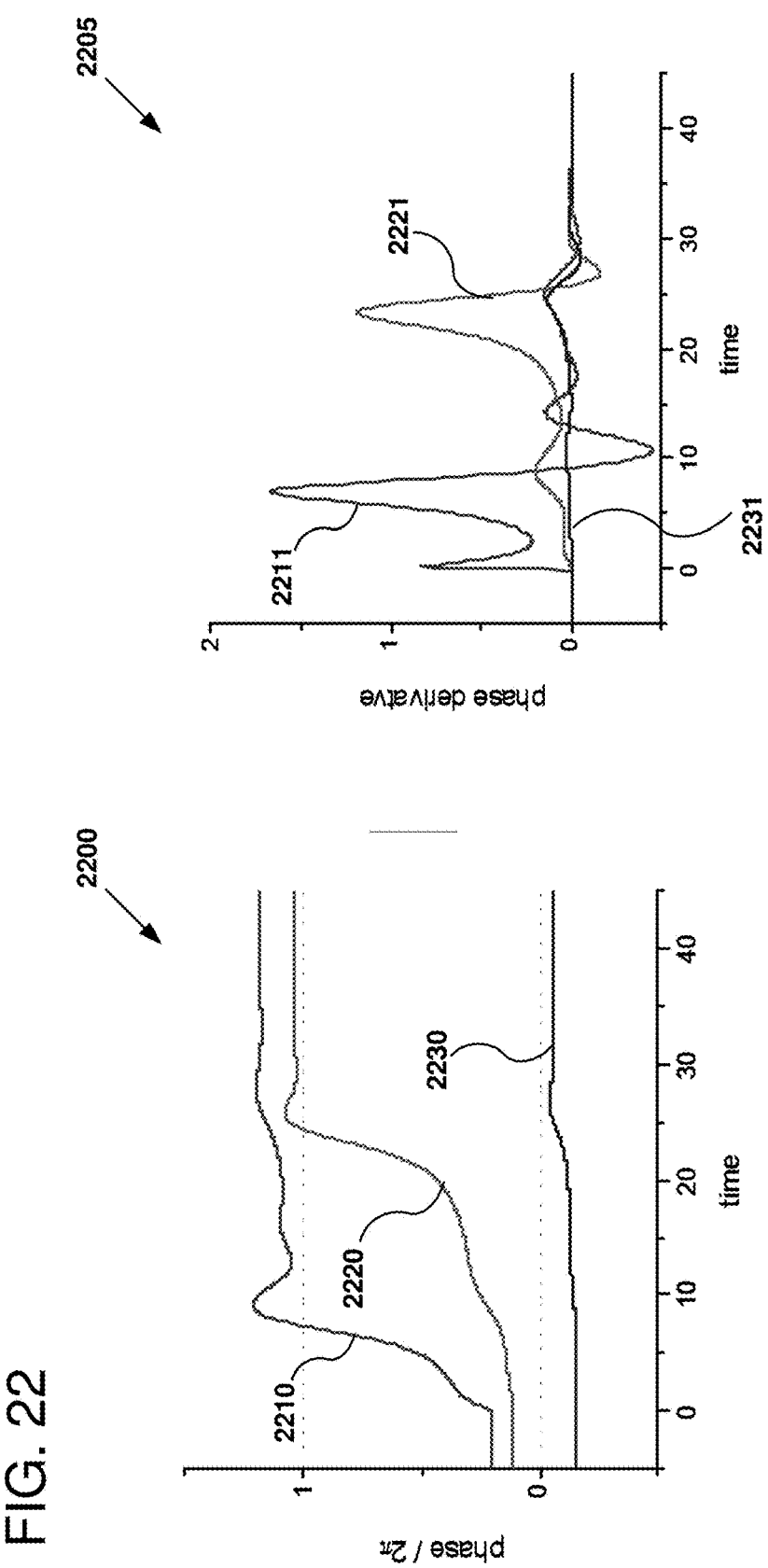
FIG. 22 is a set of charts illustrating changes in a set of phases for a plurality of junctions during a write operation, as can be observed in certain examples of the disclosed technology.

The curves plotted in FIG. 22 show the system response to the square pulse of size $i_{pulse,1}=0.0115$ being applied to the first junction after the system has settled to its "0" state. All of the pulses described in this section have a pulse width $\sigma_1=20.0$ and start at the time zero. A first chart 2200 shows the response (2210, 2220, and 2230) for the three junctions (115, 116, and 117, respectively) as a function of time, while a second chart 2205 shows the derivative (2211, 2221, and 2231) of the phase response for the same period of time.

As shown in FIG. 22, the phase of the first junction 115 rises quickly to the next local minimum, followed by the phase of the second junction 116. The phase of the third junction 117 slightly shifts its equilibrium position but stays in the same potential well. The period of the full transition from states "0" to "1" is on the order of 20 units of time, which is the equivalent of 80 ps. After the excitation the phase of the first junction begins to slow down near the plateau about $\{n_1, n_2, n_3\}=\{1, 0, 0\}$, but since no local minimum exists here, it then begins a second transition to state "1" at $\{n_1, n_2, n_3\}=\{1, 1, 0\}$.

Figure 23:
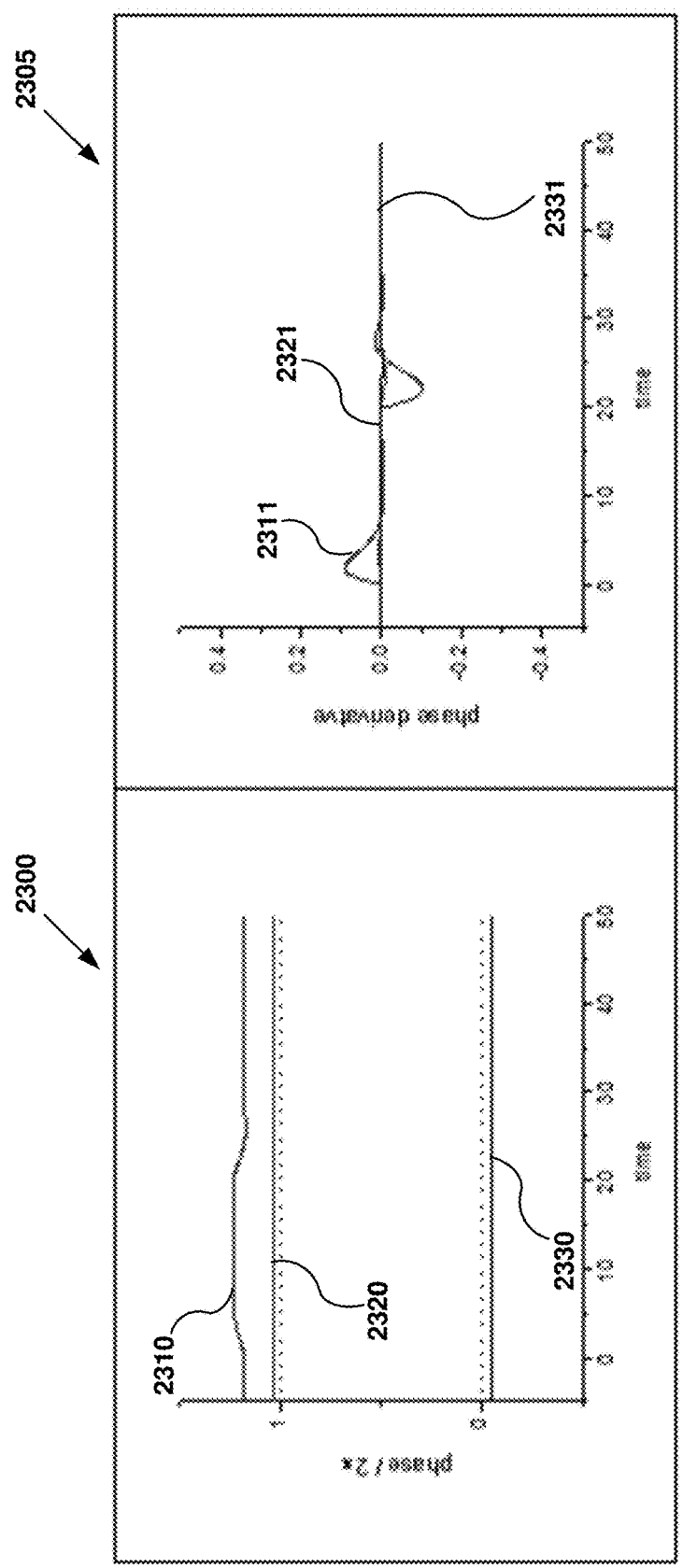
FIG. 23 includes a set of charts illustrating stability of a set of phases when a subsequent write operation is performed to a memory circuit, as can be observed in certain examples of the disclosed technology.
Figure 24:
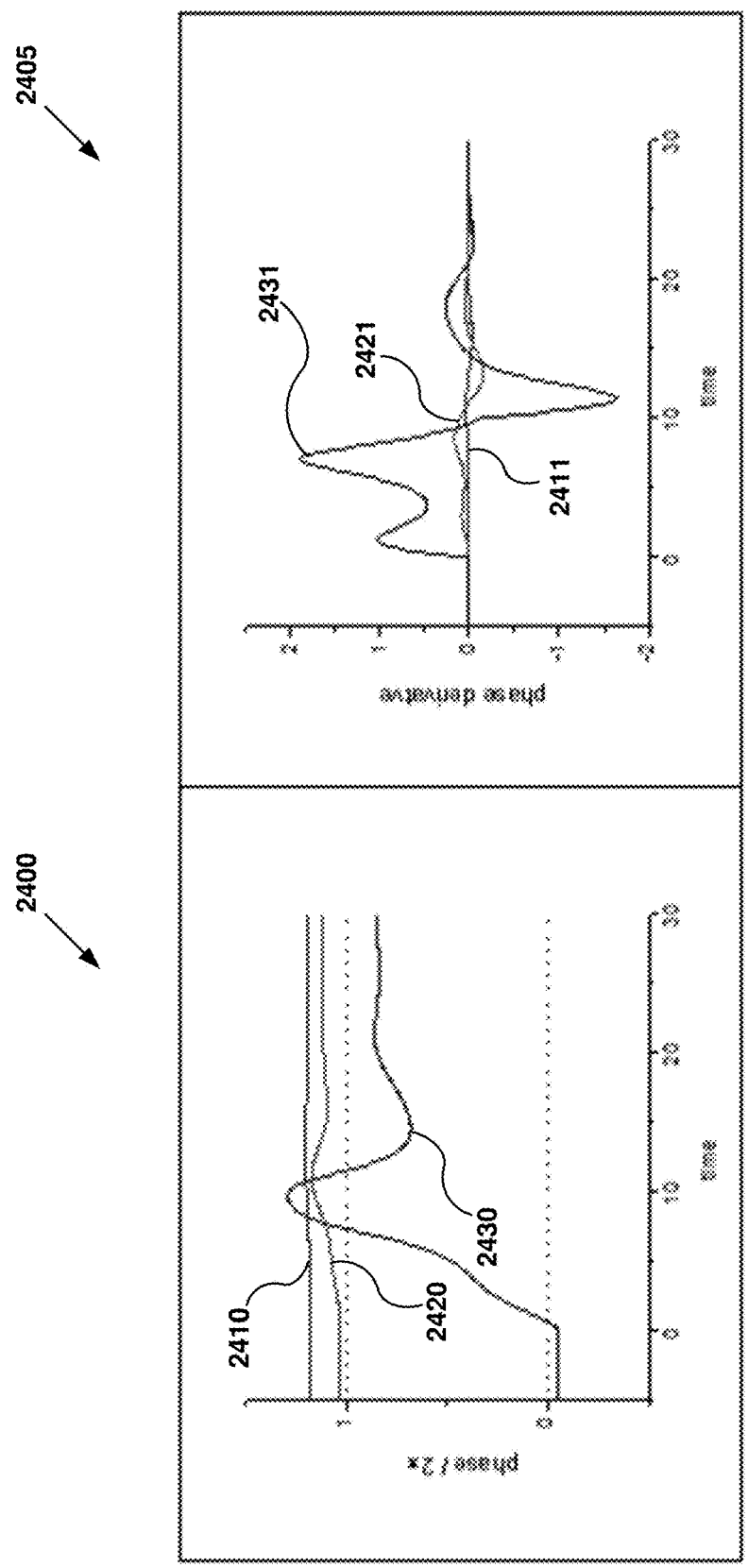
FIG. 24 includes a set of charts illustrating a write zero operation, as can be observed in certain examples of the disclosed technology.

The curves plotted in FIG. 23 show the time series of the phase of the first junction in response to the same pulse (as in FIG. 16) applied to the first junction when the system is already in state "1." A first chart 2300 shows the response (2310, 2320, and 2330) for the three junctions (115, 116, and 117, respectively) as a function of time, while a second chart 2305 shows the derivative (2311, 2321, and 2331) of the phase response for the same period of time. As shown, no change to the phase differences occurs after the transient dynamics dissipate. The system remains in state "1." Therefore, such a pulse can be interpreted as a Write "1" operator since the final state will always be "1."

F. Square Pulse Write "0" Operation

In the same manner as the Gaussian pulse, the memory cell's Write "0" or Reset operation can be implemented by sending a pulse to the third junction 117. The transition from state "1" back to "0" is demonstrated in FIG. 24 where the pulse applied to the third junction has an amplitude of $i_{pulse,3}=1.65$ and a pulse width $\sigma_1=10$. The first chart 2400 shows the response (2410, 2420, and 2430) for the three junctions (115, 116, and 117, respectively) as a function of time, while the second chart 2405 shows the derivative (2411, 2421, and 2431) of the phase response for the same period of time.

As in the Gaussian pulse example above, after the third junction phase moves one potential well, all the phases are within the same potential well (the phases are the same multiple of $2\pi$). The new steady state phases in the set are exactly $2\pi$ larger than those realized after starting from zero initial conditions. The new state is $\{n_1, n_2, n_3\} = \{1, 1, 1\}$, which is equivalent to state $\{0, 0, 0\}$. The transformation occurs over a similar period that was calculated according to the approximation in Equation (9).

Figure 25:
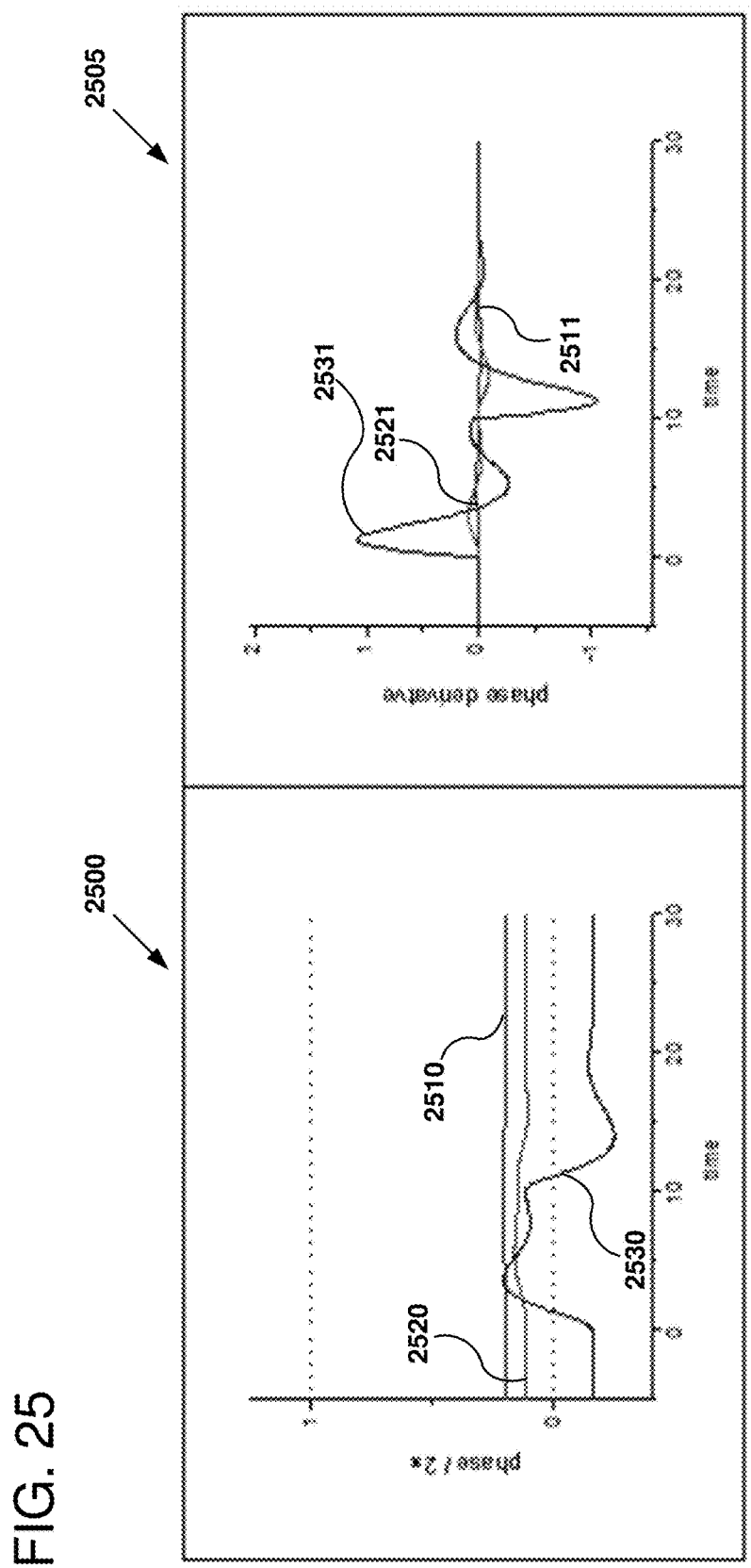
FIG. 25 is a set of charts illustrating a response when an identical pulse is applied to a junction when it is in a logic zero state, as can be observed in certain examples of the disclosed technology.

FIG. 25 shows the response to the same pulse applied to the third junction when the junction array state is "0." The first chart 2500 shows the response (2510, 2520, and 2530) for the three junctions (115, 116, and 117, respectively) as a function of time, while the second chart 2505 shows the derivative (2511, 2521, and 2531) of the phase response for the same period of time. No change in the state is observed after the transient dissipates. This pulse will send the system into state "0" from either state. This suggests that the pulse applied to the third junction can be used as a Write "0" operation.

G. Square Pulse Read Operation

Figure 26:
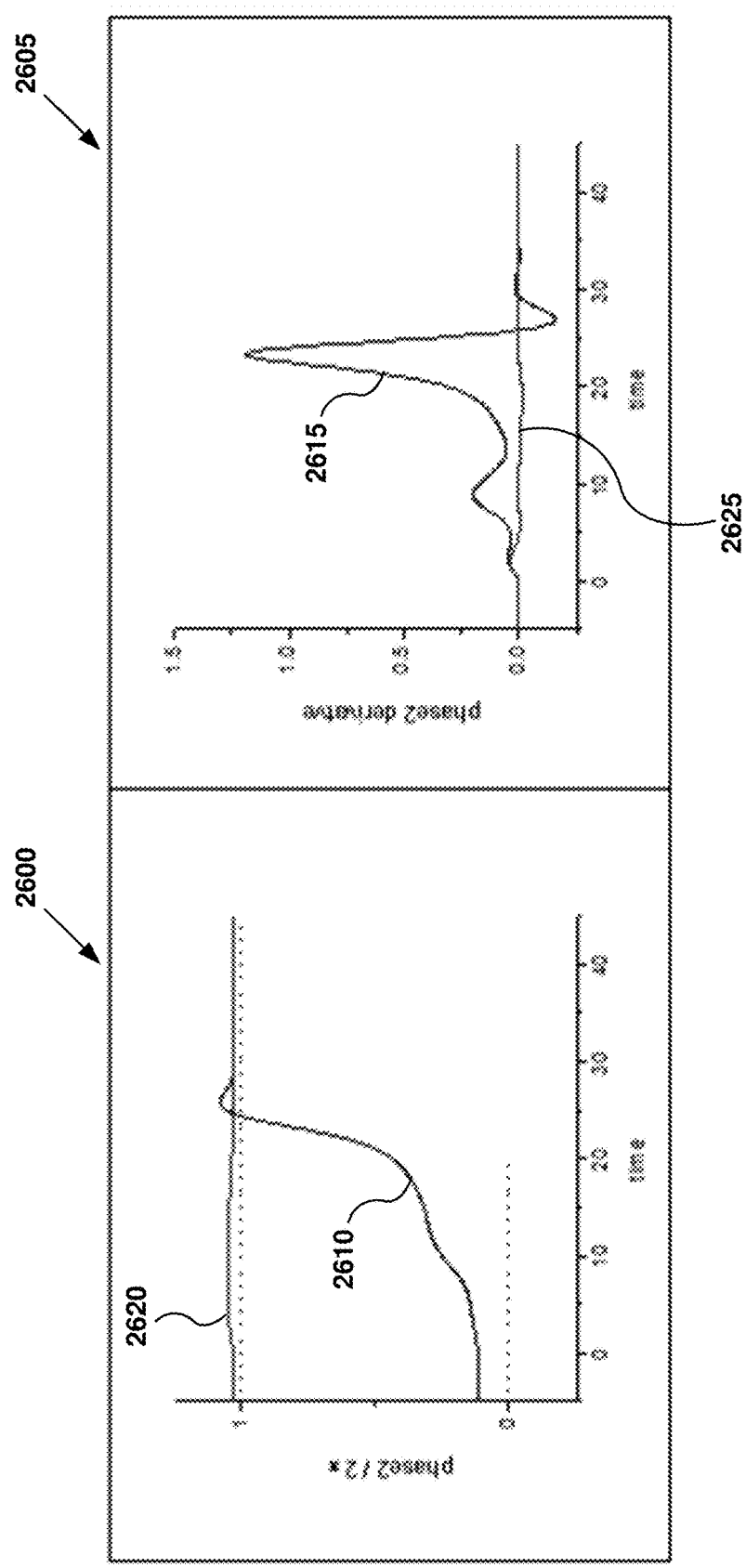
FIG. 26 illustrates respond of the junction to a write one operation, as can be observed in certain examples of the disclosed technology.

FIG. 26 shows response of the second junction to the pulse from the Write "1" operation when the initial state is "0" or "1." A first chart 2600 plots both the response 2610 from logic state 0 and the response 2620 from logic state 1. A second chart 2605 plots the derivatives (2615, 2625) of these responses, respectively.

The pulse amplitude is 0.0115 and pulse width is 20.0. When circuit is in the "0" state, second junction will make a $2\pi$ shift to the next potential well, while if the circuit is in the "1" state, second junction will stay in the initial potential well. Analogous to the Gaussian pulse examples, the responses are very similar and thus both Gaussian and square pulses are suitable for disclosed memory operations.

Consequently, there exist a variety of choices for Write, Read, and Reset operations for a given array, including Gaussian, square, or other shape pulses. The specific choice will depend on arrays parameters (coupling strengths and junction RSJ parameters). Indeed, for a given set of parameters there exist a rather broad range of pulse parameters to implement each memory operation and employing small arrays may provide substantial benefits into designing memory operations. As one can verify, a specific junction response (in this specific case, second junction response) to an external pulse sent to a first or third junctions strongly depends on the memory state of the array and therefore a substantially similar pulse can be used for reading memory. In-between memory readings, the memory cell array is in a zero voltage state and thus power dissipation will be minimal. As will be readily understood to one of ordinary skill in the art having the benefit of the present disclosure, in order to implement memory operations similar to those described above different circuit designs, different array coupling configurations, and different boundary conditions can be selected to produce suitable circuits and methods of operation for such circuits.

V. Memory Circuit Design and Robustness

It is often desirable that memory cells based on coupled Josephson junction as described herein be robust to small changes in parameter values. This section will demonstrate that disclosed memory circuits are robust to small changes in DC current parameters. Numerical simulations are performed to demonstrate that disclosed memory operations (including Write, Read, and Reset) can be performed fast and consume little energy. A simulated annealing optimization scheme can be applied to the memory circuit design to find optimal parameter values that reduce memory access times and access energies. It is observed that the optimization scheme is more computationally effective when the external applied pulse takes the form of a Gaussian pulse, rather than an SFQ pulse.

Figure 27:
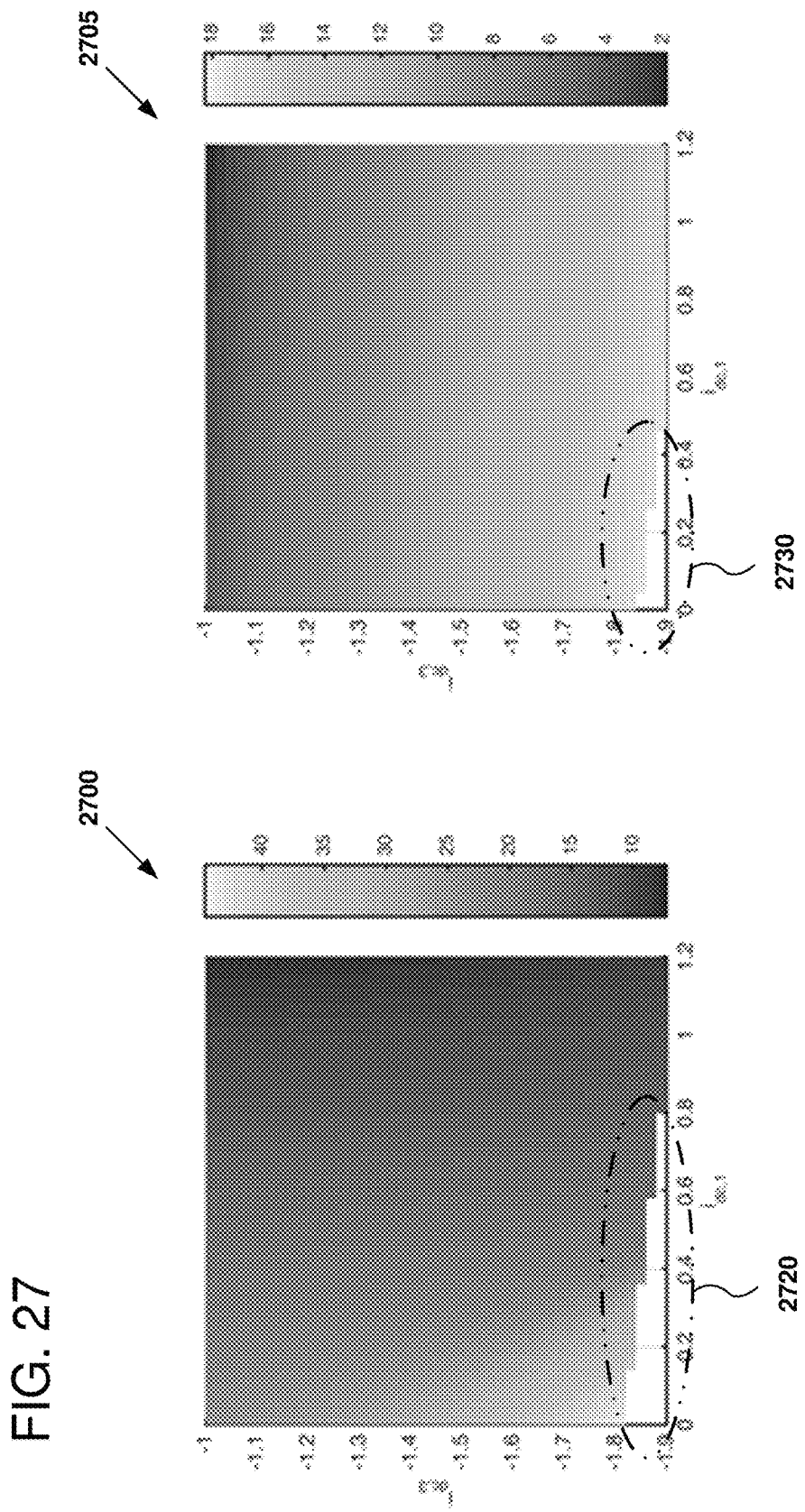
FIG. 27 is a set of charts illustrating minimal pulse amplitude required for memory operations for an example circuit according to an example of the disclosed technology.

The minimal pulse amplitude required for memory operations for an example circuit to occur as a function of the direct current strength for junctions $J_1$ and $J_3$ is calculated. The minimal pulse amplitude required to implement a Write "1" operation from state $\{0, 0, 0\}$ to state $\{1, 1, 0\}$ is presented in the first chart 2700 of FIG. 27. The minimal pulse amplitude to implement a Write "0" operation from state $\{1, 1, 0\}$ to state $\{1, 1, 1\}$ is presented in the second chart 2705 of FIG. 27. The unshaded areas (indicated by the dashed regions 2720 and 2730) indicate parameter values for which no switching occurs. Thus, FIG. 27 indicates that a broad range of direct current values can be successfully used and also suggests that the same pulse parameters (pulse amplitude and pulse width) can be used for all memory operations.

In this section, the effects of memory operation using Gaussian and SFQ pulses are compared. While some differences in access times and access energies may be observed, the logic operations performed are not generally affected by the type of the pulse used. Gaussian pulses take the form $$i_{Gauss}(t) = \frac{i_{Amp}}{\sqrt{2\pi\sigma^2}} \exp\left(-\frac{(\tau - \tau_0)^2}{2\sigma^2}\right).$$

Figure 28:
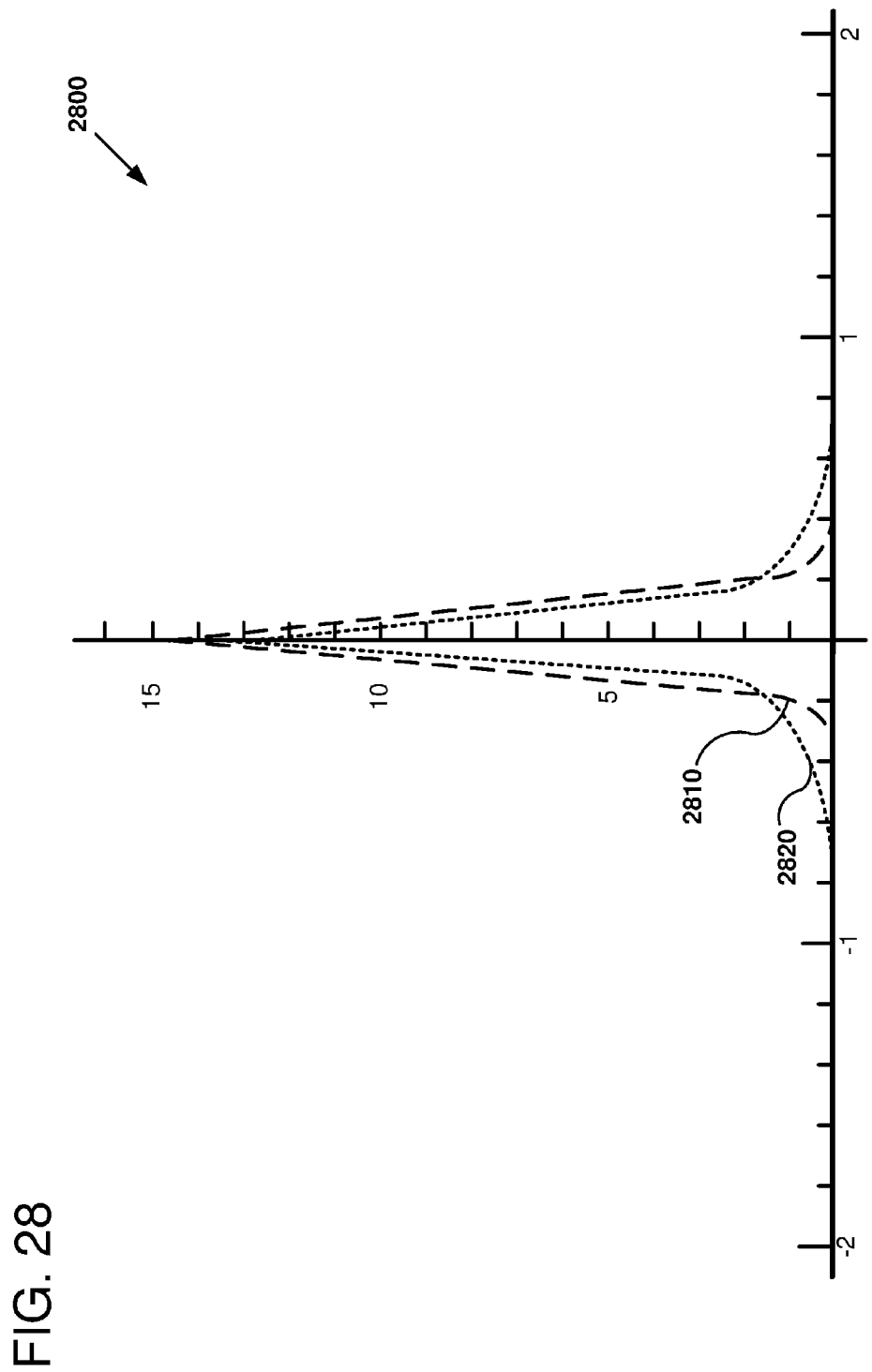
FIG. 28 is a chart illustrating response of the system to two different types of electrical pulses, as can be observed in certain examples of the disclosed technology.

FIG. 28 is a chart 2800 demonstrating that the two pulse types have similar characteristics (amplitudes and widths) when parameterized appropriately we show in FIG. 28 the two pulse types plotted together. The parameters $\sigma=0.1$ and $i_{amp}=4$ are used for simulating the Gaussian pulse 2810, and A=16 for the SFQ pulse 2820 amplitude.

Figure 29:
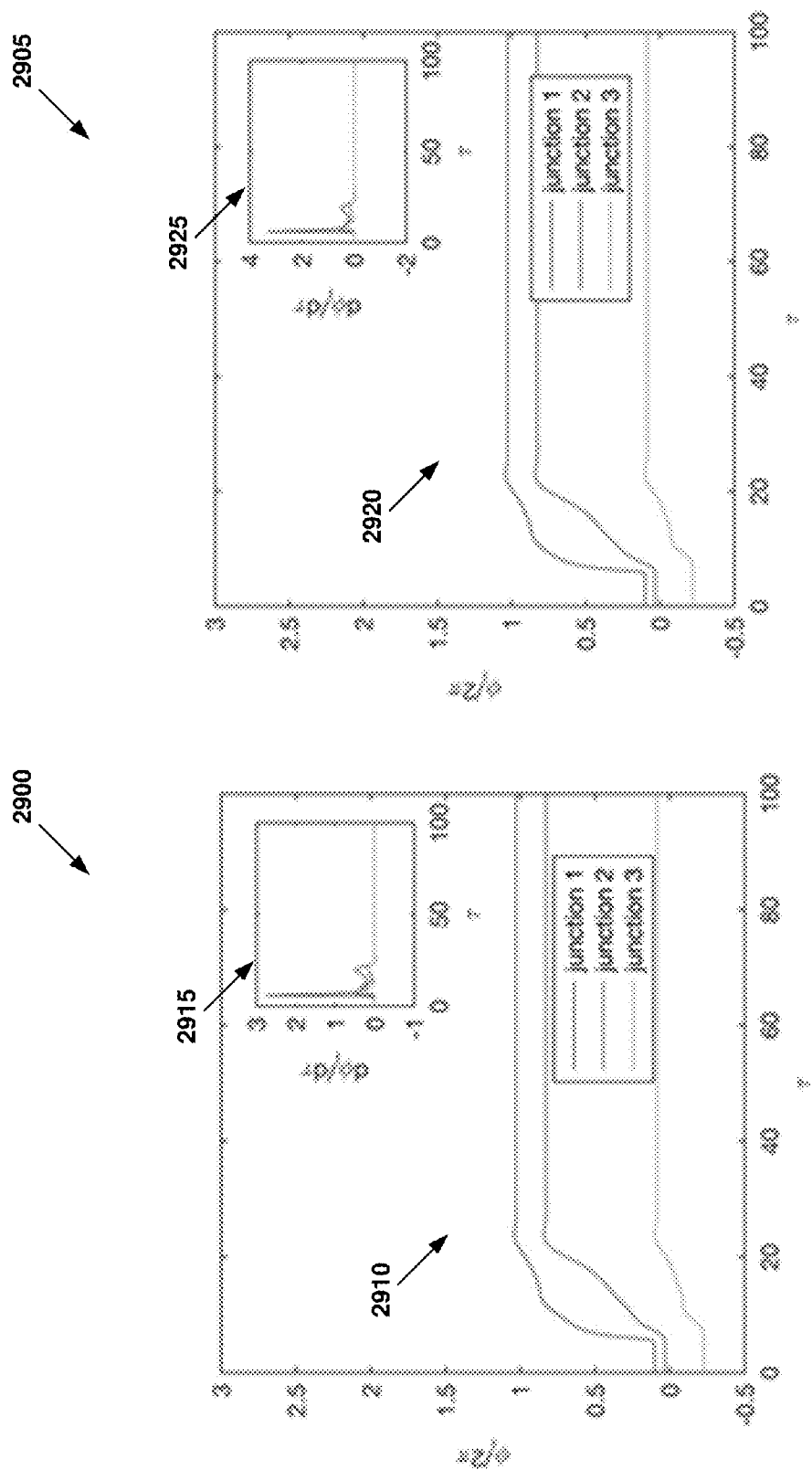
FIG. 29 includes two charts illustrating response of a memory cell to Gaussian and SFQ pulses, as can be observed in certain examples of the disclosed technology.

To illustrate that the system responds similarly to both Gaussian and SFQ pulses, in FIG. 29 we show two charts 2900 and 2905 for an example of junction array switching responses to Gaussian and SFQ pulses according to an example of the disclosed technology. The first chart 2900 illustrates the phase 2910 and phase derivative (inset 2915) responses of each of the three junctions (115, 116, and 117) in the Josephson junction array to an SFQ pulse applied to the most left junction J1 115. The second chart 2905 illustrates the phase 2920 and phase derivative (inset 2925) responses of the Josephson junction array to a Gaussian pulse applied to the most left junction J1 115. Pulse parameters are the same as the pulses plotted in FIG. 28. In both cases initial and final logical states of the array are '0' and '1', respectively. Thus, it is demonstrated that application of similar pulses (e.g., Gaussian and SFQ) results in very similar responses of the array. Such behavior is also typical for many other parameter values.

Thus, the disclosed Josephson junction circuit can use the existence of distinct and well-defined voltage states which correspond to "0" and "1" memory states that are accessible from an applied trigger pulse. To write a "1," an applied Gaussian pulse must have sufficient strength to transition the array from state "0" to state "1." However, this pulse must not be so strong to affect an array which is already in state "1."

VI. Example Apparatus for Operating Coupled Josephson Junction Memory Cells

Figure 30:
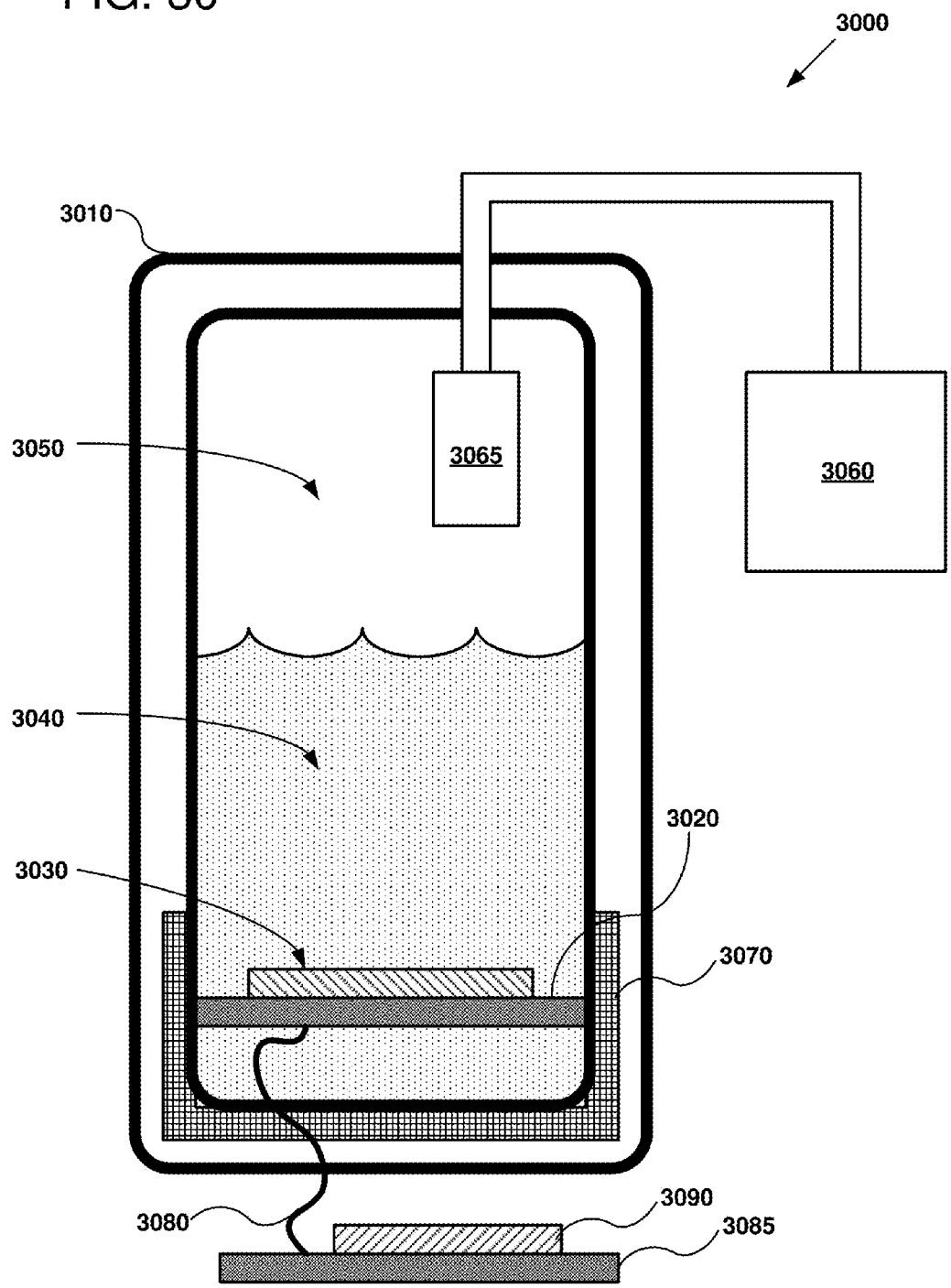
FIG. 30 is a diagram of a cryogenic apparatus for implementing certain examples of the disclosed technology.

FIG. 30 is a system diagram 3000 of an apparatus that can be used to cool an integrated circuit comprising a memory cell including coupled Josephson Junctions, as can be implemented in certain examples of the disclosed technology. For example, the memory circuit discussed above regarding FIGS. 1-3 can be cooled using the illustrated apparatus such that the Josephson junctions operate in a superconducting state.

In the illustrated example, a vessel 3010 is double-walled so as to create a vacuum between the inner and outer walls of the vessel. A substrate 3020, which can be manufactured from suitable materials for operating at the temperature of the cryogenic liquid employed is mounted within the vessel 3010. Affixed to a surface of the substrate 3020 are one or more integrated circuits comprising circuitry including Josephson junctions. For example, one or more memory cells comprising coupled Josephson junctions can be deposited on the integrated circuit. The substrate 3020 and the integrated circuit 3030 are immersed in coolant 3040 (e.g., liquid helium) contained within the vessel 3010. As the liquid helium exceeds the boiling point, the liquid boils forming a portion of helium gas 3050 within the vessel 3010. A refrigeration unit 3060 is coupled to a re-condenser head 3065, which is situated inside the vessel. As helium changes phase to a gaseous state, it is received by the refrigeration unit 3060, compressed and cooled, and returned to the vessel as liquid helium via the re-condenser head 3065.

In many applications it is desirable that the integrated circuit 3030 be at least partially surrounded by magnetic shielding 3070 which can be manufactured from a suitable metallic material. A number of flexible interconnects 3080 are connected to the substrate 3020 and routed out of the vessel to another substrate 3085 which includes electrical connections to an integrated circuit 3090 attached to a surface of the substrate. Thus, superconducting circuits operating on the immersed integrated circuit 3030 are in electrical communication with components disposed on the integrated circuit 3090, which components operate at substantially room temperature.

As will be readily apparent to one of ordinary skill in the art having the benefit of the present disclosure, the materials and construction of the apparatus described in FIG. 30 can be adapted depending on a particular application. For example, if the Josephson junctions are implemented using different semiconducting materials, the choice of coolant 3040 used in the vessel can change. For example, if Josephson junctions developed using semiconductors that operate within the temperature of liquid nitrogen are used, the apparatus can be adapted to use such coolant.

VII. Selection of Memory Cell Design and Operational Characteristics

Design of disclosed memory cells and methods of operating such memory cells can be improved through a number of different optimization techniques. In this section, a stochastic optimization technique, simulated annealing (SA) is described for selecting attributes and parameters of disclosed memory cells and methods of operating the same. An iterative improvement algorithm is disclosed by combining a coupled junction simulation module with simulated annealing, which is a globally convergent optimization technique. SA attempts to minimize a function in a manner similar to the annealing process to find the global minima of a pre-defined "cost" or objective function. The algorithm can be used to search for global minima or maxima of the objective function. SA explores the objective function's entire surface by performing random walks in M parameter space, where M represents the number of optimization variables. A rough view of the parameter space is first obtained by moving with large step lengths, where the step lengths in each of the M directions are controlled by a parameter T called temperature (as it is analogous to temperature in a physical annealing process). The step length and temperature are coupled so that as T falls, the step-size decreases. As the algorithm progresses and T falls, the more promising areas within the parameter space are identified. SA attempts to optimize the function while moving both uphill and downhill in order to escape local minima Decisions on uphill movement also contain a random component. SA may exhibit additional advantages when used for the optimization of Josephson junction parameters. Unlike many iterative optimization schemes (e.g., Newton or steepest-descent schemes), SA can produce accurate results even for poor choices of initial conditions. Moreover, SA makes no assumption that a cost function is continuous. Finally, SA can be used on cost functions of arbitrary numbers of variables.

In some examples of applying simulated annealing to memory cell optimization, the M variables that define the parameter space are junction input parameters, such as pulse amplitude, pulse width, and external currents. Other suitable parameters include Josephson junction width, length, area, materials, as well as parameters of other components in the memory cell (e.g., inductance value of coupling inductors) or parameters of coupled pulse trigger generation and reading circuitry (e.g., parameters describing pulse shape, amplitude, duration, slope, etc.). A parameter vector $\overline{X}_M = [X_1, \ldots X_M]^T$ is defined whose entries correspond to the junction input parameters to be improved or optimized. An objective function is formulated describing a desired performance of the memory circuit. The objective function $O(\overline{X}_M)$ is defined in terms of performance variables such as access time and access energy. Below, we will denote switching energy of the $j^{th}$ junction by $E_j$ and access time of the $j^{th}$ junction by $T_j$. These performance variables depend on the junction input parameter vector $\overline{X}_M$. SA is employed to find in parameter space a global minima of the objective function thus defined, and determines the physical parameter vector $\overline{X}_M^{OPT}$ which produces a system as close as possible to the ideal.

In the context of optimizing circuit parameters which minimize memory access time and energy usage, we let $O(\overline{X}_M)$ be access time or energy as defined below. The parameter vector $\overline{X}_M$ is composed of parameters such as external DC pulse value or external AC pulse amplitude and width. It should be noted that the value of each cost function depends on the solution to Equation (4), which in turn depends on the values of $\overline{X}_M$. As such, we couple the SA algorithm with a numerical solution of Equation (4) computed using an adaptive Runge-Kutta scheme.

One of the criteria for the parameter optimization process is to choose parameter sets in such a way that the pulse is similar in amplitude to a single flux quantum (SFQ) pulse generated by the pulse trigger, avoiding the need for SFQ pulse amplification. As will be readily understood to one of ordinary skill in the art having the benefit of the present disclosure, SA algorithm allows one to include such constraints. Moreover, when optimization parameters do not yield solutions to Equation (4) which are appropriate (e.g., the solution does not result in the correct memory operation) we penalize the cost function and define $O(\overline{X}_M)$ to be 2-3 orders of magnitude larger than a typical value of $O(\overline{X}_M)$.

There are a number of reasons why we use SA rather than other optimization schemes. At a fixed temperature, SA performs random walks through the parameter search space, accepting both uphill and downhill moves with a predetermined probability. By accepting both uphill and downhill moves, SA avoids many local minima, though at an increased computational cost. Along with avoiding local minima, SA can exhibit other advantages which suggest its use for the optimization of Josephson junction parameters. First, unlike many iterative optimization schemes (e.g., Newton or steepest-descent schemes), SA can produce accurate results even for bad choices of initial conditions. Moreover, SA makes no assumption that a cost function is continuous. This property is important because our cost functions are discontinuous as explained below. Finally, SA can be used on cost functions of arbitrary numbers of variables. As we will see, SA effectively approximates global minima for the cost functions introduced in the previous section.

VIII. Simulated Annealing Experimental Results

We employed SA procedure for external pulse and external current parameters to numerically calculate access times and access energies. Comprehensive results for optimization procedure will be reported in a different the manuscript and in this manuscript we only provide a very brief summary of the results. The pulse and external current parameter variation is kept in such a way that variations in these parameters would not affect the existence of two pre-designed memory states ([0, 0, 0], [1, 1, 0]) and would allow transitions between these states to implement valid Read, Write, and Reset operations. Such a requirement, for obvious reason, has limited the values of the parameters that can be employed. As we iterated pulse parameters in acceptable limits to stay within the prescribed/preselected states we observed that the fluctuations in access times and access energies can vary (perhaps by the factor of 1.5-2, or more). An example of the minimal pulse amplitudes to implement transitions from "0" state to "1" and from "1" state to "0" (and consequently, valid Write, Read, and Reset operations) as functions of the DC current amplitudes of the junctions J1 115 and JF 117 is demonstrated in the FIG. 27. Note that in the FIG. 27 we are showing results for larger value of the coupling constant, namely, κ=0.5, while for other figures in this application, the value of κ=0.1. The reason for that is that our calculation of the access time (and consequently access energies) utilizes an approximation of separable dynamics that is accurate in the limit of the weak coupling. However, we would also like to show that the proposed logics can be applicable for much larger value of the coupling constant (thus substantially reducing the size of the memory cell).

There exists some parameter range for which access times and access energies vary very modestly and for some other parameter range memory operations may be very sensitive to pulse and external current parameter values (since parameter fluctuations will alter Josephson junction array memory states and consequently will affect memory operation). We show that it is indeed possible to set pulse and external current parameter values amenable for non-faulty and robust memory operation. For those parameter values the access times are in the range of 30-100 ps (for Read, Write, and Reset operations) and access energies are in the range of $5 \times 10^{-18}$-$10^{-19}$ J (0.1-5.0 aJ).

The disclosed technology can be scaled to large memory cell arrays. The stability diagram of the three-junction array (see FIG. 5) exhibits multistability, consequently one can design four- or even eight-bit operation for each memory cell. The disclosed memory cell designs are substantially less complicated and consumes less area than other examples where Read and Write operations are implemented on separate circuits, thus peripheral circuits such as sense and current driver circuits could be also less complex, lower size, and expected to consume lower operational energy.

Figure 31:
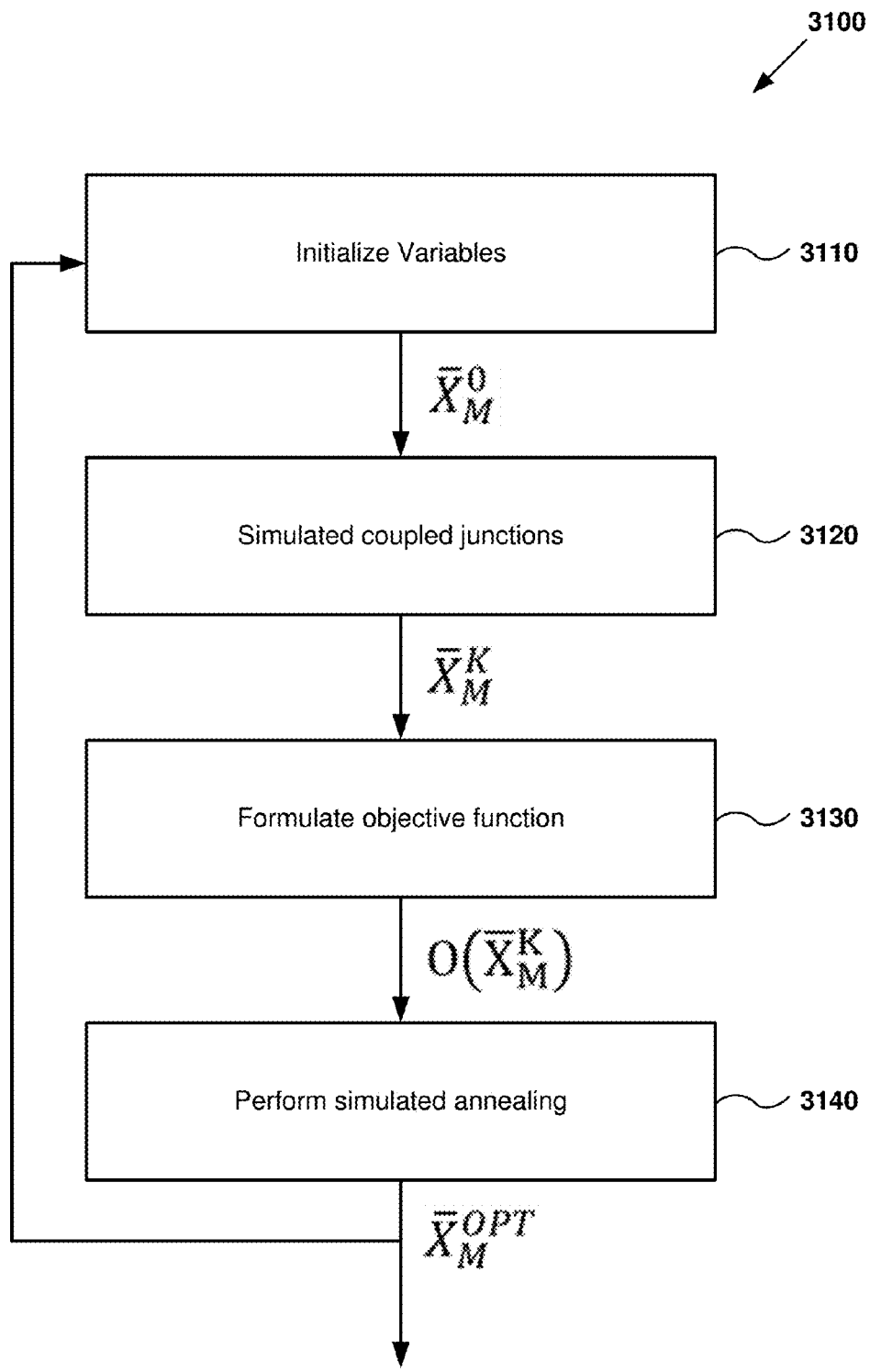
FIG. 31 is a flowchart outlining an example method of selecting electrical parameters for a memory circuit configured according to the disclosed technology.

A flow chart 3100 of an example of stochastic operations performed for optimizing one or more memory cells according to the disclosed technology is presented in FIG. 31.

At process block 3110, variables are initialized. An informed guess of the physical parameters serves as the initial choice of vector $\overline{X}_M^0$ which initializes the performance parameters by executing the coupled junction simulation module.

At process block 3120, a number of simulations of coupled Josephson junctions operating according to the parameters produced at process block 3110 are performed. Attributes such as stability, amplitude, transition time, energy consumed, or other such attributes are produced as a result of the simulation and can be used to evaluate the objection function at process block 3130.

At process block 3130, a number of iterations of SA are performed to randomly produce new parameter vectors $\overline{X}_M^K$, where K is the iteration index. Upper and lower bounds on the values of each element of $\overline{X}_M^K$ are incorporated into the algorithm to produce physically realizable results.

At process block 3130, for each iteration, the randomly-produced $\overline{X}_M^K$ generated at process block 3120 is the input to the coupled junction simulation algorithm, which determines new performance variables used to calculate the objective function $O(\overline{X}_M^K)$. This method returns to process block 3120 and the iterative process is repeated until a predefined convergence criterion is satisfied.

The cost functions used to minimize access times and energies take into account the fact that some pulse parameters do not produce valid Write "0" or Write "1" operations. For example, when trying to simulate a Write "0" operation, there are parameters which do not produce strong enough pulse parameters to move the junction from phase {1, 1, 0} to {1, 1, 1}. In these sorts of cases, the cost function is set to be large compared to typical access times or energies (e.g., two or three orders of magnitude larger than a typical value for access times or energies). Defining the cost function in this way and giving the SA algorithm an initial condition which corresponds to a valid Write "0" or Write "1" operation allows the SA process to avoid parameter values which do not produce valid results.

IX. Example Memory Cell

Figure 32:
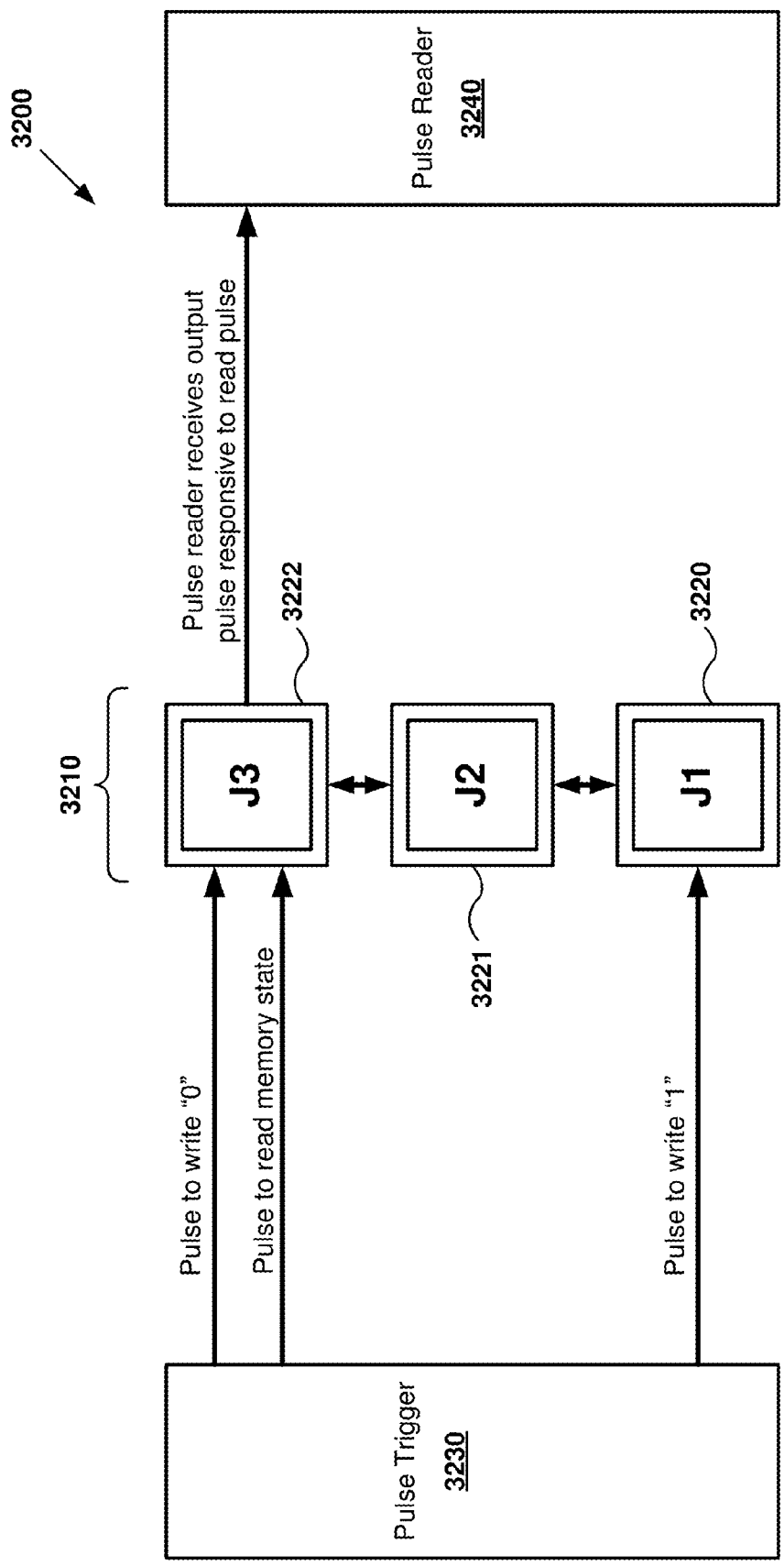
FIG. 32 is a block diagram outlining another configuration of the memory circuit, pulse triggers, and pulse readers, as can be used in certain examples of the disclosed technology.

FIG. 32 is a block diagram 3200 of an alternate configuration of the memory cell as can be used in certain examples of the disclosed technology. The diagram illustrates that other configurations of Josephson junctions and pulse triggers can be used to implement a memory circuit.

A plurality 3210 of three Josephson junctions 3220, 3221, and 3222 are illustrated. A pulse trigger circuit 3230 is configured to send write pulses to the first junction 3220 and the third junction 3222. A pulse sent to the first junction 3220 will write a logic one value while a pulse written to the third junction will write a logic zero value. A memory read pulse can be sent to the third junction 3222. The third junction 3222 in turn is coupled to a pulse reader 3240. The configurations of the pulse trigger and pulse reader can be similar to those illustrated in FIG. 1 above (for example, in electrical or magnetic coupling between junctions), but may have aspects such as pulse voltage duration, shape, or other circuit attributes including impedance value of inductors used to couple the Josephson junctions modified to be adapted to the different configuration pathology as shown.

TABLE 3

|  | Write "0" | Write "1" | Read |
|---|---|---|---|
| Original state "0" | Applied junction: $J_3$<br>End state: "0" | Applied junction: $J_1$<br>End state: "1" | Applied junction: $J_3$<br>End state: "0"<br>Read junction: $J_3$ |
| Original state "1" | Applied junction: $J_3$<br>End State: "0" | Applied junction: $J_1$<br>End state: "1" | Applied junction: $J_3$<br>End state: "0"<br>Read junction: $J_3$ |

In Table 3, the applied junction is the junction to which a pulse (e.g., a Gaussian pulse) is applied and read junction is the junction from which voltage is read to confirm operation has taken place. The original state is the initial state which the junction is in before the application of a pulse, and the end state is the final state of the junction is after the application of a pulse.

X. Example Method of Using a Memory Cell

Figure 33:
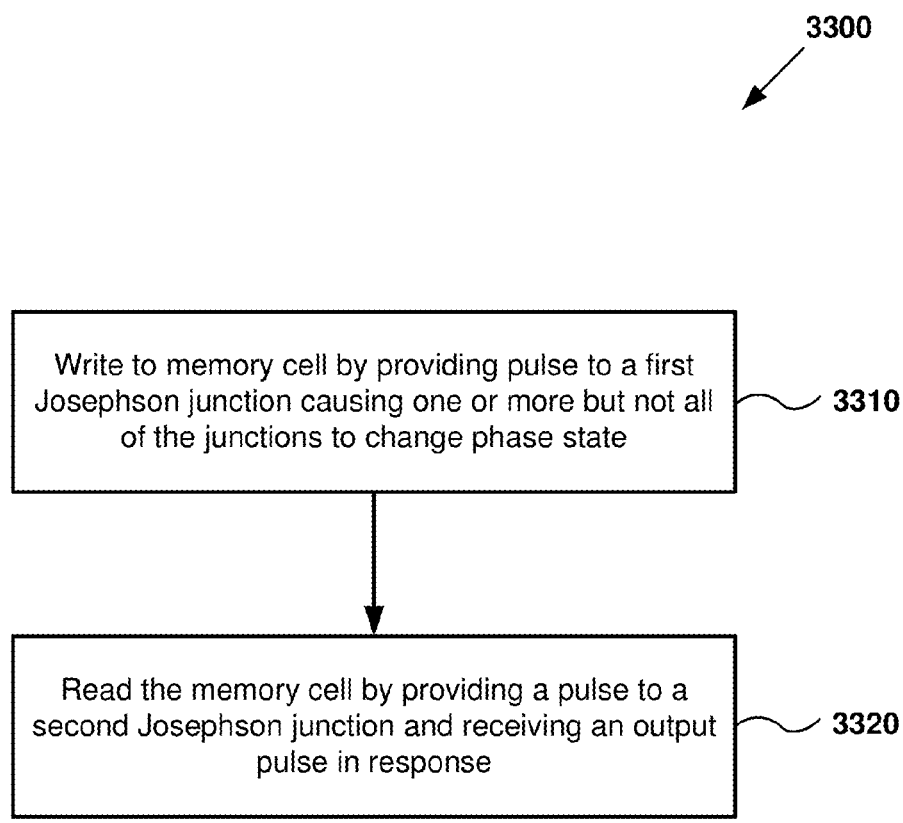
FIG. 33 is a flow chart outlining an example method of using a memory circuit comprising coupled Josephson junctions, as can be used in certain examples of the disclosed technology.

FIG. 33 is a flowchart 3300 outlining an example method of using a memory cell including a plurality of coupled Josephson junctions, as can be used in certain examples of the disclosed technology. For example, the memory cell and read/write circuitry described above regarding FIGS. 1-3, or the alternative example discussed above regarding FIG. 32 can be used to perform the outlined method.

At process block 3310, a memory cell including a plurality of electrically or magnetically coupled Josephson junctions is written to by providing an electrical pulse to a first Josephson junction of the plurality of junctions. The electrical pulse causes at least one, but not all of the plurality of Josephson junctions to change their respective phase state. Parameters of the electrical pulse, including voltage, duration, a shape, slope, or other suitable parameters can be selected such that the electrical pulse does not cause all of the junctions to change their respective phase state. For example, if the junctions are in a set of phase states {0, 0, 0}, application of the electrical pulse to the circuit described above regarding FIGS. 1-3 causes the set of phase states to change to state {1, 1, 0}.

At process block 3320, the memory cell is read by providing an electrical pulse to one of the plurality of Josephson junctions. In response, an output electrical pulse is received from a different Josephson junction of the memory cell than was written at process block 3310. In some examples, reading of the memory cell and providing this second electrical pulse does not change the phase states of the junctions in the memory cell. Thus, the memory cell can be read from repeatedly.

In other examples, if the memory cell is already in a set of perspective phase states to which the electrical pulse was selected to cause the change in phase state, no change is made to the set of phase states. In some examples, the memory cell includes three Josephson junctions. In other examples, the memory cell includes two, four, five, or a different number of Josephson junctions.

XI. Example Method of Configuring and Using a Memory Cell

Figure 34:
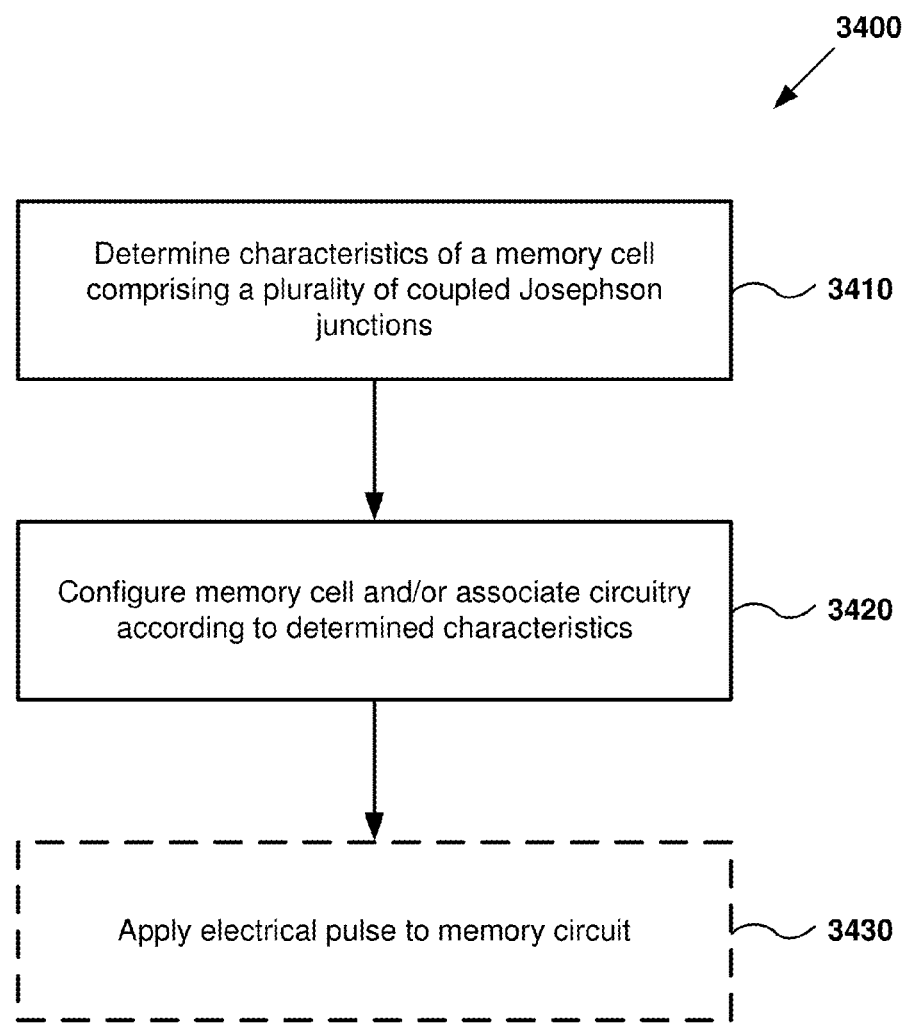
FIG. 34 is a flow chart outlining an example method of configuring and using a memory circuit comprising coupled Josephson junctions, as can be used in certain examples of the disclosed technology.

FIG. 34 is a flowchart 3400 outlining an example method of configuring and using a memory cell including a plurality of electrically coupled Josephson junctions, as can be performed in certain examples of the disclosed technology. For example, the method outlined in FIG. 34 can be used to configure memory cells such as those described above regarding FIGS. 1-3 and FIG. 31.

At process block 3410, characteristics of the memory cell and/or circuitry that interfaces with the memory cell are determined. Any number of suitable characteristics of the circuit, circuit components, or other attributes of the memory cell, and/or configuration of circuits that write to or read from the memory cell can be selected. For example, topology of the circuit, attributes of the Josephson junctions, including area, width, length, thickness, materials, relative arrangement, or other suitable circuit or layout properties can be selected. Further, attributes of electrical pulses used to read or write from the memory cell can be selected, including: voltage, duration, slope, or shape of the electrical pulses. In some examples, configuration of decoders or multiplexers used to connect, read, or write circuitry to an array of memory cells can be selected. Other characteristics include selection and timing of applying bias voltages to a terminal of one or more Josephson junctions in the memory circuit. In some examples, a DC current and/or voltage signal to be applied to a terminal of one or more of the Josephson junctions, including a power supply, a ground supply, or a bias voltage or bias current. In some examples, attributes of passive components coupled to the Josephson junctions can be selected including resistors, capacitors, inductors, or other passive circuit components. In some examples, the selected characteristics can be used to manufacture an integrated circuit comprising a memory cell having coupled Josephson junctions according to the disclosed technology. In some examples, an integrated circuit can include programmable attributes. For example, attributes and characteristics such as bias voltage, pulse attributes, logical connections, or other characteristics can be programmed by an end user receiving a manufactured integrated circuit.

At process block 3420, one or more of the characteristics determined at process block 3410 are applied to configure a memory cell comprising coupled Josephson junctions. This can include programming logic to adjust dynamically or statically adjustable parameters such as bias voltage, bias current, pulse characteristics such as shape, slope, duration, and amplitude, or adjusting manufacturing parameters including dimensions of the Josephson junctions, components coupled to the junctions including inductors, resistors, or capacitors, parameters of the Josephson junctions including layer dimensions, thicknesses, materials, or introduction of impurities to modulate device performance characteristics. In some examples, the configuring includes programming logic or registers on an integrated circuit comprising the Josephson junctions. In some examples, the configuring includes manufacturing such an integrated circuit.

At process block 3430, an electrical pulse is supplied to a memory circuit comprising Josephson junctions according to the disclosed technology. For example, the electrical pulse can be a read pulse or a write pulse. For examples where a write pulse is applied, the phase state of at least one but not all of the Josephson junctions is changed. The new set of phase states corresponds to a different logic value. Subsequent applications of a similar electrical write pulse will not cause a change in the phase state. For example where a read pulse is applied, an output pulse is generated by one of the Josephson junctions in the memory cell. In some examples, the Josephson junction is a different Josephson junction than the one to which the read pulse was applied. The pulse can be received by a read circuit coupled to the memory cell.

XII. Simulated Annealing—Experimental Results

Using a stochastic method similar to that outlined above regarding FIG. 31, access times, pulse energies, and total access energies are calculated for Write "0" and Write "1" operations as a function of pulse width and pulse amplitude. One example of a set of heat maps cost function for typical circuit memory operations using an inductively coupled array consisting of three junctions 115, 116, and 117 is shown in the simulated experimental results plotted in FIG. 35-37.

Figure 35:
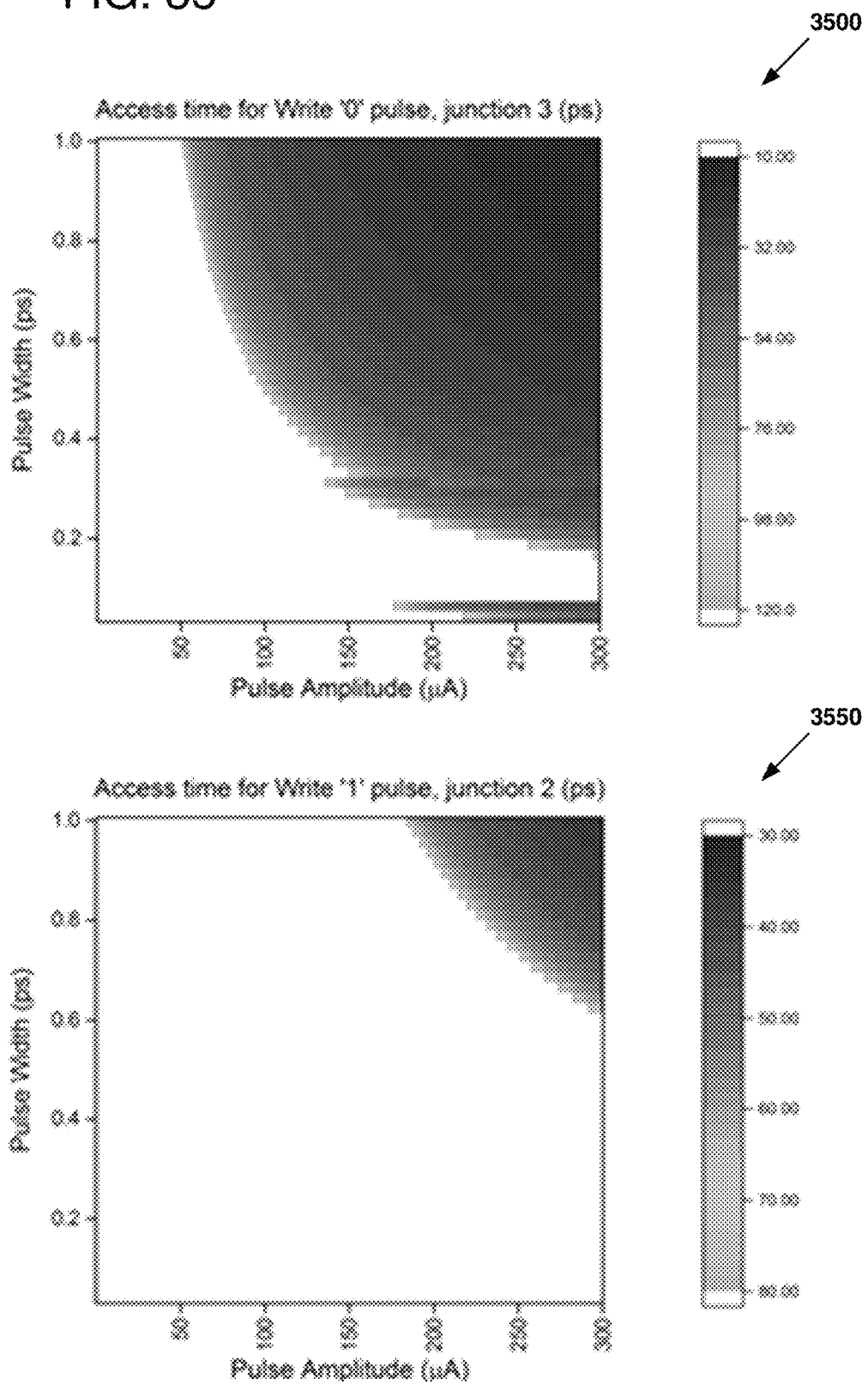
Figure 37:
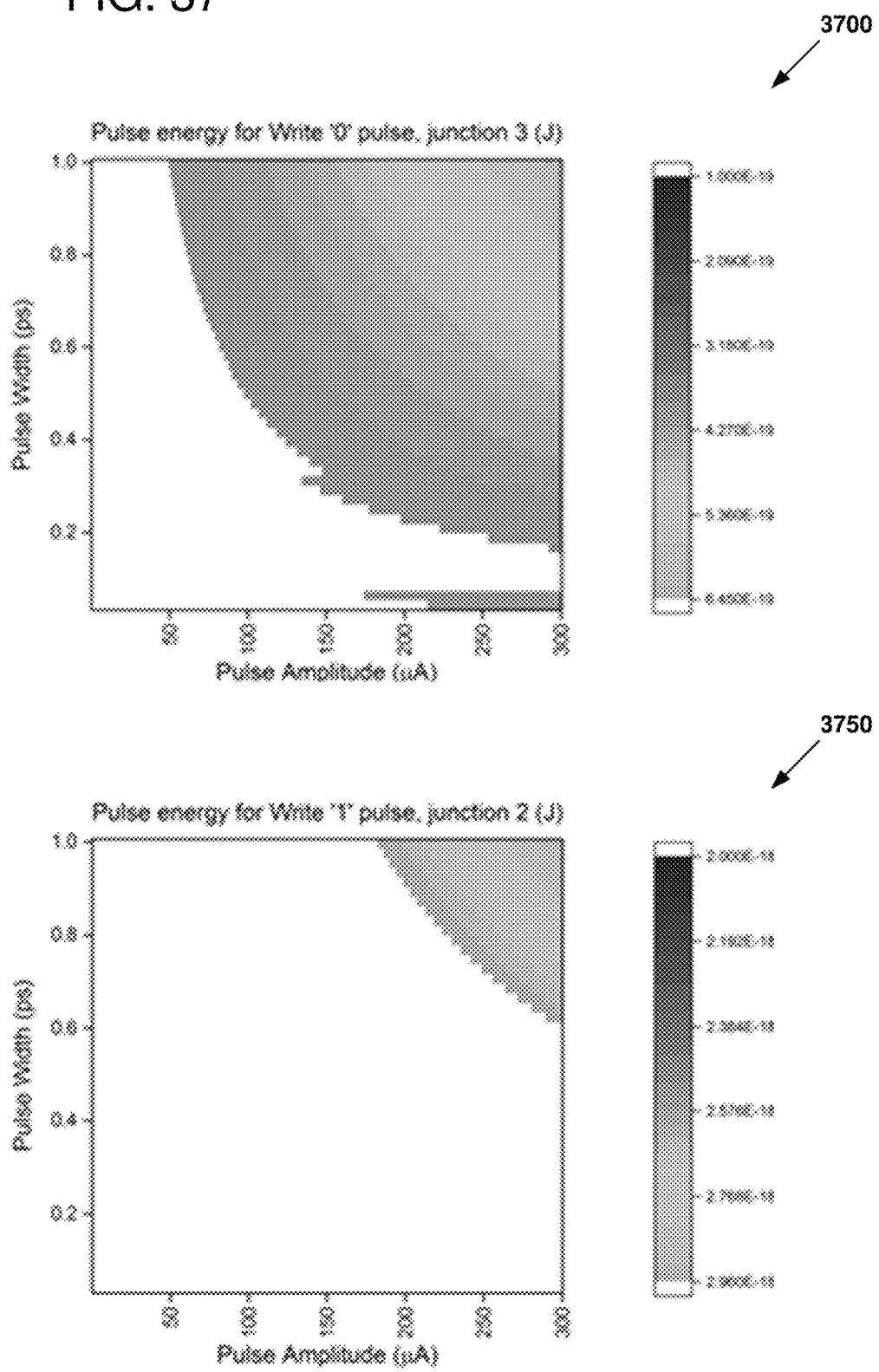

FIG. 35 includes two charts 3500 and 3550 plotting simulated access times as a function of pulse amplitude and pulse width for a write "0" and a write "1" pulse, respectively. FIG. 36 includes two charts 3600 and 3650 plotting total energy consumed by the memory cell as a function of pulse amplitude and pulse width for a write "0" and a write "1" pulse, respectively. FIG. 36 includes two charts 3600 and 3650 plotting total energy consumed by the memory cell as a function of pulse amplitude and pulse width for a write "0" and a write "1" pulse, respectively. FIG. 37 includes two charts 3700 and 3750 plotting energy consumed by writing a pulse to a memory cell as a function of pulse amplitude and pulse width for a write "0" and a write "1" pulse, respectively.

For the experimental example, typical access times for Write "0" pulses are in the range of 10-120 ps while typical access times for Write "1" pulses are in the range of 30-80 ps. Total energies for Write "0" pulses are in the range of $6\times10^{-19}$ to $1\times10^{-18}$ 19 J while for Write "1" pulses, total energies fall in the range $1\times10^{-18}$ to $2\times10^{-18}$ J. Finally, pulse energies for junction three following a Write "0" pulse are near $1\times10^{-19}$ to $6\times10^{-19}$ J and for junction two following a Write "1" pulse are near $2\times10^{-18}$ to $3\times10^{-18}$ J.

In this example, the experimentally-derived optimal value for Write "0" access times is approximately 13 ps, which occurs for pulse amplitude of approximately 300 µA and width of approximately 1.0 ps. The optimal access times for Write "1" operations on junction two are near 38 ps and this occurs with pulse amplitude of near 257 µA and width of approximately 1.0 ps. Minimum total energy for Write "0" operations is approximately $7.2\times10^{-19}$ J. This occurs with pulse amplitudes around 139 µA and width around 0.17 ps. Total energy for a Write "1" operation has a minimum value near $1.8\times10^{-18}$ J, which occurs with pulse amplitudes of 175 µA and widths of 1.0 ps. The minimum pulse energy for Write "0" operations is near $4\times10^{-19}$ J. This occurs with pulse amplitudes of 135 µA and widths of 0.18 ps. For Write "1" operations on junction two, the minimum pulse energy is $1.3\times10^{-18}$ J, which takes place for pulse amplitudes of 175 µA and widths of 1.0 ps.

XIII. Example Computing Environment

Figure 38:
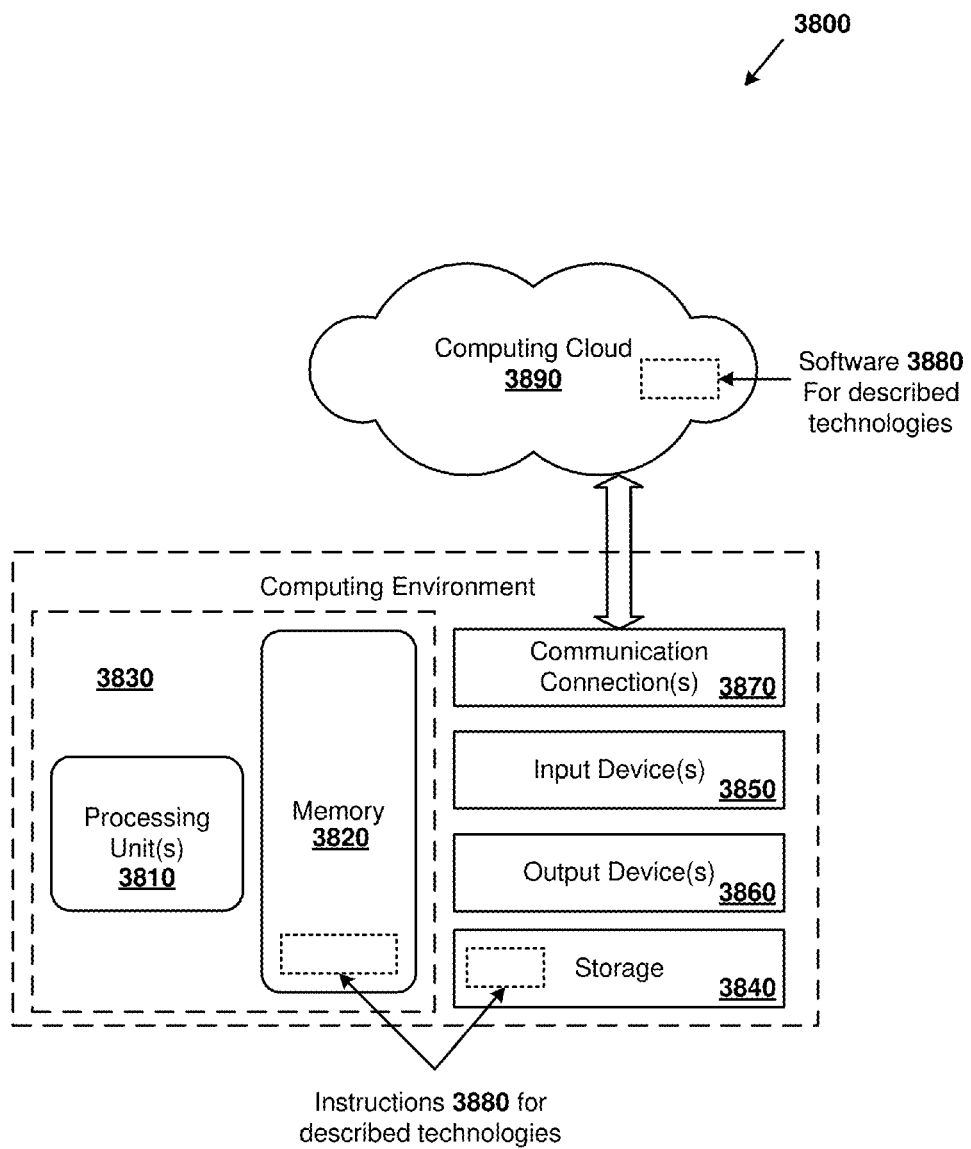
FIG. 38 is a block diagram illustrating a suitable computing environment for implementing some embodiments of the disclosed technology.

FIG. 38 illustrates a generalized example of a suitable computing environment 3800 in which described embodiments, techniques, and technologies, including performing stochastic optimizations for configuring and/or manufacturing a memory cell comprising coupled Josephson junctions according to the disclosed technology can be implemented.

The computing environment 3800 is not intended to suggest any limitation as to scope of use or functionality of the technology, as the technology may be implemented in diverse general-purpose or special-purpose computing environments. For example, the disclosed technology may be implemented with other computer system configurations, including hand held devices, multi-processor systems, programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules can be located in both local and remote memory storage devices.

With reference to FIG. 38, the computing environment 3800 includes at least one processing unit 3810 and memory 3820. In FIG. 38, this most basic configuration 3830 is included within a dashed line. The processing unit 3810 executes computer-executable instructions and may be a real or a virtual processor. In a multi-processing system, multiple processing units execute computer-executable instructions to increase processing power and as such, multiple processors can be running simultaneously. The processing unit 3810 can be a general-purpose or special-purpose processor that can execute in a typical room-temperature environment, a cryogenic processor operating in a cryogenic environment, or a combination of multiple physical environments. The memory 3820 may be volatile memory (e.g., registers, cache, RAM), non-volatile memory (e.g., ROM, EEPROM, flash memory, etc.), or some combination of the two. The memory 3820 stores software 3880, images, and video that can, for example, implement the technologies described herein. A computing environment may have additional features. For example, the computing environment 3800 includes storage 3840, one or more input devices 3850, one or more output devices 3860, and one or more communication connections 3870. An interconnection mechanism (not shown) such as a bus, a controller, or a network, interconnects the components of the computing environment 3800. Typically, operating system software (not shown) provides an operating environment for other software executing in the computing environment 3800, and coordinates activities of the components of the computing environment 3800.

The storage 3840 may be removable or non-removable, and includes magnetic disks, magnetic tapes or cassettes, CD-ROMs, CD-RWs, DVDs, or any other medium which can be used to store information and that can be accessed within the computing environment 3800. The storage 3840 stores instructions for the software 3880, plugin data, and messages, which can be used to implement technologies described herein.

The input device(s) 3850 may be a touch input device, such as a keyboard, keypad, mouse, touch screen display, pen, or trackball, a voice input device, a scanning device, or another device, that provides input to the computing environment 3800. For audio, the input device(s) 3850 may be a sound card or similar device that accepts audio input in analog or digital form, or a CD-ROM reader that provides audio samples to the computing environment 3800. The output device(s) 3860 may be a display, printer, speaker, CD-writer, or another device that provides output from the computing environment 3800.

The communication connection(s) 3870 enable communication over a communication medium (e.g., a connecting network) to another computing entity. The communication medium conveys information such as computer-executable instructions, compressed graphics information, video, or other data in a modulated data signal. The communication connection(s) 3870 are not limited to wired connections (e.g., megabit or gigabit Ethernet, Infiniband, Fibre Channel over electrical or fiber optic connections) but also include wireless technologies (e.g., RF connections via Bluetooth, WiFi (IEEE 802.11a/b/n), WiMax, cellular, satellite, laser, infrared) and other suitable communication connections for providing a network connection for the disclosed agents, bridges, and agent data consumers. In a virtual host environment, the communication(s) connections can be a virtualized network connection provided by the virtual host.

Some embodiments of the disclosed methods can be performed using computer-executable instructions implementing all or a portion of the disclosed technology in a computing cloud 3890. For example, disclosed compilers and/or processor servers are located in the computing environment 3830, or the disclosed compilers can be executed on servers located in the computing cloud 3890. In some examples, the disclosed compilers execute on traditional central processing units (e.g., RISC or CISC processors) or on cryogenic processors (e.g., processors implemented with Josephson junction logic).

Computer-readable media are any available media that can be accessed within a computing environment 3800. By way of example, and not limitation, with the computing environment 3800, computer-readable media include memory 3820 and/or storage 3840. As should be readily understood, the term computer-readable storage media includes the media for data storage such as memory 3820 and storage 3840, and not transmission media such as modulated data signals.

One or more computer-readable storage media may store computer-readable instructions that when executed cause a computer to perform the method for compiling instructions targeted for execution by a processor. A general-purpose, special-purpose, or cryogenic processor may be configured to execute computer-readable instructions generated by the method.

XIV. Additional Examples of the Disclosed Technology.

Additional examples, as can be practiced in certain embodiments of the disclosed technology are recited.

In some examples of the disclosed technology, a method of operating a memory cell including a plurality of electrically or magnetically coupled Josephson junctions includes writing to the memory cell by providing a first electrical pulse to a first Josephson junction causing at least one but not all of the plurality of Josephson junctions to change their respective phase state. In some examples, the method further includes reading the memory cell by providing a second electrical pulse to one of the plurality of Josephson junctions and in response, receiving an output electrical pulse from a second, different Josephson junction of the memory cell. In some examples, the memory cells include a third Josephson junction electrically coupled to at least one other of the first Josephson junction or the second Josephson junction. In some examples, the method further includes providing the memory cell configured such that applying an electrical pulse to the memory cell causes the first Josephson junction to change to a different phase state than the second Josephson junction.

In some examples of the method, a characteristic of the first electrical pulse is selected so that only one of the first Josephson junction or the second Josephson junction will change its respective phase state. In some examples, the characteristic includes one or more of the following attributes of the first electrical pulse: voltage, duration, slope, or shape.

In some examples, the writing to the memory cell causes the plurality of Josephson junctions to be in a first set of respective phases states, and the method further includes writing to the memory cell by providing a third electrical pulse to a third, different Josephson junction of the memory cell than the first Josephson junction, causing the plurality of Josephson junctions to change to a second, different set of respective phases states. In some examples, the second electrical pulse and the third electrical pulse are applied to the same Josephson junction. In some examples, the second electrical pulse and the third electrical pulse are applied to the second Josephson junction.

In some examples, a first terminal of the first Josephson junction is electrically coupled to a first terminal of the second Josephson junction with an inductor. In some examples, some of the junctions in the memory cell are coupled to two other junctions and some of the junctions are coupled to one other junction in the memory cell. In some examples, a first terminal of the first Josephson junction is electrically coupled to a first terminal of the second Josephson junction with an inductor, the first terminal of the second Josephson junction is coupled to a first terminal of the third Josephson junction with an inductor, and a second terminal of at least one of the plurality of Josephson junctions is substantially floating.

In some examples of the disclosed technology, at least one parameter of the provided first electrical pulse is selected to cause the first Josephson junction to transition to a different phase state than the second Josephson junction. In some examples, the method further includes, after the writing the memory cell, providing a third electrical pulse similar to the first electrical pulse to the first Josephson junction of the electrically coupled Josephson junctions, wherein the third electrical pulse does not cause any of the Josephson junctions to change their respective phase states.

In some examples of the disclosed technology, each of the plurality of Josephson junctions is situated in a cryogenic environment. In some examples, the reading the memory cell comprises reading a current induced in an inductor in proximity to the second Josephson junction.

In some examples of the disclosed technology, a method of operating a memory cell including plural coupled phase-varying components includes writing to the memory cell by incremental varying a parameter of a first phase-varying component of the memory cell and reading the memory cell by incremental varying a parameter of a second phase-varying component of the memory cell. In some examples, each of the components is a Josephson junction, a phase-locked loop, or an oscillator. In some examples, the phase is the incremental varying parameter. In some examples, the incrementally-varying parameter is varied by applying an electrical or magnetic pulse to at least one of the components.

In some examples of the disclosed technology, an apparatus including a plurality of Josephson junctions includes a memory cell comprising a first Josephson junction of the plurality in electrical or magnetic communication with a second, different Josephson junction of the plurality, a write circuit in electrical or magnetic communication with the first Josephson junction of the memory cell, the write circuit comprising a pulse trigger circuit configured to transmit a pulse to the first Josephson junction of the memory cell to cause the plurality of Josephson junctions to be in a first set of phase states, and a read circuit in electrical or magnetic communication with the second Josephson junction of the memory cell, the read circuit being configured to receive an output pulse from the second Josephson junction responsive to a read pulse being applied to the memory cell, the output pulse indicating a set of phase states occupied by the Josephson junctions. In some examples, the memory cell further includes a third Josephson junction in electrical or magnetic communication with the first Josephson junction and the second Josephson junction. In some examples, when the plurality of Josephson junctions are in a first phase state, the pulse transmitted by the pulse trigger circuit causes at least one but not all of the first, second, and third Josephson junction to change their respective phase state. In some examples, the read circuit and/or the write circuit include components that are electrically, magnetically, or electrically and magnetically coupled to the memory cell. In some examples, the read circuit and/or the write circuit include components that are electrically, magnetically, or electrically and magnetically connected to the memory cell. In some examples, the read circuit, write circuit, or both circuits include an inductor situated in proximity to one or more of the Josephson junctions in the memory cell that is used to read and/or write to or from the junctions.

In some examples, a cryogenic processor is coupled to the memory cell. In some examples, a cryogenic chamber contains the memory cell. In some examples, the memory cell is immersed in a cryogenic liquid within a cryogenic chamber.

In some examples of the disclosed technology, a method of configuring a memory circuit having plural Josephson junctions includes forming an objective function representing electrical parameters of the memory cell, performing stochastic optimization to improve the objective function, and selecting at least one electrical parameter of the memory circuit based on the improved objective function. In some examples, the method further includes initializing a set of variables representing electrical parameters of the memory cell and performing a simulation of the memory cell based on the initialized set of variables, wherein the objective function is formed based on the simulation. In some examples, the method includes configuring or manufacturing the memory cell according to the selected at least one electrical parameter. In some examples, the method includes selecting a parameter of a write pulse applied to or a read pulse generated by the memory circuit.

In some examples, one or more computer-readable storage media storing instructions that when executed by a computer, cause the computer to perform disclosed methods for configuring a memory circuit.

In some examples, any of the disclosed methods can be performed in combination and sub-combination with certain disclosed apparatus. In some examples, certain disclosed apparatus can be used in performing any of the disclosed combinations and sub-combinations of methods. In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim as our invention all that comes within the scope of these claims and their equivalents.

We claim:

1. A method of operating a memory cell comprising a plurality of electrically or magnetically coupled Josephson junctions including a first Josephson junction, a second, different Josephson junction, and a third, different Josephson junction, the method comprising:
   writing to the memory cell by providing a first electrical pulse to the first Josephson junction of the plurality of Josephson junctions, wherein the first Josephson junction does not comprise a ferromagnetic layer, the first electrical pulse causing at least one but not all of the plurality of Josephson junctions to change their respective phase state; and
   reading the memory cell by providing a second electrical pulse to one of the plurality of Josephson junctions and in response, receiving an output electrical pulse from the second Josephson junction of the memory cell, wherein:
      a first terminal of the first Josephson junction is electrically coupled to a first terminal of the second Josephson junction with an inductor, and
      the first terminal of the second Josephson junction is electrically coupled to a first terminal of the third Josephson junction with an inductor.

2. The method of claim 1, further comprising:
providing the memory cell, wherein the memory cell is configured such that applying an electrical pulse to the memory cell causes the first Josephson junction to change to a different phase state than the second Josephson junction.

3. The method of claim 1, wherein a characteristic of the first electrical pulse is selected so that only one of the first Josephson junction or the second Josephson junction will change its respective phase state.

4. The method of claim 3, wherein the characteristic includes one or more of the following attributes of the first electrical pulse: voltage, duration, slope, or shape.

5. The method of claim 1, wherein the writing to the memory cell causes the plurality of Josephson junctions to be in a first set of respective phases states, the method further comprising:
   writing to the memory cell by providing a third electrical pulse to a third, different Josephson junction of the memory cell than the first Josephson junction, the writing causing the plurality of Josephson junctions to change to a second, different set of respective phases states.

6. The method of claim 5, wherein the second electrical pulse and the third electrical pulse are applied to the same Josephson junction.

7. The method of claim 5, wherein the second electrical pulse and the third electrical pulse are applied to the second Josephson junction.

8. The method of claim 1, wherein:
   a second terminal of at least one of the plurality of Josephson junctions is substantially floating.

9. The method of claim 1, wherein at least one parameter of the provided first electrical pulse is selected to cause the first Josephson junction to transition to a different phase state than the second Josephson junction.

10. The method of claim 1, further comprising, after the writing the memory cell, providing a third electrical pulse similar to the first electrical pulse to the first Josephson junction of the electrically coupled Josephson junctions, wherein the third electrical pulse does not cause any of the Josephson junctions to change their respective phase states.

11. The method of claim 1, wherein: each of the plurality of Josephson junctions is situated in a cryogenic environment.

12. A method of operating a memory cell comprising a plurality of electrically coupled Josephson junctions, the method comprising:
   a step for writing to a memory cell comprising the plurality of coupled Josephson junctions by providing a first electrical pulse to a first Josephson junction of the plurality of Josephson junctions, the first Josephson junction not comprising a ferromagnetic barrier layer, the first electrical pulse causing at least one but not all of the plurality of Josephson junctions to change their respective phase state; and
   a step for reading the memory cell by providing a second electrical pulse to one of the plurality of Josephson junctions and in response, receiving an output electrical pulse from a second, different Josephson junction of the memory cell, the second Josephson junction not comprising a ferromagnetic barrier layer.

13. The method of claim 12, wherein the step for writing to the memory cell is a first step, the method further comprising:

a second step for writing to the memory cell comprising providing a second electrical pulse to a third Josephson junction of the plurality of Josephson junction, wherein the third Josephson junction is different than the first Josephson junction, and wherein the second step causes the plurality of Josephson junctions to change to a different set of phase states than the set of states caused by the first step for writing to the memory cell.

14. A method of operating a memory cell comprising plural coupled phase-varying components, the method comprising:

writing to the memory cell by incremental varying a parameter of a first phase-varying Josephson junction of the memory cell by applying a first electrical pulse to at least one of the phase-varying components; and reading the memory cell by incremental varying a parameter of a second phase-varying Josephson junction of the memory cell by applying a second electrical pulse to at least one of the components, the components comprising:

a first, a second, and a third, different phase-varying component.

15. The method of claim 14, wherein each of the components is a Josephson junction, a phase-locked loop, or an oscillator.

16. The method of claim 14, wherein phase is the incremental varying parameter.

17. The method of claim 14, wherein:

a first terminal of the first component is electrically coupled to a first terminal of the second component with an inductor; and the first terminal of the second component is electrically coupled to a first terminal of the third component with an inductor.

18. An apparatus, comprising a plurality of Josephson junctions, the apparatus comprising:

a memory cell comprising a first Josephson junction of the plurality in electrical or magnetic communication with a second, different Josephson junction of the plurality and a third, different Josephson junction of the plurality, a first terminal of the first Josephson junction being electrically coupled to a first terminal of the second Josephson junction with an inductor, and the first terminal of the second Josephson junction being electrically coupled to a first terminal of the third Josephson junction with an inductor;

a write circuit in electrical or magnetic communication with the first Josephson junction of the memory cell, the write circuit comprising a pulse trigger circuit configured to transmit a pulse to the first Josephson junction of the memory cell to cause the plurality of Josephson junctions to be in a first set of phase states, wherein when the plurality of Josephson junctions are in a first phase state, the pulse transmitted by the pulse trigger circuit causes at least one but not all of the first, second, and third Josephson junction to change their respective phase state; and a read circuit in electrical or magnetic communication with the second Josephson junction of the memory cell, the read circuit being configured to receive an output pulse from the second Josephson junction responsive to a read pulse being applied to the memory cell, the output pulse indicating a set of phase states occupied by the Josephson junctions.

19. An apparatus comprising:

a cryogenic processor coupled to the memory cell of claim 18.

20. An apparatus, comprising:

a cryogenic chamber containing the memory cell of claim 18.

* * * * *